(12) United States Patent
Matsuzaki et al.

(10) Patent No.: US 8,634,228 B2
(45) Date of Patent: Jan. 21, 2014

(54) DRIVING METHOD OF SEMICONDUCTOR DEVICE

(75) Inventors: Takanori Matsuzaki, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 63 days.

(21) Appl. No.: 13/220,066

(22) Filed: Aug. 29, 2011

(65) Prior Publication Data

US 2012/0063203 A1  Mar. 15, 2012

(30) Foreign Application Priority Data

Sep. 2, 2010 (JP) .................. 2010-196611
May 12, 2011 (JP) .................. 2011-107621

(51) Int. Cl.
*G11C 11/24* (2006.01)
*G11C 11/404* (2006.01)

(52) U.S. Cl.
CPC ..................... *G11C 11/404* (2013.01)
USPC ............ 365/149; 365/189.04; 365/185.1; 365/185.01; 365/104

(58) Field of Classification Search
CPC .............. G11C 7/18; H01L 27/0207
USPC ............ 365/149, 189.04, 185.1, 185.01, 104
See application file for complete search history.

(56) References Cited

U.S. PATENT DOCUMENTS

| | | |
|---|---|---|
| 4,466,081 A | 8/1984 | Masuoka |
| 5,349,366 A | 9/1994 | Yamazaki et al. |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| EP | 1737044 A1 | 12/2006 |
|---|---|---|
| EP | 2061087 A2 | 5/2009 |

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

(Continued)

*Primary Examiner* — Thong Q Le
(74) *Attorney, Agent, or Firm* — Fish & Richardson P.C.

(57) ABSTRACT

A driving method of a semiconductor device is provided. In a semiconductor device including a bit line, a selection line, a selection transistor, m (m is a natural number greater than or equal to 2) writing word lines, m reading word lines, a source line, and first to m-th memory cells, each memory cell includes a first transistor and a second transistor that holds charge accumulated in a capacitor. The second transistor includes a channel formed in an oxide semiconductor layer. In a driving method of a semiconductor device having the above structure, when writing to a memory cell is performed, the first transistor is turned on so that a first source terminal or a first drain terminal is set to a fixed potential; thus, a potential is stably written to the capacitor.

16 Claims, 31 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,375,399 B2 | 5/2008 | Ishii et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,888,207 B2 | 2/2011 | Wager, III et al. |
| 7,935,582 B2 | 5/2011 | Iwasaki |
| 7,956,361 B2 | 6/2011 | Iwasaki |
| 8,154,024 B2 | 4/2012 | Iwasaki |
| 8,319,214 B2 | 11/2012 | Imai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0285325 A1* | 11/2008 | Kameshiro et al. ............. 365/51 |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0101352 A1 | 5/2011 | Hosono et al. |
| 2011/0147737 A1 | 6/2011 | Yamazaki et al. |
| 2011/0156028 A1 | 6/2011 | Yamazaki et al. |
| 2011/0157961 A1 | 6/2011 | Yamazaki et al. |
| 2011/0201162 A1 | 8/2011 | Hosono et al. |
| 2012/0012838 A1 | 1/2012 | Hosono et al. |
| 2012/0161220 A1 | 6/2012 | Yamazaki |
| 2012/0223306 A1 | 9/2012 | Saito et al. |

FOREIGN PATENT DOCUMENTS

| | | |
|---|---|---|
| EP | 2226847 A2 | 9/2010 |
| EP | 2246894 A1 | 11/2010 |
| EP | 2339639 A2 | 6/2011 |
| EP | 2413366 A1 | 2/2012 |
| JP | 57-105889 A | 7/1982 |
| JP | 60-198861 A | 10/1985 |
| JP | 62-274773 A | 11/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-045716 A | 2/1995 |
| JP | 08-264794 A | 10/1996 |
| JP | 10-200059 A | 7/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 A | 12/2002 |
| JP | 2003-017591 A | 1/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-012878 A | 1/2006 |
| JP | 2006-502597 A | 1/2006 |
| JP | 2007-103918 A | 4/2007 |
| JP | 2009-141342 A | 6/2009 |
| JP | 2012-151463 A | 8/2012 |
| JP | 2012-199528 A | 10/2012 |
| WO | 2004/038757 A2 | 5/2004 |

(56) References Cited

FOREIGN PATENT DOCUMENTS

| WO | 2004/114391 A1 | 12/2004 |
|---|---|---|
| WO | 2005/088726 A1 | 9/2005 |
| WO | 2007/029844 A1 | 3/2007 |

OTHER PUBLICATIONS

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

Ohara, H et al., "Amorphous In-Ga-Zn-Oxide TFTs with Suppressed Variation for 4.0 inch QVGA Amoled Display," AM-FPD '09 Digest of Technical Papers, Jul. 1, 2009, pp. 227-230, The Japan Society of Applied Physics.

Orita, M et al., "Amorphous transparent conductive oxide in InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZn04," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Park, J et al., "Amorphous Indium-Gallium-Zinc Oxide TFTS and Their Application for Large Size Amoled," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous In-Ga-Zn-Oxide TFTS," IDW '09: Proceedings of the 16th International Display Workshops, 2009, pp. 689-692.

Son, K et al., "42.4L: Late-News Paper: 4 Inch QVGA Amoled Driven by the Threshold Voltage Controlled Amorphous Gizo (Ga2O3-In2O3-ZnO) TFT," SID Digest '08: SID International Symposium Digest of Technical Papers, May 20, 2008, vol. 39, pp. 633-636.

Takahashi, M et al., "Theoretical Analysis of IgZo Transparent Amorphous Oxide Semiconductor," IDW '08: Proceedings of the 15th International Display Workshops, Dec. 3, 2008, pp. 1637-1640.

Tsuda, K et al., "Ultra Low Power Consumption Technologies for Mobile TFT-LCDs," IDW '02: Proceedings of the 9th International Display Workshops, Dec. 4, 2002, pp. 295-298.

Veno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09: SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09: SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al. "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08: SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

(56) References Cited

OTHER PUBLICATIONS

Ikeda, T et al., "Full-Functional System Liquid Crystal Display Using CG-Silicon Technology," SID Digest '04: SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09: SID International Symposium Digest of Technical Papers, May 31, 2009, pp. 983-985.

Kanno, H et al., "White Stacked Electrophosphoreccnt Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-Bo Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa,Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06: Proceedings of the 13th International Display Workshops, Dec. 7, 2006, pp. 663-666.

Lee, J et al., "World'S Largest (15-Inch) XGA AMLCD Panel Using IgZo Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA Amoled Display Using In-Ga-Zn-Oxide TFTS With a Novel Passivation Layer," SID Digest '09: SID International Symposium Digest of Technical Papers, May 31, 2009, pp. 284-287.

* cited by examiner c-axis direction electric charge 0 electric charge +1 electric charge 0 a-b plane electric charge −1 electric charge 0

- In
- Sn
- Zn
- O

● In
○ Ga
○ Zn
● O

DRIVING METHOD OF SEMICONDUCTOR DEVICE

BACKGROUND OF THE INVENTION

1. Field of the Invention

The invention disclosed herein relates to a semiconductor device using a semiconductor element and a method for driving the semiconductor device.

2. Description of the Related Art

Storage devices using semiconductor elements are broadly classified into two categories: a volatile device that loses stored data when power supply stops, and a non-volatile device that holds stored data even when power is not supplied.

A typical example of a volatile storage device is a DRAM (dynamic random access memory). A DRAM stores data in such a manner that a transistor included in a storage element is selected and charge is accumulated in a capacitor.

When data is read from a DRAM, charge in a capacitor is lost on the above-described principle; thus, another writing operation is necessary whenever data is read out. Moreover, since leakage current (off-state current) flows between a source and a drain of a transistor included in a storage element when the transistor is in an off state, charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM holds stored data by using a circuit such as a flip-flop and thus does not need refresh operation, which is an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary in order to inject charge into the floating gate or removing the charge, and a circuit therefor is required. Further, it takes a relatively long time to inject or remove charge, and it is not easy to increase the speed of writing and erasing of data.

REFERENCE

Patent Document

[Patent Document 1] Japanese Published Patent Application No. S57-105889

SUMMARY OF THE INVENTION

A storage device is required to perform writing and reading of data accurately. The reliability of a storage device is decreased by generation of writing defects and reading defects.

In view of the above problem, it is an object of one embodiment of the disclosed invention to provide a driving method of a semiconductor device which can realize improvement in reliability of a storage device.

Further, in view of the above problem, it is another object of one embodiment of the disclosed invention to provide a semiconductor device with a novel structure in which written data can be stored for a long time and there is no limitation on the number of writing operations, by using a transistor whose leakage current (off-state current) is small for some of transistors included in a storage element.

One embodiment of the present invention is a driving method of a semiconductor device. The semiconductor device includes a selection transistor; a memory cell including a first transistor whose drain terminal is electrically connected to a source terminal of the selection transistor, a capacitor of which one electrode is electrically connected to a gate terminal of the first transistor, and a second transistor whose source terminal is electrically connected to the one electrode of the capacitor and which includes an oxide semiconductor layer; a bit line electrically connected to a drain terminal of the selection transistor and a drain terminal of the second transistor; a selection line electrically connected to a gate terminal of the selection transistor; a writing word line electrically connected to a gate terminal of the second transistor; a reading word line electrically connected to the other electrode of the capacitor; and a source line electrically connected to a source terminal of the first transistor. A channel of the second transistor is formed in an oxide semiconductor layer. In writing to memory cells, in which the second transistor is turned on to accumulate and hold charge corresponding to a potential of the bit line in the gate terminal of the first transistor and the one electrode of the capacitor, the first transistor is turned on and the selection transistor is turned off.

Another embodiment of the present invention is a driving method of a semiconductor device. The semiconductor device includes a selection transistor; a memory cell including a first transistor whose drain terminal is electrically connected to a source terminal of the selection transistor, a capacitor of which one electrode is electrically connected to a gate terminal of the first transistor, and a second transistor whose source terminal is electrically connected to the one electrode of the capacitor and which includes an oxide semiconductor layer; a bit line electrically connected to a drain terminal of the selection transistor and a drain terminal of the second transistor; a selection line electrically connected to a gate terminal of the selection transistor; a writing word line electrically connected to a gate terminal of the second transistor; a reading word line electrically connected to the other electrode of the capacitor; and a source line electrically connected to a source terminal of the first transistor. A channel of the second transistor is formed in an oxide semiconductor layer. In writing to memory cells, in which the second transistor is turned on to accumulate and hold charge corresponding to a potential of the bit line in the gate terminal of the first transistor and the one electrode of the capacitor, the potential of the source terminal or the drain terminal of the first transistor is set to a fixed potential and the selection transistor is turned off.

Another embodiment of the present invention is a driving method of a semiconductor device. The semiconductor device includes a selection transistor; a memory cell including a first transistor whose drain terminal is electrically connected to a source terminal of the selection transistor, a capacitor of which one electrode is electrically connected to a gate terminal of the first transistor, and a second transistor whose source terminal is electrically connected to the one electrode of the capacitor and which includes an oxide semiconductor layer; a bit line electrically connected to a drain terminal of the selection transistor and a drain terminal of the second transistor; a selection line electrically connected to a gate terminal of the selection transistor; a writing word line electrically connected to a gate terminal of the second transistor; a reading word line electrically connected to the other electrode of the capacitor; and a source line electrically connected to a source terminal of the first transistor. A channel of the second transistor is formed in an oxide semiconductor layer. In writing to memory cells, in which the second transistor is turned on to accumulate and hold charge corresponding to a potential of the bit line in the gate terminal of the first transistor and the one electrode of the capacitor, the potential of the source line is set to be lower than the difference between a threshold value of the first transistor and the potential of the gate terminal of the first transistor.

One embodiment of the present invention is any one of the above driving methods of a semiconductor device. The memory cell includes first to m-th memory cells. A source terminal of the selection transistor is electrically connected to the first drain terminal of the first memory cell. The first drain terminal of the k-th memory cell (k is a natural number greater than or equal to 2 and less than or equal to (m−1)) is electrically connected to the first source terminal of the (k−1)-th memory cell. The first source terminal of the k-th memory cell is electrically connected to the first drain terminal of the (k+1)-th memory cell. The first source terminal of the m-th memory cell is electrically connected to the source line.

Note that a source terminal, a drain terminal, and a gate terminal of a first transistor included in a memory cell are respectively referred to as a first source terminal, a first drain terminal, and a first gate terminal. Further, a source terminal, a drain terminal, and a gate terminal of a second transistor included in a memory cell are respectively referred to as a second source terminal, a second drain terminal, and a second gate terminal.

One embodiment of the present invention is any one of the above driving methods of a semiconductor device. In writing operation to memory cells, a potential is supplied to the selection line to turn off the selection transistor, a potential is supplied to the source line to turn on the first transistor, a potential is supplied to the bit line, and a potential is supplied to the writing word line to turn on the second transistor, so that a charge corresponding to the potential of the bit line is accumulated in the first gate terminal and the one electrode of the capacitor, and a potential is supplied to the writing word line to turn off the second transistor and a potential is supplied to the source line to turn off the first transistor, so that the charge corresponding to the potential of the bit line is held in the first gate terminal and the one electrode of the capacitor.

One embodiment of the present invention is any one of the above driving methods of a semiconductor device. In writing operation to memory cells, a potential is supplied to the bit line, a potential is supplied to the writing word line to turn on the second transistor, a potential is supplied to the selection line to turn off the selection transistor, and a potential is supplied to the source line to turn on the first transistor, so that a charge corresponding to the potential of the bit line is accumulated in the first gate terminal and the one electrode of the capacitor, and a potential is supplied to the writing word line to turn off the second transistor and a potential is supplied to the source line to turn off the first transistor, so that the charge corresponding to the potential of the bit line is held in the first gate terminal and the one electrode of the capacitor.

In the above driving method, writing means to accumulate and hold charge corresponding to a potential of the bit line (a potential to be written) in the first gate terminal and one electrode of the capacitor. Charge corresponding to a potential of the bit line can be held by turning off the second transistor. However, in the case where the first transistor is turned off when writing is performed, the amount of accumulated charge is reduced and charge whose amount is less than that of charge corresponding to a potential to be written is held in the storage element, whereby writing defects may be caused. Accordingly, the first transistor is turned on when writing is performed, so that the potential of the first source terminal or the first drain terminal is set to a fixed potential of the source line.

In the above structure, a plurality of memory cells including the memory cell can be connected in series between the bit line and the source line.

Although the transistor may be formed using an oxide semiconductor in the above description, the invention disclosed herein is not limited thereto. A material which can realize the off-state current characteristics equivalent to those of the oxide semiconductor, such as a wide gap material like silicon carbide (specifically, a semiconductor material whose energy gap Eg is larger than 3 eV) may be used.

In this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

The term "terminal" is sometimes used with a similar meaning to the "electrode", and vice versa.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a wiring.

In the above driving method, the potential of the source terminal or the drain terminal of the first transistor is set to a fixed potential of the source line when writing is performed, so that reduction in the amount of accumulated charge can be suppressed. Since accumulated charge can be held in the storage element without its amount being decreased, writing defects can be reduced and the reliability of the semiconductor device can be improved.

In a storage device, when leakage current (off-state current) of a transistor included in a storage element is large, written charge flows into or out of the transistor even when the transistor included in the storage element is off. Thus, holding time of a potential that is written is shortened. Since the off-state current of a transistor including an oxide semiconductor is extremely small, stored data can be held for an extremely long time by using the transistor. In other words, power consumption can be adequately reduced because refresh operation becomes unnecessary or the frequency of refresh operation can be extremely low. Moreover, stored data can be held for a long period even when power is not supplied (note that a potential is preferably fixed).

When the above transistor is used, high voltage is unnecessary for writing of data, so that there is no problem of deterioration of an element. For example, unlike a conventional non-volatile memory, it is not necessary to inject and extract electrons into and from a floating gate, and thus a problem such as deterioration of a gate insulating layer does not occur at all. That is, there is no limitation on the number of times of rewriting, which has been a problem in a conventional non-volatile memory, and thus reliability is drastically improved. Furthermore, data is written depending on the on state and the off state of the transistor, whereby high-speed operation can be easily realized.

Since a transistor including a material other than an oxide semiconductor (e.g., a semiconductor substrate such as a single crystal silicon substrate or a single crystal germanium substrate) can operate at sufficiently high speed, when this is combined with a transistor including an oxide semiconductor, a semiconductor device can perform operation (e.g., data reading) at sufficiently high speed. Further, a transistor including a material other than an oxide semiconductor can favorably realize a variety of circuits (such as a logic circuit or a driver circuit) which are required to operate at high speed.

Thus, a semiconductor device having a novel feature can be achieved by being provided with both the transistor including a semiconductor material which is not an oxide semiconductor (a transistor capable of operation at a sufficiently high speed, in general) and the transistor including an oxide semiconductor (a transistor whose off-state current is sufficiently small, in general).

The driving method of a semiconductor device according to one embodiment of the disclosed invention can be realized by using the above-described semiconductor device in which a transistor including a material other than an oxide semiconductor and a transistor including an oxide semiconductor are combined. When writing is performed on a memory cell of the semiconductor device, a first transistor including a material other than an oxide semiconductor is turned on and the potential of a source terminal or a drain terminal of the first transistor is set to a fixed potential. Thus, a potential can be stably written to a capacitor of the memory cell. In addition, a second transistor including an oxide semiconductor whose off-state current is extremely small is used, whereby charge can be stably held for a long period. As a result, the reliability of the semiconductor device can be improved.

DETAILED DESCRIPTION OF THE INVENTION

Figure 1:
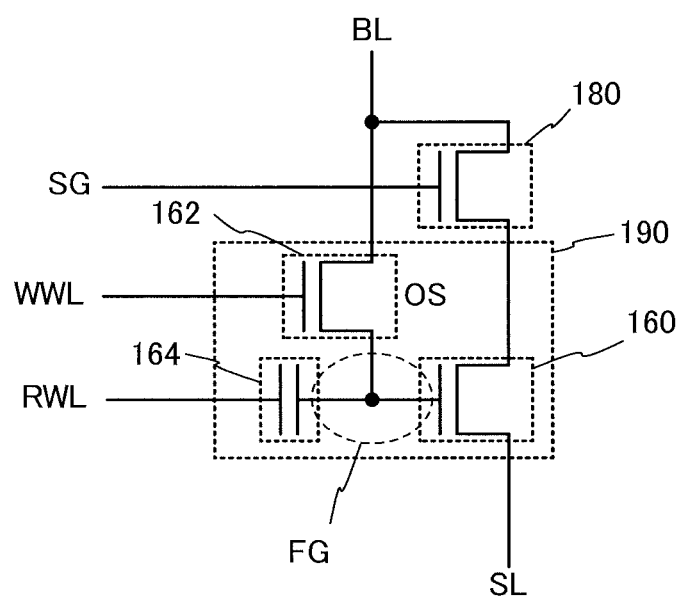
FIG. 1 is a circuit diagram of a semiconductor device.

Hereinafter, embodiments of the disclosed invention are described with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a circuit configuration and operation of a semiconductor device according to one embodiment of the invention disclosed herein will be described with reference to FIG. 1. Note that in a circuit diagram, in some cases, "OS" is written beside a transistor in order to indicate that the transistor includes an oxide semiconductor material.

<Basic Circuit>

First, a basic circuit configuration and circuit operation will be described with reference to FIG. 1. In the circuit diagram in FIG. 1, one of a source electrode and a drain electrode (e.g., the drain electrode) of a selection transistor 180, one of a source electrode and a drain electrode (e.g., the drain electrode) of a transistor 162, and a bit line BL are electrically connected to one another. The other of the source electrode and the drain electrode (e.g., the source electrode) of the selection transistor 180 is electrically connected to one of a source electrode and a drain electrode (e.g., the drain electrode) of a transistor 160. A gate electrode of the selection transistor 180 is electrically connected to a selection line SG. The other of the source electrode and the drain electrode (e.g., the source electrode) of the transistor 160 is electrically connected to a source line SL. The other of the source electrode and the drain electrode (e.g., the source electrode) of the transistor 162, a gate electrode of the transistor 160, and one electrode of a capacitor 164 are electrically connected to one another. A gate electrode of the transistor 162 is electrically connected to a writing word line WWL, and the other electrode of the capacitor 164 is electrically connected to a reading word line RWL.

Here, as the transistor 162, a transistor including an oxide semiconductor material (a transistor in which a channel is formed in an oxide semiconductor layer) can be used, for example. A transistor including an oxide semiconductor material has a characteristic of extremely small off-state current. For that reason, a potential of the gate electrode of the transistor 160 can be held for an extremely long time by turning off the transistor 162.

Note that the transistor 160 may include any material, and there is no particular limitation on the material of the transistor 160. In terms of improving speed for reading data, for example, a transistor with high switching speed, such as a transistor including single crystal silicon (e.g., a transistor in which a channel is formed in a single crystal silicon substrate or a single crystal silicon layer), is preferably used as the transistor 160.

The semiconductor device illustrated in FIG. 1 utilizes a characteristic in which the potential of the gate electrode of the transistor 160 can be held for an extremely long time; therefore, data can be written and read as follows.

Firstly, writing of data will be described. The potential of the selection line SG is set to a potential at which the selection transistor 180 is turned off so that the selection transistor 180 is turned off, and the potential of the source line SL is set to a potential at which the transistor 160 is turned on so that the transistor 160 is turned on. Thus, the potential of the source line SL is not supplied to the bit line BL and one of the source electrode and the drain electrode of a transistor 162 and is supplied only to the source electrode and the drain electrode of the transistor 160, so that the potential of the source electrode or the drain electrode of the transistor 160 can be set to a fixed potential of the source line SL.

After the potential of the source electrode or the drain electrode of the transistor 160 is set to a fixed potential of the source line SL, the potential of the writing word line WWL is set to a potential at which the transistor 162 is turned on so that the transistor 162 is turned on, whereby the potential of the bit line BL is supplied to the gate electrode of the transistor 160 and the one electrode of the capacitor 164. That is to say, predetermined charge is supplied to the gate electrode of the transistor 160. Here, any one of two charges corresponding to two different potentials (hereinafter, charge for supplying a low potential is referred to as charge $Q_L$, and charge for supplying a high potential is referred to as charge $Q_H$) is selectively supplied to the gate electrode of the transistor 160. Here, one of $Q_L$ and $Q_H$ is set as data "1" and the other is set as data "0", so that data of one bit can be written to a memory cell. Note that the storage capacity of the semiconductor device may be improved in such a manner that multi level data (data of a plurality of bits) is written to one memory cell by selecting charge to be supplied to the gate electrode of the transistor 160 among charges corresponding to three or more different potentials.

Then, the potential of the writing word line WWL is lowered so that the transistor 162 is turned off; thus, the charge supplied to the gate electrode of the transistor 160 and the one electrode of the capacitor 164 is held.

As described above, the transistor 160 is turned on and the potential of the source electrode or the drain electrode of the transistor 160 is set to a fixed potential of the source line SL. Thus, the potential supplied to the gate electrode of the transistor 160 and the one electrode of the capacitor 164 is not influenced by reduction in the potential of the writing word line WWL in holding of charge, and reduction thereof can be suppressed.

Since the off-state current of the transistor 162 is extremely small, the charge of the gate electrode of the transistor 160 is held for a long time.

Secondly, reading of data will be described. When an appropriate potential (a reading potential) is supplied to the reading word line RWL with a predetermined potential (a constant potential) supplied to the source line SL, the resistance of the source electrode or the drain electrode of the transistor 160 varies depending on the amount of charge held in the gate electrode of the transistor 160. This is because in general, when the transistor 160 is an n-channel transistor, an apparent threshold voltage $V_{thH}$ of the transistor 160 in the case where $Q_H$ is given to the gate electrode of the transistor 160 is lower than an apparent threshold voltage $V_{thL}$ of the transistor 160 in the case where $Q_L$ is supplied to the gate electrode of the transistor 160. Here, an apparent threshold value refers to the potential of the reading word line RWL, which is needed to turn on the transistor 160. Thus, the potential of the reading word line RWL is set to a potential V0 intermediate between $V_{thH}$ and $V_{thL}$, whereby charge supplied to the gate electrode of the transistor 160 in writing data can be determined For example, in the case where $Q_H$ is supplied to the gate electrode of the transistor 160 in writing of data, when the potential of the reading word line RWL is set to V0 ($>V_{thH}$), the transistor 160 is turned on. On the other hand, in the case where $Q_L$ is supplied to the gate electrode of the transistor 160 in writing of data, even when the potential of the reading word line RWL is set to V0 ($<V_{thL}$), the transistor 160 remains off. Therefore, the held data can be read by detecting the resistance of the transistor 160.

Note that in the case where a plurality of memory cells is arrayed to be used, only data of desired memory cells need to be read.

For example, in the case of a structure (a NAND type) in which the transistors 160 of the plurality of memory cells are electrically connected in series, the following operation is performed when data of a predetermined memory cell is read and data of the other memory cells is not read. A potential at which the transistor 160 is turned on regardless of the amount of charge supplied to the gate electrode in writing of data, that is, a potential higher than $V_{thL}$ is supplied to the reading word lines RWL of the memory cells whose data is not to be read.

Further, for example, in the case of a structure (a NOR type) in which the transistors 160 of the plurality of memory cells are not electrically connected in series but each electrically connected to a wiring, the following operation is performed when data of a predetermined memory cell is read and data of the other memory cells is not read. A potential at which the transistor 160 is turned off regardless of the amount of charge supplied to the gate electrode in writing of data, that is, a potential lower than $V_{thH}$ is supplied to the reading word lines RWL of the memory cells whose data is not to be read.

Thirdly, rewriting of data will be described. Rewriting of data is performed in a manner similar to that of the writing of data. The potential of the selection line SG is set to a potential at which the selection transistor 180 is turned off so that the selection transistor 180 is turned off, and the potential of the source line SL is set to a potential at which the transistor 160 is turned on so that the transistor 160 is turned on. Thus, the potential of the source line SL is not supplied to the bit line BL and one of the source electrode and the drain electrode of a transistor 162 and is supplied only to the source electrode and the drain electrode of the transistor 160, so that the potential of the source electrode or the drain electrode of the transistor 160 can be set to a fixed potential of the source line SL.

After the potential of the source electrode or the drain electrode of the transistor 160 is set to a fixed potential of the source line SL, the potential of the writing word line WWL is set to a potential at which the transistor 162 is turned on so that the transistor 162 is turned on, whereby the potential of the bit line BL (a potential corresponding to new data) is supplied to the gate electrode of the transistor 160 and the one electrode of the capacitor 164.

Then, the potential of the writing word line WWL is lowered so that the transistor 162 is turned off; thus, charge corresponding to new data is held in the gate electrode of the transistor 160 and the one electrode of the capacitor 164.

As in writing of data, reduction in the potential supplied to the gate electrode of the transistor 160 and the one electrode of the capacitor 164 is concerned. The potential supplied to the gate electrode of the transistor 160 and the one electrode of the capacitor 164 may decrease as the potential of the writing word line WWL decreases. However, since the transistor 160 is on and the potential of the source electrode or the drain electrode of the transistor 160 is set to a fixed potential of the source line SL, reduction in the potential supplied to the gate electrode of the transistor 160 and the one electrode of the capacitor 164 can be suppressed.

As described above, in the driving method of a semiconductor device according to one embodiment of the invention disclosed herein, it is not necessary to erase written data before writing new data and it is possible to directly rewrite data by another writing of data. Accordingly, reduction in operation speed due to erasing of data can be suppressed. In other words, high-speed operation of the semiconductor device can be realized.

In a driving method of a semiconductor device according to one embodiment of the invention disclosed herein, the transistor 160 is turned on and the potential of the source electrode or the drain electrode of the transistor 160 is set to a fixed potential of the source line SL, when charge is accumulated and held in the gate electrode of the transistor 160 and the one electrode of the capacitor 164. Thus, a potential to be written (a potential of the bit line BL) can be supplied to the gate electrode of the transistor 160 and the one electrode of the capacitor 164. Therefore, even in a semiconductor device including a plurality of memory cells, a potential to be written can be stably supplied to the gate electrode of the transistor 160 and the one electrode of the capacitor 164, so that the reliability of the semiconductor device can be improved.

Note that the gate electrode of the transistor 160 is electrically connected to the other of the source electrode and the drain electrode of the transistor 162 and the one electrode of the capacitor 164 and therefore has a function similar to that of a floating gate of a floating-gate transistor used for a nonvolatile memory element. Hereinafter, a portion in which the gate electrode of the transistor 160 is electrically connected to the other of the source electrode and the drain electrode of the transistor 162 and the one electrode of the capacitor 164 is sometimes referred to as a node FG. In the case where the transistor 162 is off, the node FG can be regarded as a floating gate embedded in an insulator and charge is held in the node FG The off-state current of the transistor 162 including an oxide semiconductor material is smaller than or equal to one hundred thousandth of the off-state current of a transistor in which a channel is formed in silicon; thus, loss of the charge accumulated in the node FG due to leakage current of the transistor 162 is negligible. That is to say, with the transistor 162 including an oxide semiconductor material, a nonvolatile memory device which can hold data without being supplied with power can be realized.

For example, when the off-state current of the transistor 162 is 10 zA (1 zA (zeptoampere) is $1 \times 10^{-21}$ A) or less at room temperature (25° C.) and the capacitance of the capacitor 164 is approximately 10 fF, data can be held for $10^4$ seconds or longer. Needless to say, the holding time depends on transistor characteristics and capacitance of the capacitor.

Further, a driving method of the semiconductor device shown in FIG. 1 does not have the problem of deterioration of a gate insulating layer (a tunnel insulating layer), which has been a problem of a conventional floating-gate transistor. That is, the problem of deterioration of a gate insulating layer due to injection of electrons into a floating gate, which has been regarded as a problem, can be solved. This means that there is no limit on the number of times of writing in principle. Furthermore, high voltage needed for writing or erasing in a conventional floating gate transistor is not necessary.

Application Example

Next, a circuit configuration to which the circuit illustrated in FIG. 1 is applied and its operation will be described with reference to FIG. 2 and FIG. 3.

Figure 2:
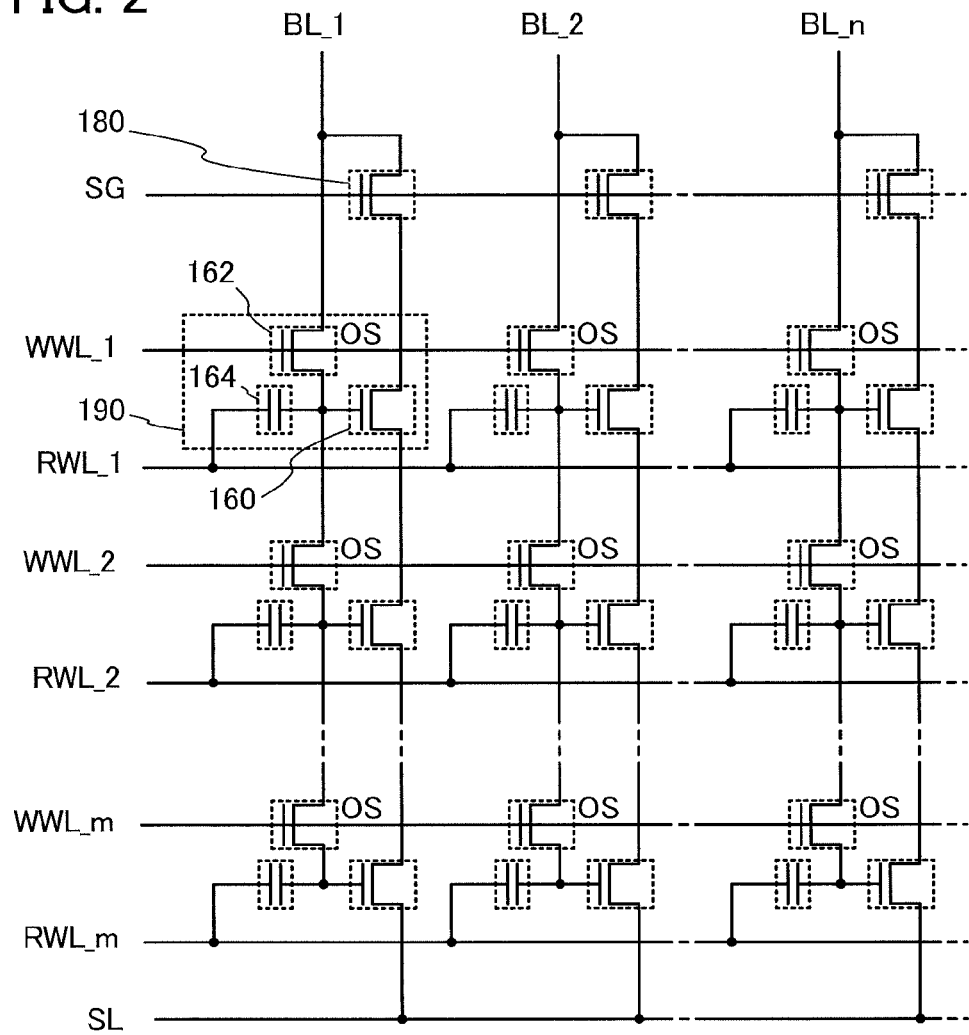
FIG. 2 is a circuit diagram of a semiconductor device.
Figure 3:
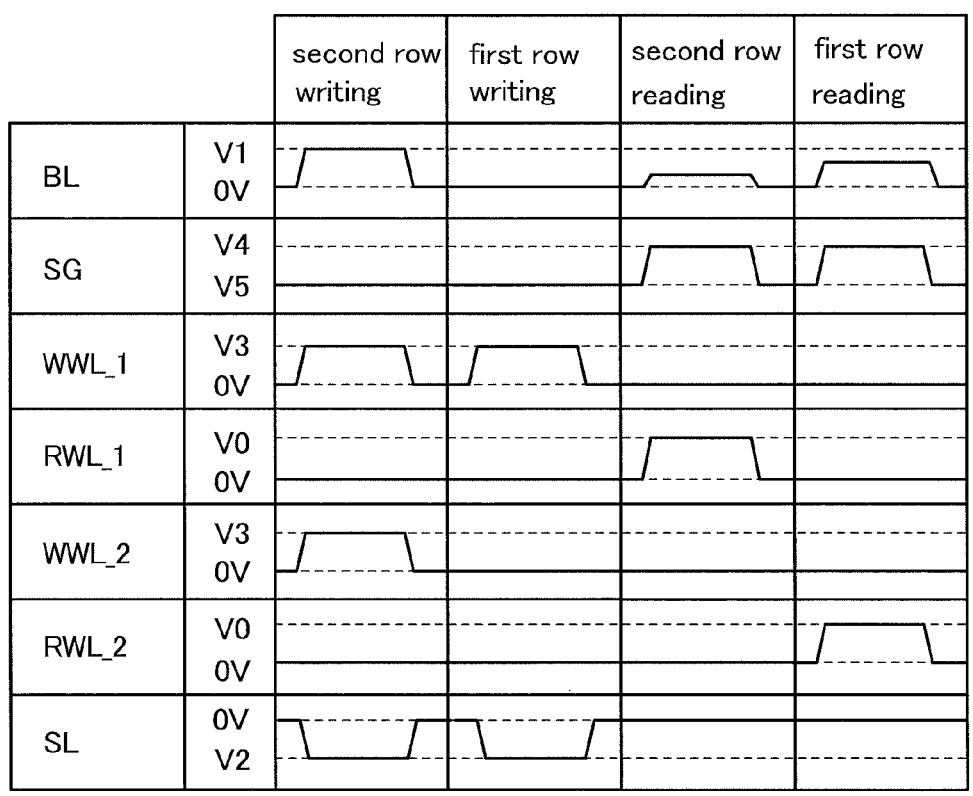
FIG. 3 is a timing diagram.

FIG. 2 illustrates an example of a circuit diagram of a NAND-type semiconductor device including m rows (in a vertical direction)×n columns (in a horizontal direction) memory cells 190 (m is a natural number greater than or equal to 2 and n is a natural number). Note that actually, the semiconductor device can include a plurality of sets of m (rows) (in a vertical direction)×n (columns) (in a horizontal direction) cells. In FIG. 2, wirings having a similar function are distinguished by "$_1$", "$_2$", and the like added to the end of their names.

The semiconductor device in FIG. 2 includes m writing word lines WWL (WWL$_1$ to WWL$_m$), m reading word lines RWL (RWL$_1$ to RWL$_m$), n bit lines BL (BL$_1$ to BL$_n$), a memory cell array in which the m rows (in a vertical direction)×n columns (in a horizontal direction) memory cells 190 are arranged in matrix, a source line SL, a selection line SG, and n selection transistors 180.

The n selection transistors 180 are arranged between the bit lines BL and the memory cells 190 in the first row along the selection line SG. Gate electrodes of the selection transistors 180 are electrically connected to the selection line SG.

The bit lines BL are electrically connected to either source electrodes or drain electrodes of the transistors 162 of the memory cells 190 in the first row, and are electrically connected to either source electrodes or drain electrodes of the transistors 160 of the memory cells 190 in the first row through the selection transistors 180. The source lines SL are electrically connected to the others of the source electrodes and drain electrodes of the transistors 160 of the memory cells 190 in the m-th row.

Either source electrodes or drain electrodes of the transistors 160 of the memory cells 190 in the k-th row (k is a natural number greater than or equal to 2 and less than or equal to (m−1)) are electrically connected to either electrodes of the capacitors 164, the gate electrodes of the transistors 162, and the others of the source electrodes and drain electrodes of the transistors 160, of the memory cells 190 in the (k−1)-th row. The others of the source electrodes and drain electrodes of the transistors 160 of the memory cells 190 in the k-th row are electrically connected to either electrodes of the capacitors 164, the gate electrodes of the transistors 162, and either source electrodes or drain electrodes of the transistors 160, of the memory cells 190 in the (k+1)-th row.

The writing word line WWL$_j$ in the j-th row (j is a natural number greater than or equal to 1 and less than or equal to m) is electrically connected to the gate electrodes of the transistors 162 of the memory cells 190 in the j-th row. The reading word line RWL$_j$ in the j-th row is electrically connected to the other electrodes of the capacitors 164 of the memory cells 190 in the j-th row.

The configuration of the memory cells 190 in FIG. 2 is similar to that in FIG. 1. Note that in FIG. 2, only the memory cells 190 in the first row are electrically connected to the bit lines BL not through the other memory cells 190 and only the memory cells 190 in the m-th row are electrically connected to the source line SL not through the other memory cells 190 because the transistors 162 of the memory cells 190 are electrically connected in series in the column direction and the transistors 160 of the memory cells 190 are electrically connected in series in the column direction. The memory cells 190 in the other rows are electrically connected to the bit lines BL and the source line SL through other memory cells 190 of the same columns.

Here, in the semiconductor device illustrated in FIG. 2, the nodes FG of the memory cells in the (k−1)-th row have the structure in FIG. 1, and in addition, are electrically connected to either source electrodes or drain electrodes of the transistors 162 of the memory cells 190 in the k-th row. Here, the transistor 162 including an oxide semiconductor material in each of the memory cells in the k-th row and each of the memory cells in the (k−1)-th row has extremely small off-state current. Thus, in the memory cell 190 in the semiconductor device illustrated in FIG. 2, the potential of the node FG can be held for a long time by turning off the transistor 162 as in the semiconductor device illustrated in FIG. 1.

As in a structure shown in FIG. 2, the transistors 162 in the plurality of memory cells 190 are electrically connected in series, so that the source electrode of the transistor 162 and the drain electrode of the transistor 162 can be in contact with each other or used in common between the memory cells 190. Accordingly, only one of the source electrode and the drain electrode of the transistor 162 is included in each memory cell 190.

On the other hand, in the case where the transistors 162 of the memory cells 190 are not connected in series and the source electrode and the drain electrode are provided for each of the transistors 162 in the memory cells 190, one of the source electrode and the drain electrode of the transistor 162 needs to be connected to a wiring such as the bit line BL through an opening. That is to say, both of the source electrode and the drain electrode of the transistor 162 and the opening for connection with the wiring are included in each memory cell 190.

Therefore, as illustrated in FIG. 2, the transistors 162 of the memory cells 190 are electrically connected in series, whereby the area occupied by the memory cells 190 can be reduced. For example, when F is used to express the minimum feature size, the area occupied by the memory cell 190 can be 6 $F^2$ to 12 $F^2$. Accordingly, the degree of integration of the semiconductor device can be increased, and the storage capacity per unit area can be increased.

Although the transistors 162 of the memory cells 190 are electrically connected in series in the circuit configuration illustrated in FIG. 2, they are not necessarily electrically connected in series. For example, the transistors 162 may be electrically connected in parallel.

An additional selection line and additional selection transistors may be provided between the memory cells 190 in the m-th row and the source line SL.

In the configuration in FIG. 2, writing of data and reading of data are basically the same as those in FIG. 1. In the configuration in FIG. 2, the operation of writing and reading data will be described with reference to a timing diagram in FIG. 3 using a configuration of the case where m is 2 and n is 1 as an example. The case where data "1" is written to the memory cell in the second row and the first column, data "0" is written to the memory cell in the first row and the first column, data "1" is read from the memory cell in the second row and the first column, and data "0" is read from the memory cell in the first row and the first column is described here. The names such as BL and SL in the timing diagram denote wirings to which potentials in the timing diagram are applied.

Here, the case where data held in the node FG by supplying a potential V1 (e.g., a power supply voltage VDD) to the node FG is referred to as data "1" and data held in the node FG by supplying GND (0 V) to the node FG is referred to as data "0" will be described as an example. Although the potential of the bit line BL differs between the case of writing data "1" to the memory cell 190 and the case of writing data "0" to the memory cell 190, basic writing operation is the same.

First, an example of the case of writing data "1" to the memory cell 190 in the second row and the first column is described. The potential of the selection line SG is set to a potential at which the selection transistor 180 is turned off (V5), and the potential of the source line SL is set to V2 so that the transistors 160 of the memory cells 190 in the first row and the second row are turned on. Thus, the potentials of the source electrodes or the drain electrodes of the transistors 160 of the memory cells 190 in the first row and the second row are set to a fixed potential of the source line SL. The potential V2 is set to be lower than the difference between the potential V1 of the node FG and a potential corresponding to a threshold value of the transistor 160.

Then, the potential of the bit line BL is set to V1 and the potentials of the writing word line $WWL_1$ and the writing word line $WWL_2$ are set to V3 (V3>V1), so that the transistors 162 of the memory cells 190 in the first row and the second row are turned on. At this time, the potentials of the reading word line $RWL_1$ and the reading word line $RWL_2$ are fixed to GND (0 V). Thus, V1 is supplied to the nodes FG of the memory cells 190 in the first row and the second row, so that charge is accumulated.

Then, the potential of the writing word line $WWL_2$ is set to GND (0 V), so that charge accumulated in the node FG of the memory cell 190 in the second row is held. When the potential of the writing word line $WWL_2$ is set to GND (0 V), the transistor 162 of the memory cell 190 in the second row is turned off and the potential of the node FG is set to V1. In this manner, writing to the memory cell 190 in the second row and the first column is completed.

Another example of the case of writing data "1" to the memory cell 190 in the second row and the first column is described. First, the potential of the bit line BL is set to V1 and the potentials of the writing word line $WWL_1$ and the writing word line $WWL_2$ are set to V3 (V3>V1), so that the transistors 162 of the memory cells 190 in the first row and the second row are turned on. At this time, the potentials of the reading word line $RWL_1$ and the reading word line $RWL_2$ are fixed to GND (0 V). Thus, V1 is supplied to the nodes FG of the memory cells 190 in the first row and the second row, so that charge is accumulated.

Then, the potential of the selection line SG is set to V5 so that the selection transistor 180 is turned off, and the potential of the source line SL is set to V2 so that the transistors 160 of the memory cells 190 in the first row and the second row are turned on. Thus, the potentials of the source electrodes or the drain electrodes of the transistors 160 of the memory cells 190 in the first row and the second row are set to a fixed potential of the source line SL. The potential V2 is set to be lower than the difference between the potential V1 of the node FG and a potential corresponding to a threshold value of the transistor 160.

Then, the potential of the writing word line $WWL_2$ is set to GND (0 V), so that charge accumulated in the node FG of the memory cell 190 in the second row is held. When the potential of the writing word line $WWL_2$ is set to GND (0 V), the transistor 162 of the memory cell 190 in the second row is turned off and the potential of the node FG is set to V1. In this manner, writing to the memory cell 190 in the second row and the first column is completed.

Next, an example of the case of writing data "0" to the memory cell 190 in the first row and the first column is described. The potential of the selection line SG is set to V5 so that the selection transistor 180 is turned off, and the potential of the source line SL is set to V2 so that the transistors 160 of the memory cells 190 in the first row and the second row are turned on. Thus, the potentials of the source electrodes or the drain electrodes of the transistors 160 of the memory cells 190 in the first row and the second row are set to a fixed potential of the source line SL. The potential V2 is set to be lower than the difference between GND (0 V) and a potential corresponding to a threshold value of the transistor 160.

Then, the potential of the bit line BL is set to GND (0 V), the potential of the writing word line $WWL_1$ is set to V3 (V3>V1), and the potential of the writing word line $WWL_2$ is set to GND (0 V), so that only the transistor 162 of the memory cell 190 in the first row is turned on. The transistor 162 of the memory cell 190 in the second row remains off, so that data (data "1") remains held in the node FG of the memory cell 190 in the second row. The potentials of the reading word line $RWL_1$ and the reading word line $RWL_2$ are fixed to GND (0 V). Thus, GND (0 V) is supplied to the node FG of the memory cell 190 in the first row, so that charge is accumulated.

Then, the potential of the writing word line $WWL_1$ is set to GND (0 V), so that charge accumulated in the node FG of the memory cell 190 in the first row is held. When the potential of the writing word line $WWL_1$ is set to GND (0 V), the transistor 162 of the memory cell 190 in the first row is turned off and the potential of the node FG is set to 0 V. In this manner, writing to the memory cell 190 in the first row and the first column is completed.

Another example of the case of writing data "0" to the memory cell 190 in the first row and the first column is described. The potential of the bit line BL is set to GND (0 V), the potential of the writing word line $WWL_1$ is set to V3 (V3>V1), and the potential of the writing word line $WWL_2$ is set to GND (0 V), so that only the transistor 162 of the memory cell 190 in the first row is turned on. The transistor 162 of the memory cell 190 in the second row remains off, so that data (data "1") remains held in the node FG of the memory cell 190 in the second row. The potentials of the reading word line $RWL_1$ and the reading word line $RWL_2$ are fixed to GND (0 V). Thus, GND (0 V) is supplied to the node FG of the memory cell 190 in the first row, so that charge is accumulated.

Then, the potential of the selection line SG is set to V5 so that the selection transistor 180 is turned off, and the potential of the source line SL is set to V2 so that the transistors 160 of the memory cells 190 in the first row and the second row are turned on. Thus, the potentials of the source electrodes or the drain electrodes of the transistors 160 of the memory cells 190 in the first row and the second row are set to a fixed potential of the source line SL. The potential V2 is set to be lower than the difference between GND (0 V) and a potential corresponding to a threshold value of the transistor 160.

Then, the potential of the writing word line $WWL_1$ is set to GND (0 V), so that charge accumulated in the node FG of the memory cell 190 in the first row is held. When the potential of the writing word line $WWL_1$ is set to GND (0 V), the transistor 162 of the memory cell 190 in the first row is turned off and the potential of the node FG is set to 0 V. In this manner, writing to the memory cell 190 in the first row and the first column is completed.

In the above manner, writing can be performed on the memory cells 190 in the second row and the first column and the first row and the first column.

When writing is performed, the potentials of the source electrodes or the drain electrodes of the transistors 160 of the memory cells 190 in the first row and the second row are set to a fixed potential of the source line SL. Thus, the potential supplied to the node FG is not influenced by reduction in the potential of the writing word line WWL in holding of charge, and reduction thereof is prevented. Thus, a potential to be written (a potential of the bit line BL) can be supplied to the node FG, so that a potential can be stably written.

Here, the case where the memory cell 190 in the first row is electrically connected in series to the memory cell 190 in the second row is described. Accordingly, writing needs to be performed on the memory cell 190 in the first row after the memory cell 190 in the second row. However, in the case where the memory cell 190 in the first row is not electrically connected in series to the memory cell 190 in the second row, for example, electrically connected in parallel, writing need not be performed from the memory cell 190 in the second row and may be performed from the memory cell 190 in the first row.

A transistor including an oxide semiconductor material is used as the transistor 162 in the above circuit configuration, for example. A transistor including an oxide semiconductor material has a characteristic of extremely small off-state current. For that reason, a potential of the gate electrode of the transistor 160 can be held for an extremely long time by turning off the transistor 162.

Next, reading of data will be described. Reading of data is performed by utilizing variation in the potential of the bit line BL. Here, when all the transistors 160 of the memory cells 190 in the first row and the second row are on, the potential of the bit line BL is a low potential, and when at least one of the transistors is off, the potential of the bit line BL is a high potential. However, this is one example and the potential of the bit line BL is not necessarily changed in reading of data.

First, the case of reading data from the memory cell 190 in the second row (the memory cell 190 whose data is to be read) will be described as an example. The potential of the selection line SG is set to a potential at which the selection transistor 180 is turned on (V4), the potentials of the reading word line $RWL_2$ and the writing word line $WWL_2$ which are electrically connected to the capacitor 164 of the memory cell 190 in the second row are set to GND (0 V), and the potentials of the reading word line $RWL_1$ and the writing word line $WWL_1$ which are electrically connected to the memory cell 190 in the first row (the memory cell 190 whose data is not to be read) are set to V0 and GND (0 V), respectively. As described using FIG. 1, the potential V0 may be a potential for the reading word line RWL of the memory cell whose data is not to be read, at which the transistor 160 is turned on regardless of the charge supplied to the gate electrode when reading is performed.

In the case where V1 which is data "1" is supplied to the node FG of the memory cell 190 in the second row, the potential of the reading word line $RWL_2$ which is connected to the memory cell 190 in the second row is set to GND (0 V), so that the transistor 160 is turned on.

In this case, in both the case where data "1" is written to the memory cell 190 in the first row and the case where data "0" is written to the memory cell 190 in the first row, the transistor 160 of the memory cell 190 in the first row is turned on.

Through the above operation, the transistors 160 of the memory cells 190 in the first row and the second row are turned on, so that the potential of the bit line BL becomes a low potential. Thus, the written data "1" can be read.

Next, the case of reading data from the memory cell 190 in the first row (the memory cell 190 whose data is to be read) will be described as an example. In the case of reading data from the memory cell 190 in the first row, the potential of the selection transistor 180 is set to V4 so that the selection transistor 180 is turned on, the potentials of the reading word line $RWL_1$ and the writing word line $WWL_1$ are set to GND (0 V), and the potentials of the reading word line $RWL_2$ and the writing word line $WWL_2$ which are electrically connected to the memory cell 190 in the second row (the memory cell 190 whose data is not to be read) are set to V0 and GND (0 V), respectively.

In the case where 0 V which is data "0" is supplied to the node FG of the memory cell 190 in the first row, the potential of the reading word line $RWL_1$ which is connected to the memory cell 190 in the first row is set to GND (0 V), so that the transistor 160 is turned off. The transistor 160 of the memory cell 190 in the first row is turned off, so that the potential of the bit line BL becomes a high potential. Thus, the written data "0" can be read.

In the above manner, reading can be performed on the memory cells 190 in the second row and the first column and the first row and the first column.

Here, reading is performed on the memory cell 190 in the first row after the memory cell 190 in the second row, there is no particular limitation on the order of performing reading, and reading may be performed from the memory cell 190 in the first row.

Writing and reading operation of data is described above using a circuit configuration in which two memory cells are electrically connected in series as an example; however, writing and reading operation can be performed in a similar manner in a circuit configuration in which m memory cells are electrically connected in series. Writing and reading operation in a circuit configuration in which m memory cells are electrically connected in series will be described below. Note that a timing diagram for the circuit configuration in which m memory cells are electrically connected in series is not shown.

In the circuit configuration in which m memory cells are electrically connected in series, an example of the case of writing data "1" (or data "0") to the memory cell 190 in the k-th row will be described below. The selection transistor 180 is turned off, and the transistors 160 of the memory cells 190 in the first to m-th rows are turned on. Thus, the potentials of the source electrodes or the drain electrodes of the transistors 160 of the memory cells 190 in the first to m-th rows are set to a fixed potential of the source line SL. Then, a potential V1 of the bit line BL (or 0 V) is supplied to either the source electrodes or drain electrodes of the transistors 162 of the memory cells 190 in the first to k-th rows, and a potential is supplied to the writing word lines $WWL_1$ to $WWL_k$, so that the transistors 162 of the memory cells 190 in the first to k-th rows are turned on; thus, charge is accumulated in the memory cell 190 in the k-th row. After that, the potential of the k-th writing word line $WWL_k$ is lowered so that the transistor 162 of the memory cell 190 in the k-th row is turned off, so that charge can be held in the node FG of the memory cell 190 in the k-th row. In the case of writing data "1" (or data "0") to the memory cells 190 in the first to (k−1)-th rows, after charge is held in the node FG of the memory cell 190 in the k-th row, the potentials of the writing word line $WWL_{(k-1)}$ in the (k−1)-th row to the writing word line $WWL_1$ in the first row are sequentially lowered, so that the transistor 162 of the memory cell 190 in the (k−1)-th row to the transistor 162 of the memory cell 190 in the first row are sequentially turned off. Thus, charge can be sequentially held in the node FG of the memory cell 190 in the (k−1)-th row to the node FG of the memory cell 190 in the first row. In this manner, data "1" (or data "0") can be written to the memory cells 190 in the first to (k−1)-th rows. Note that although an example in which writing is performed on the memory cells 190 in the first to (k−1)-th rows after the memory cell 190 in the k-th row is described, writing need not be performed on the memory cells 190 in the first to (k−1)-th rows and may be performed only on the memory cell 190 in the k-th row.

In the circuit configuration in which m memory cells are electrically connected in series, another example of the case of writing data "1" (or data "0") to the memory cell 190 in the k-th row will be described below. A potential V1 of the bit line BL (or 0 V) is supplied to either the source electrodes or drain electrodes of the transistors 162 of the memory cells 190 in the first to k-th rows, and the potentials of the writing word lines $WWL_1$ to $WWL_k$ are supplied to the transistors 162 of the memory cells 190 in the first to k-th rows, so that the transistors 162 of the memory cells 190 in the first to k-th rows are turned on; thus, charge is accumulated in the memory cell 190 in the k-th row. Then, the selection transistor 180 is turned off, and the transistors 160 of the memory cells 190 in the first to m-th rows are turned on. Thus, the potentials of the source electrodes or the drain electrodes of the transistors 160 of the memory cells 190 in the first to m-th rows are set to a fixed potential of the source line SL. After that, the potential of the k-th writing word line $WWL_k$ is lowered so that the transistor 162 of the memory cell 190 in the k-th row is turned off, so that charge can be held in the node FG of the memory cell 190 in the k-th row. In the case of writing data "1" (or data "0") to the memory cells 190 in the first to (k−1)-th rows, after charge is held in the node FG of the memory cell 190 in the k-th row, the potentials of the writing word line $WWL_{(k-1)}$ in the (k−1)-th row to the writing word line $WWL_1$ in the first row are sequentially lowered, so that the transistor 162 of the memory cell 190 in the (k−1)-th row to the transistor 162 of the memory cell 190 in the first row are sequentially turned off. Thus, charge can be sequentially held in the node FG of the memory cell 190 in the (k−1)-th row to the node FG of the memory cell 190 in the first row. In this manner, data "1" (or data "0") can be written to the memory cells 190 in the first to (k−1)-th rows. Note that although an example in which writing is performed on the memory cells 190 in the first to (k−1)-th rows after the memory cell 190 in the k-th row is described, writing need not be performed on the memory cells 190 in the first to (k−1)-th rows and may be performed only on the memory cell 190 in the k-th row.

In the above manner, writing can be performed on the memory cells 190 in the first to k-th rows in the circuit configuration in which m memory cells are electrically connected in series.

When writing is performed, the potentials of the source electrodes or the drain electrodes of the transistors 160 of the memory cells 190 in the first to m-th rows are set to a fixed potential of the source line SL. Thus, the potential supplied to the node FG is not influenced by reduction in the potential of the writing word line WWL in holding of charge, and reduction thereof can be suppressed. Thus, a potential to be written (a potential of the bit line BL) can be supplied to the node FG, so that a potential can be stably written.

Here, the case where the memory cells 190 in the first to m-th rows are electrically connected in series is described. Thus, writing needs to be sequentially performed on the memory cell 190 on a far side from the bit line to the memory cell 190 on a near side from the bit line. However, in the case where the memory cells 190 in the first to m-th rows are not electrically connected in series, for example, electrically connected in parallel, writing need not be performed from the memory cell 190 on the far side from the bit line and there is no particular limitation.

A transistor including an oxide semiconductor material is used as the transistor 162 in the above circuit configuration, for example. A transistor including an oxide semiconductor material has a characteristic of extremely small off-state current. For that reason, a potential of the gate electrode of the transistor 160 can be held for an extremely long time by turning off the transistor 162.

Next, in the circuit configuration in which m memory cells are electrically connected in series, an example of the case of reading data from the memory cell 190 in the k-th row will be described below. The selection transistor 180 is turned on, the potentials of the writing word line $WWL_1$ in the first row to the writing word line $WWL_m$ in the m-th row are set to GND (0 V), and the potentials of the reading word line $RWL_1$ in the first row to the reading word line $RWL_m$ in the m-th row except for the reading word line $RWL_k$ in the k-th row are set to V0. Only the potential of the reading word line $RWL_k$ of the memory cell 190 in the k-th row (the memory cell 190 whose data is to be read) is set to GND (0 V), whereby reading can be performed on the memory cell 190 in the k-th row. In the case where data "1" is written to the memory cell 190 in the k-th row, the potential of the bit line BL is a low potential, and in the case where data "0" is written to the memory cell 190 in the k-th row, the potential of the bit line BL is a high potential.

In the above manner, reading can be performed on the memory cell 190 whose data is to be read in the circuit configuration in which m memory cells are electrically connected in series.

Embodiment 2

In this embodiment, a circuit configuration and operation of a semiconductor device according to one embodiment of the invention disclosed herein will be described with reference to FIG. 4. Note that in a circuit diagram, "OS" is written beside a transistor in order to indicate that the transistor includes an oxide semiconductor material.

Figure 4:
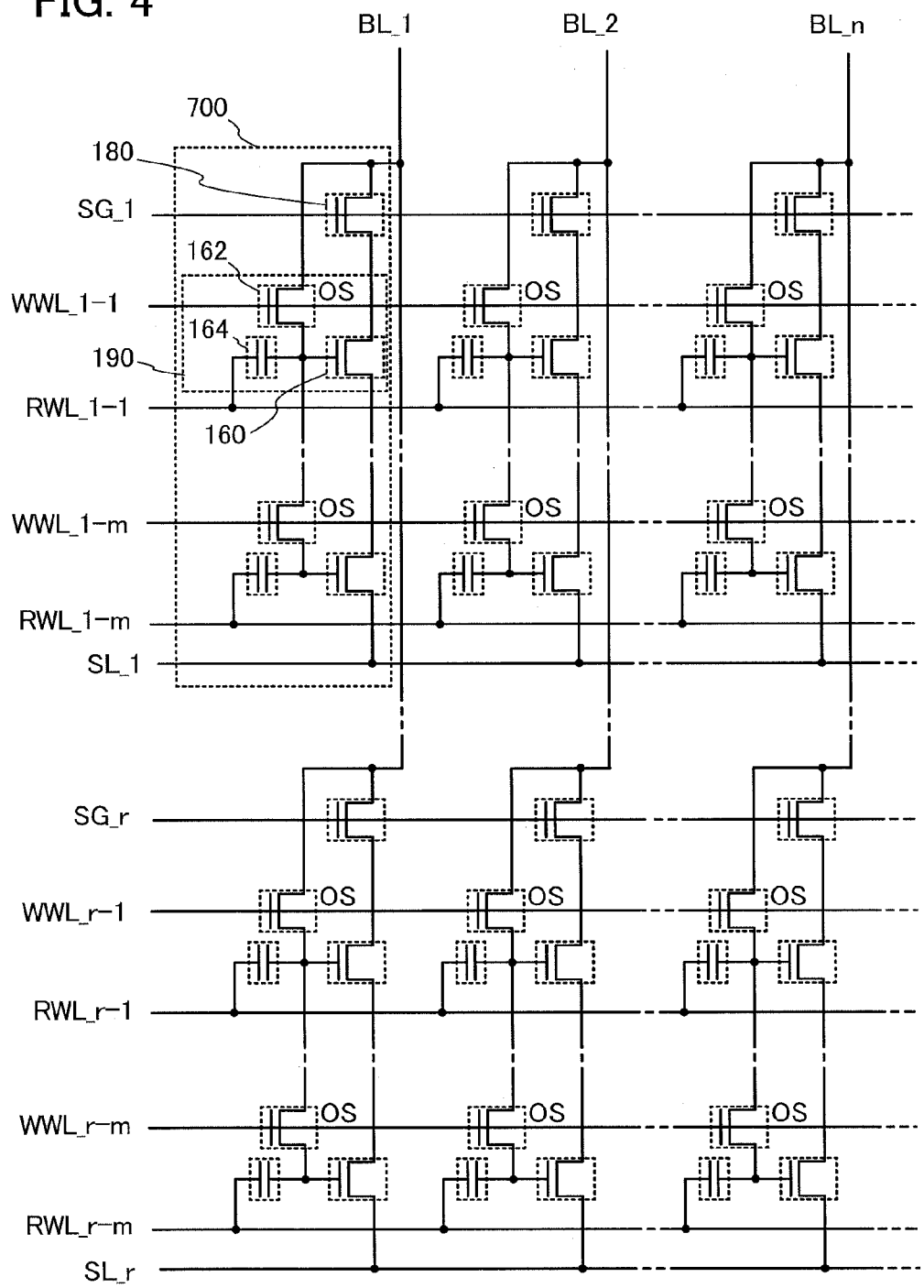
FIG. 4 is a circuit diagram of a semiconductor device.

The circuit configuration shown in FIG. 4 is an example of a circuit configuration of a NAND-type semiconductor device including r (in a vertical direction)×n (in a horizontal direction) blocks 700 (r is a natural number greater than or equal to 1), in which one block includes m memory cells 190 and a selection transistor 180. The configuration of the block 700 in FIG. 4 is similar to the configuration in FIG. 2. Note that either the source electrodes or drain electrodes of the selection transistors 180 in each of the r blocks 700 electrically connected in the vertical direction are electrically connected to the same bit line BL.

In the configuration in FIG. 4, the circuit configuration of the block 700 and writing and reading operation of data are basically similar to the case of FIG. 2; therefore, detailed description thereof is not repeated.

The blocks 700 are electrically connected in series as shown in FIG. 4, so that the capacitance of the semiconductor device can be increased.

In the circuit configuration shown in FIG. 2, the number of the memory cells 190 electrically connected in series may be increased, so that the capacitance of the semiconductor device can be increased. However, when the number of the memory cells 190 electrically connected in series is increased, the written potential is lower in the memory cell 190 on the farther side from the bit line BL. Thus, difference is caused between a potential to be written (the potential of the bit line BL) and a potential written to the memory cell 190 electrically connected to a far side from the bit line BL. Accordingly, difference is caused between a potential written to the memory cell 190 electrically connected to a near side from the bit line BL and a potential written to the memory cell 190 electrically connected to a far side from the bit line BL, which causes variation in the potentials of the nodes FG in the memory cells 190.

As shown in FIG. 4, the memory cells 190 electrically connected in series are divided into blocks, and the potential of the bit line BL is supplied to each block 700. Thus, difference between a potential to be written (the potential of the bit line BL) and a potential written to the memory cell 190 can be reduced, and variation in the potentials written to the memory cells can be reduced.

A transistor including an oxide semiconductor material is used as the transistor 162 in the above structure, for example. A transistor including an oxide semiconductor material has a characteristic of extremely small off-state current. For that reason, a potential of the gate electrode of the transistor 160 can be held for an extremely long time by turning off the transistor 162.

In the above configuration, in the case of performing writing on the t-th block 700 (t is a natural number greater than or equal to 1 and less than or equal to r), the potential of the source line $SL_t$ of the t-th block 700 may be set to a potential at which the transistors 160 of the memory cells 190 in the first to m-th rows in the t-th block 700 are turned on. A potential need not be supplied to the source line $SL_1$ of the first block 700 to the source line $SL_r$ of the r-th block 700 except for the source line $SL_t$ of the t-th block 700 to which data is to be written. That is, it is acceptable as long as a potential is supplied to the source line SL of the block 700 to which data is to be written, and a potential need not be supplied to the source line SL of the block 700 to which data is not to be written. Thus, there is no need to supply a potential to all the source lines SL, and therefore power consumption can be reduced.

When writing of data is performed in the above configuration, in the block 700 to which data is to be written, the potentials of the source electrodes or the drain electrodes of the transistors 160 of the memory cells 190 in the first to m-th rows are set to a fixed potential of the source line SL. Thus, the potential supplied to the node FG is not influenced by reduction in the potential of the writing word line WWL in holding of charge, and reduction thereof is prevented. Thus, a potential to be written (a potential of the bit line BL) can be supplied to the node FG, so that a potential can be stably written.

Embodiment 3

In this embodiment, a structure and a manufacturing method of a semiconductor device according to one embodiment of the invention disclosed herein will be described with reference to FIGS. 5A and 5B, FIGS. 6A to 6G, FIGS. 7A to 7E, FIGS. 8A to 8D, FIGS. 9A to 9D, FIGS. 10A to 10C, FIGS. 11A to 11C, and FIGS. 12A and 12B. Specifically, a structure and a manufacturing method of a memory cell which can be mounted on a storage device will be described.
<Cross-Sectional Structure and Planar Structure of Semiconductor Device>

Figure 5A:
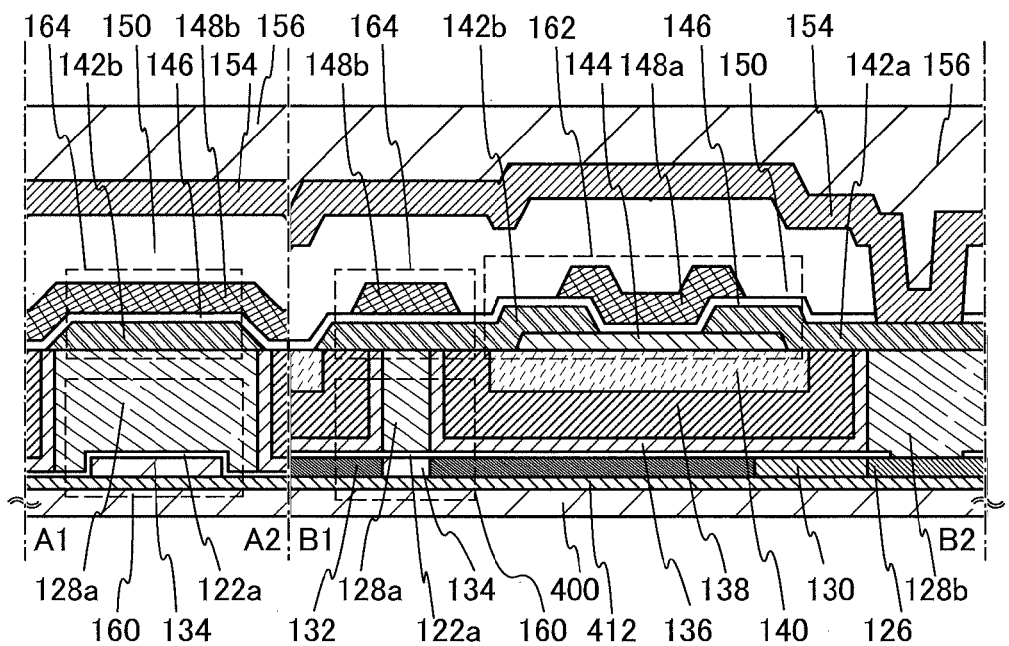
FIGS. 5A and 5B are a cross-sectional view and a plan view, respectively, of a semiconductor device.
Figure 5B:
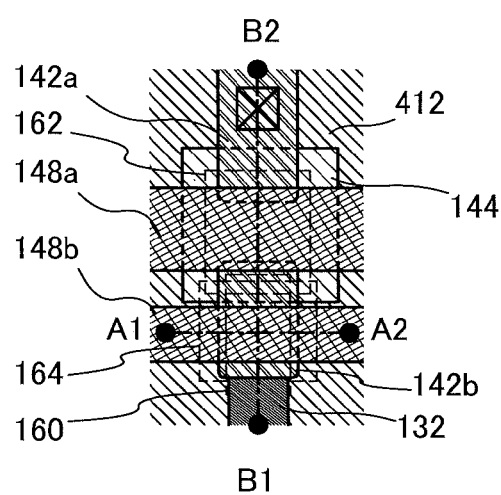

FIGS. 5A and 5B illustrate an example of a structure of a semiconductor device. FIG. 5A illustrates a cross section of the semiconductor device, and FIG. 5B illustrates a plan view of the semiconductor device. Here, FIG. 5A corresponds to a cross section along line A1-A2 and line B1-B2 in FIG. 5B. The semiconductor device illustrated in FIGS. 5A and 5B includes the transistor 160 including a first semiconductor material in a lower portion and the transistor 162 including a second semiconductor material in an upper portion. It is preferable that the first semiconductor material and the second semiconductor material be different from each other. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, gallium arsenide, or the like and is preferably single crystalline. Alternatively, an organic semiconductor material or the like may be used. A transistor including such a semiconductor material other than an oxide semiconductor can operate at high speed easily. On the other hand, a transistor including an oxide semiconductor can hold charge for a long time owing to its characteristics. The semiconductor device in FIGS. 5A and 5B can be used as a memory cell. The transistor 160, the transistor 162, and the capacitor 164 in FIGS. 5A and 5B correspond to the transistor 160, the transistor 162, and the capacitor 164 in FIG. 1, FIG. 2, and FIG. 4, respectively.

Since the technical nature of the disclosed invention is to use a semiconductor material with which off-state current can be sufficiently decreased, such as an oxide semiconductor, in the transistor 162 shown in FIG. 1, FIG. 2, and FIG. 4 so that data can be held, it is not necessary to limit a specific structure of the semiconductor device, such as a material of the semiconductor device or a structure of the semiconductor device, to those described here.

The transistor 160 in FIGS. 5A and 5B includes a channel formation region 134 provided in a semiconductor layer over a semiconductor substrate 400, impurity regions 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region. Also, the term "drain electrode" may include a drain region.

Further, a conductive layer 128b is connected to an impurity region 126 provided in the semiconductor layer over the semiconductor substrate 400. Here, the conductive layer 128b functions as a source electrode or a drain electrode of the transistor 160. In addition, an impurity region 130 is provided between the impurity region 132 and the impurity region 126. Further, insulating layers 136, 138, and 140 are provided so as to cover the transistor 160. Note that for high integration, it is preferable that, as in FIGS. 5A and 5B, the transistor 160 does not have a sidewall insulating layer. On the other hand, when importance is put on the characteristics of the transistor 160, sidewall insulating layers may be provided on side surfaces of the gate electrode 128a, and the impurity region 132 may include regions with different impurity concentrations.

The transistor 162 in FIGS. 5A and 5B includes an oxide semiconductor layer 144 which is provided over the insulating layer 140 and the like; a source electrode (or a drain electrode) 142a and a drain electrode (or a source electrode) 142b which are electrically connected to the oxide semiconductor layer 144; a gate insulating layer 146 which covers the oxide semiconductor layer 144, the source electrode 142a, and the drain electrode 142b; and a gate electrode 148a which is provided over the gate insulating layer 146 so as to overlap with the oxide semiconductor layer 144.

Here, the oxide semiconductor layer 144 is preferably a highly-purified oxide semiconductor layer by sufficiently removing impurities such as hydrogen or sufficiently supplying oxygen. Specifically, the hydrogen concentration of the oxide semiconductor layer 144 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower. Note that the hydrogen concentration of the oxide semiconductor layer 144 is measured by secondary ion mass spectrometry (SIMS). In the oxide semiconductor layer 144 which is highly purified by sufficiently reducing the concentration of hydrogen therein and in which defect levels in an energy gap due to oxygen deficiency are reduced by supplying a sufficient amount of oxygen, the carrier concentration is lower than $1 \times 10^{12}$/cm$^3$, preferably lower than $1 \times 10^{11}$/cm$^3$, further preferably lower than $1.45 \times 10^{10}$/cm$^3$. For example, the off-state current (here, current per micrometer (μm) of channel width) at room temperature (25° C.) is lower than or equal to 100 zA (1 zA (zeptoampere) is $1 \times 10^{-21}$ A), preferably lower than or equal to 10 zA. In this manner, by using an oxide semiconductor which is made to be an i-type (intrinsic) oxide semiconductor or a substantially i-type oxide semiconductor, the transistor 162 which has extremely favorable off-state current characteristics can be obtained.

The oxide semiconductor layer 144 is preferably purified by sufficiently removing impurities of an alkali metal and an alkaline earth metal, such as sodium, lithium, and potassium. Specifically, the concentrations of sodium, lithium, and potassium contained in the oxide semiconductor layer 144 are respectively $5 \times 10^{16}$ cm$^{-3}$ or lower, preferably $1 \times 10^{16}$ cm$^{-3}$ or lower, further preferably $1 \times 10^{15}$ cm$^{-3}$ or lower; $5 \times 10^{15}$ cm$^{-3}$ or lower, preferably $1 \times 10^{15}$ cm$^{-3}$ or lower; and $5 \times 10^{15}$ cm$^{-3}$ or lower, preferably $1 \times 10^{15}$ cm$^{-3}$ or lower, for example. The concentrations of sodium, lithium, and potassium in the oxide semiconductor layer 144 are measured by secondary ion mass spectrometry (SIMS).

The alkali metal and the alkaline earth metal described above are adverse impurities for the oxide semiconductor layer and are preferably contained as little as possible. When an insulating film in contact with the oxide semiconductor layer is an oxide, an alkali metal, in particular, sodium diffuses into the oxide and becomes a sodium ion (Na$^+$). In addition, sodium cuts a bond between metal and oxygen or enters the bond in the oxide semiconductor layer. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the hydrogen concentration in the oxide semiconductor layer is extremely low. Therefore, the concentration of an alkali metal is strongly required to be set to the above value in the case where the hydrogen concentration in the oxide semiconductor layer is lower than or equal to $5 \times 10^{19}$ cm$^{-3}$, particularly lower than or equal to $5 \times 10^{18}$ cm$^{-3}$.

Note that although the transistor 162 in FIGS. 5A and 5B includes the oxide semiconductor layer 144 which is processed into an island shape in order to suppress leakage current between elements which is caused due to miniaturization, the oxide semiconductor layer 144 which is not processed into an island shape may be employed. In the case where the oxide semiconductor layer is not processed to have an island shape, contamination of the oxide semiconductor layer 144 due to etching in the processing can be prevented.

The capacitor 164 in FIGS. 5A and 5B includes the drain electrode 142b, the gate insulating layer 146, and a conductive layer 148b. In other words, the drain electrode 142b functions as one electrode of the capacitor 164, and the conductive layer 148b functions as the other electrode of the capacitor 164. With such a structure, capacitance can be sufficiently secured. Further, insulation between the drain electrode 142b and the conductive layer 148b can be sufficiently secured by stacking the oxide semiconductor layer 144 and the gate insulating layer 146. Further alternatively, the capacitor 164 may be omitted in the case where a capacitor is not needed.

In this embodiment, the transistor 162 and the capacitor 164 are provided so as to overlap with the transistor 160 at least partly. By employing such a planar layout, high integration can be realized. For example, when F is used to express the minimum feature size, the area of a memory cell can be expressed as 15F$^2$ to 25F$^2$.

An insulating layer 150 is provided over the transistor 162 and the capacitor 164. A wiring 154 is provided in an opening formed in the gate insulating layer 146 and the insulating layer 150. The wiring 154 electrically connects one memory cell to another memory cell. The wiring 154 is electrically connected to the impurity region 126 through the source electrode 142a and the conductive layer 128b. The above structure allows a reduction in the number of wirings in comparison with a structure in which the source region or the drain region in the transistor 160 and the source electrode 142a in the transistor 162 are connected to different wirings. Thus, the integration degree of a semiconductor device can be increased.

With provision of the conductive layer 128b, a position where the impurity region 126 and the source electrode 142a are connected to each other and a position where the source electrode 142a and the wiring 154 are connected to each other can overlap with each other. With such a planar layout, the element area can be prevented from increasing due to contact regions of the electrodes. In other words, the degree of integration of the semiconductor device can be increased.

<Manufacturing Method of SOI Substrate>

Next, an example of a method for forming an SOI substrate used for manufacturing the semiconductor device is described with reference to FIGS. 6A to 6G.

Figure 6A:
FIGS. 6A to 6G are cross-sectional views relating to a manufacturing process of a semiconductor device.
Figure 6B:
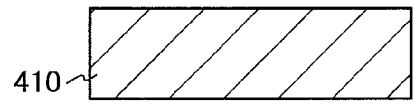

First, the semiconductor substrate 400 is prepared as a base substrate (see FIG. 6A). As the semiconductor substrate 400, a semiconductor substrate such as a single crystal silicon substrate or a single crystal germanium substrate can be used. As a semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

Note that, in place of the semiconductor substrate 400, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. Further, a ceramic substrate which contains silicon nitride and aluminum nitride as its main components and whose coefficient of thermal expansion is close to that of silicon may be used.

A surface of the semiconductor substrate 400 is preferably cleaned in advance. Specifically, the semiconductor substrate 400 is preferably subjected to cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), or the like.

Next, a bond substrate is prepared. Here, a single crystal semiconductor substrate 410 is used as the bond substrate (see FIG. 6B). Note that although a substrate whose crystallinity is single crystal is used as the bond substrate here, the crystallinity of the bond substrate is not necessarily limited to single crystal.

As the single crystal semiconductor substrate 410, for example, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 410 is not limited to circular, and the single crystal semiconductor substrate 410 may be a substrate which has been processed into, for example, a rectangular shape or the like. Further, the single crystal semiconductor substrate 410 can be formed by a Czochralski (CZ) method or a Floating Zone (FZ) method.

Figure 6C:
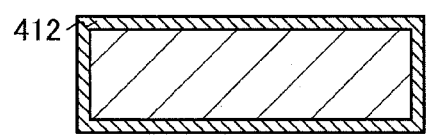

An oxide film 412 is formed over a surface of the single crystal semiconductor substrate 410 (see FIG. 6C). In view of removal of contamination, it is preferable that the surface of the single crystal semiconductor substrate 410 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 412. Dilute hydrofluoric acid and ozone water may be discharged alternately for cleaning.

The oxide film 412 can be formed with, for example, a single layer or a stacked layer of a silicon oxide film, a silicon oxynitride film, and the like. As a method for forming the oxide film 412, a thermal oxidation method, a CVD method, a sputtering method, or the like can be used. When the oxide film 412 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 412 (here, a $SiO_x$ film) is formed by performing thermal oxidation treatment on the single crystal semiconductor substrate 410. The thermal oxidation treatment is preferably performed in an oxidizing atmosphere to which a halogen is added.

For example, thermal oxidation treatment of the single crystal semiconductor substrate 410 is performed in an oxidative atmosphere to which chlorine (Cl) is added, whereby the oxide film 412 can be formed by chlorine oxidation. In this case, the oxide film 412 is a film containing chlorine atoms. By such chlorine oxidation, heavy metal (e.g., Fe, Cr, Ni, Mo, or the like) that is an extrinsic impurity is trapped and chloride of the metal is formed and then removed to the outside; thus, contamination of the single crystal semiconductor substrate 410 can be reduced.

Note that the halogen atom contained in the oxide film 412 is not limited to a chlorine atom. Fluorine atoms may be contained in the oxide film 412. As a method for fluorine oxidation of the surface of the single crystal semiconductor substrate 410, a method in which the single crystal semiconductor substrate 410 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 6D:
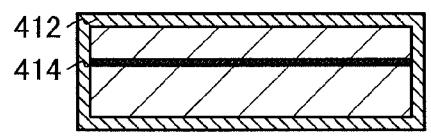
Figure 6E:
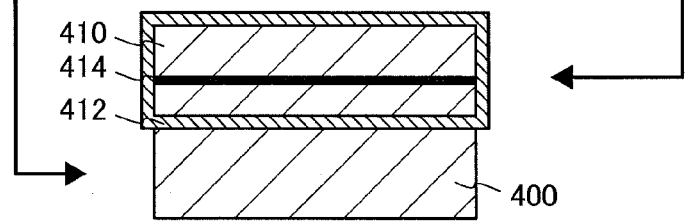

Next, ions are accelerated by an electric field and the single crystal semiconductor substrate 410 is irradiated with the ions, and the ions are added to the single crystal semiconductor substrate 410, whereby an embrittled region 414 where the crystal structure is damaged is formed in the single crystal semiconductor substrate 410 at a predetermined depth (see FIG. 6D).

The depth at which the embrittled region 414 is formed can be adjusted by the kinetic energy, mass, charge, or incidence angle of the ions, or the like. The embrittled region 414 is formed at approximately the same depth as the average penetration depth of the ions. Therefore, the thickness of a single crystal semiconductor layer to be separated from the single crystal semiconductor substrate 410 can be adjusted with the depth at which the ions are added. For example, the average penetration depth may be adjusted such that the thickness of the single crystal semiconductor layer is approximately greater than or equal to 10 nm and less than or equal to 500 nm, preferably greater than or equal to 50 nm and less than or equal to 200 nm.

The above ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation apparatus. In the ion-implantation apparatus, mass separation of ion species of plasma is performed and the object to be processed is irradiated with ion species having predetermined masses.

In this embodiment, an example is described in which an ion-doping apparatus is used to add hydrogen to the single crystal semiconductor substrate 410. A gas containing hydrogen is used as a source gas. As for ions used for the irradiation, the proportion of $H_3+$ is preferably set high. Specifically, it is preferable that the proportion of $H_3^+$ be set 50% or higher (further preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared to the case of performing irradiation with hydrogen and helium in different steps, and surface roughness of a single crystal semiconductor layer to be formed later can be suppressed.

Note that heavy metal may also be added when the embrittled region 414 is formed with the ion doping apparatus; however, the ion irradiation is performed through the oxide film 412 containing halogen atoms, whereby contamination of the single crystal semiconductor substrate 410 due to the heavy metal can be prevented.

Then, the semiconductor substrate 400 and the single crystal semiconductor substrate 410 are disposed to face each other and are made to be closely attached to each other with the oxide film 412 therebetween. Thus, the semiconductor substrate 400 and the single crystal semiconductor substrate 410 can be bonded to each other (see FIG. 6E). Note that an oxide film or a nitride film may be formed on the surface of the semiconductor substrate 400 to which the single crystal semiconductor substrate 410 is attached.

When bonding is performed, it is preferable that a pressure of greater than or equal to 0.001 N/cm² and less than or equal to 100 N/cm², e.g., a pressure of greater than or equal to 1 N/cm² and less than or equal to 20 N/cm², be applied to one part of the semiconductor substrate 400 or one part of the single crystal semiconductor substrate 410. When the bonding surfaces are made close to each other and disposed in close contact with each other by applying a pressure, a bonding between the semiconductor substrate 400 and the oxide film 412 is generated at the part where the close contact is made, and the bonding spontaneously spreads to almost the entire area. This bonding is performed under the action of the Van der Waals force or hydrogen bonding and can be performed at room temperature.

Note that before the single crystal semiconductor substrate 410 and the semiconductor substrate 400 are bonded to each other, surfaces to be bonded to each other are preferably subjected to surface treatment. Surface treatment can improve the bonding strength at an interface between the single crystal semiconductor substrate 410 and the semiconductor substrate 400.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. The temperature of this heat treatment is set to a temperature at which separation is not performed at the embrittled region 414 (for example, a temperature which is higher than or equal to room temperature and lower than 400° C.). Bonding of the semiconductor substrate 400 and the oxide film 412 may be performed while heating them at a temperature in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and one embodiment of the disclosed invention should not be construed as being limited to this example.

Figure 6F:
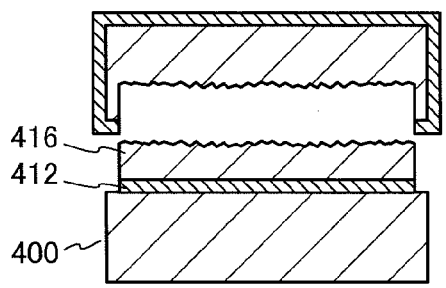

Next, heat treatment is performed for separation of the single crystal semiconductor substrate 410 at the embrittlement region, whereby a single crystal semiconductor layer 416 is formed over the semiconductor substrate 400 with the oxide film 412 interposed therebetween (see FIG. 6F).

Note that the temperature for heat treatment in the separation is desirably as low as possible. This is because as the temperature in the separation is low, generation of roughness on the surface of the single crystal semiconductor layer 416 can be suppressed. Specifically, the temperature for the heat treatment in the separation may be higher than or equal to 300° C. and lower than or equal to 600° C. and the heat treatment is more effective when the temperature is higher than or equal to 400° C. and lower than or equal to 500° C.

Note that after the single crystal semiconductor substrate 410 is separated, the single crystal semiconductor layer 416 may be subjected to heat treatment at 500° C. or higher so that the concentration of hydrogen remaining in the single crystal semiconductor layer 416 may be reduced.

Figure 6G:
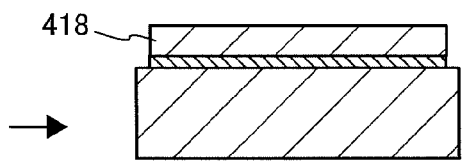

Then, the surface of the single crystal semiconductor layer 416 is irradiated with laser light, whereby a single crystal semiconductor layer 418 in which the planarity of the surface is improved and the number of defects is reduced is formed (see FIG. 6G). Note that instead of the laser light irradiation treatment, heat treatment may be performed.

Although the irradiation treatment with the laser light is performed immediately after the heat treatment for separation of the single crystal semiconductor layer 416 in this embodiment, one embodiment of the present invention is not construed as being limited to this. Etching treatment may be performed after the heat treatment for separation of the single crystal semiconductor layer 416, to remove a region where there are many defects on the surface of the single crystal semiconductor layer 416, and then the laser light irradiation treatment may be performed. Alternatively, the laser light irradiation treatment may be performed after the surface planarity of the single crystal semiconductor layer 416 is improved. Note that the etching treatment may be either wet etching or dry etching. Further, in this embodiment, after the above laser light irradiation, a step of reducing the thickness of the single crystal semiconductor layer 416 may be performed. In order to reduce the thickness of the single crystal semiconductor layer 416, any one or both of dry etching and wet etching may be employed.

Through the above steps, an SOI substrate having the single crystal semiconductor layer 418 with favorable characteristics can be obtained (see FIG. 6G).

<Method for Manufacturing Semiconductor Device>

Next, a manufacturing method of a semiconductor device including the above SOI substrate will be described with reference to FIGS. 7A to 7E, FIGS. 8A to 8D, FIGS. 9A to 9D, and FIGS. 10A to 10C.

<Method for Manufacturing Lower Transistor>

First, a manufacturing method of the transistor 160 in the lower portion will be described with reference to FIGS. 7A to 7E and FIGS. 8A to 8D. Note that FIGS. 7A to 7E and FIGS. 8A to 8D illustrate part of the SOI substrate formed by the method illustrated in FIGS. 6A to 6G and are cross-sectional process views illustrating the transistor in the lower portion illustrated in FIG. 5A.

Figure 7A:
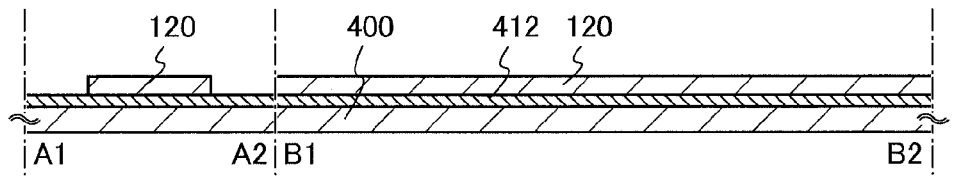
FIGS. 7A to 7E are cross-sectional views relating to a manufacturing process of a semiconductor device.

First, the single crystal semiconductor layer 418 is patterned to have an island shape so that a semiconductor layer 120 is formed (see FIG. 7A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Figure 7B:
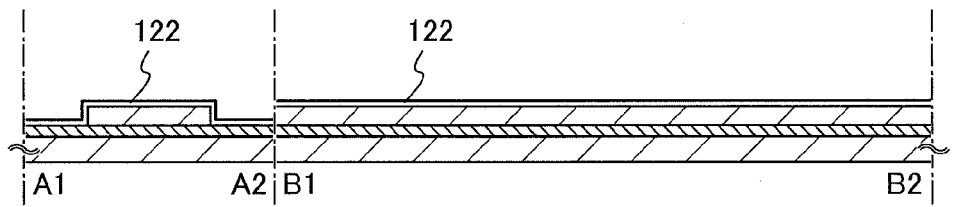

Next, an insulating layer 122 is formed so as to cover the semiconductor layer 120 (see FIG. 7B). The insulating layer 122 is to be a gate insulating layer later. The insulating layer 122 can be formed, for example, by performing heat treatment (thermal oxidation treatment, thermal nitridation treatment, or the like) on a surface of the semiconductor layer 120. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed using a CVD method, a sputtering method, or the like. The insulating layer 122 preferably has a single-layer structure or a stacked-layer structure using a film including any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, and the like. The thickness of the insulating layer 122 may be, for example, greater than or equal to 1 nm and less than or equal to 100 nm, preferably greater than or equal to 10 nm and less than or equal to 50 nm. Here, a single-layer insulating layer containing silicon oxide is formed using a plasma CVD method.

Figure 7C:
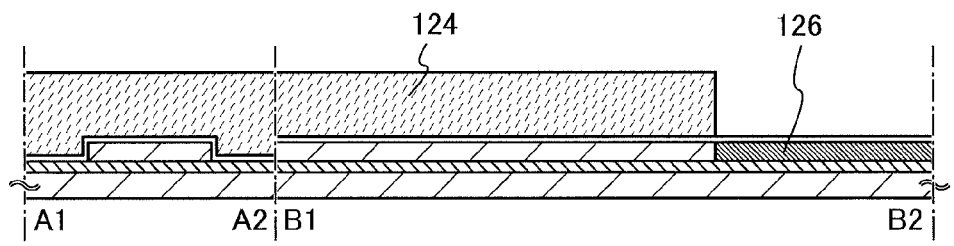

Next, a mask 124 is formed over the insulating layer 122 and an impurity element imparting one conductivity type is added to the semiconductor layer 120, so that the impurity region 126 is formed (see FIG. 7C). Note that here, the mask 124 is removed after the impurity element is added.

Figure 7D:
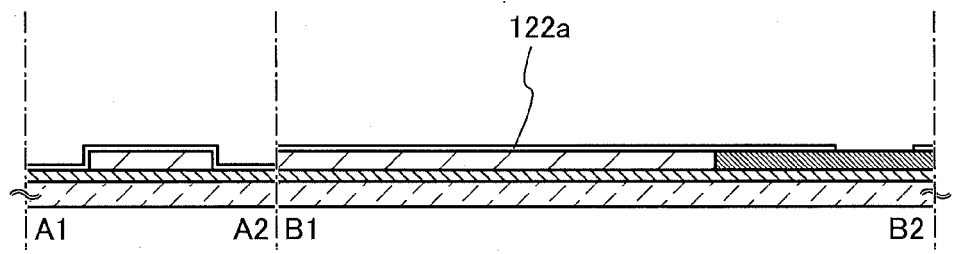

Next, a mask is formed over the insulating layer 122 and a region of the insulating layer 122 that overlaps with the impurity region 126 is partly removed, so that the gate insulating layer 122a is formed (see FIG. 7D). Part of the insulating layer 122 can be removed by etching such as wet etching or dry etching.

Figure 7E:
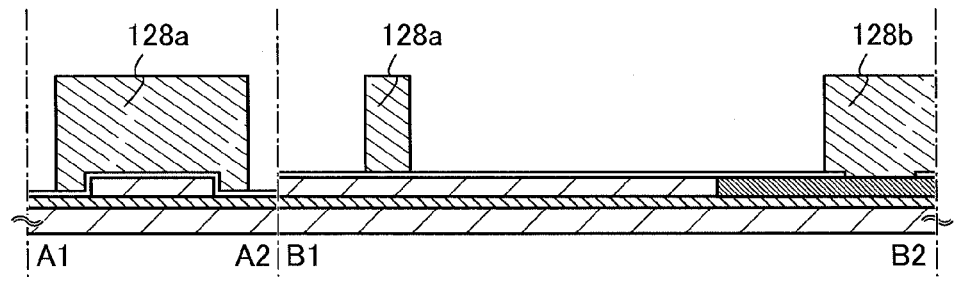

Next, a conductive layer used for forming a gate electrode (including a wiring formed using the same layer as the gate electrode) is formed over the gate insulating layer 122a and is processed, so that the gate electrode 128a and the conductive layer 128b are formed (see FIG. 7E).

The conductive layer used for the gate electrode 128a and the conductive layer 128b can be formed using a metal material such as aluminum, copper, titanium, tantalum, or tungsten. The layer including a conductive material may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be employed. The conductive layer may be processed by etching using a resist mask.

Figure 8A:
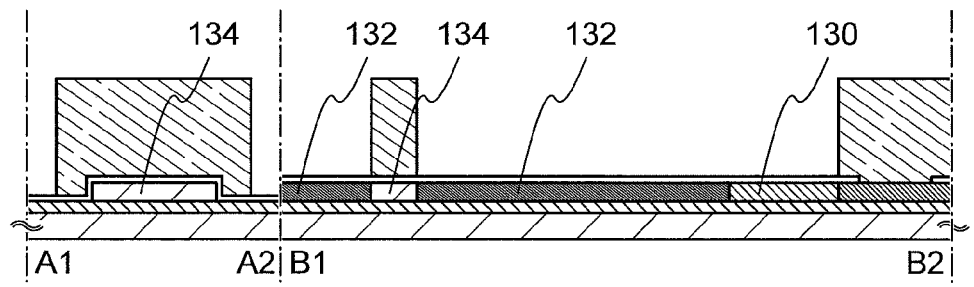
FIGS. 8A to 8D are cross-sectional views relating to a manufacturing process of a semiconductor device.

Next, an impurity element imparting one conductivity type is added to the semiconductor layer with the use of the gate electrode 128a and the conductive layer 128b as masks, so that the channel formation region 134, the impurity regions 132, and the impurity region 130 are formed (see FIG. 8A). For example, an impurity element such as phosphorus (P) or arsenic (As) may be added in order to form an n-channel transistor; and an impurity element such as boron (B) or aluminum (Al) may be added in order to form a p-channel transistor. Here, the concentration of an impurity element to be added can be set as appropriate. In addition, after the impurity element is added, heat treatment for activation is performed. Here, the concentration of the impurity element in the impurity region is increased in the following order: the impurity region 126, the impurity region 132, and the impurity region 130.

Figure 8B:
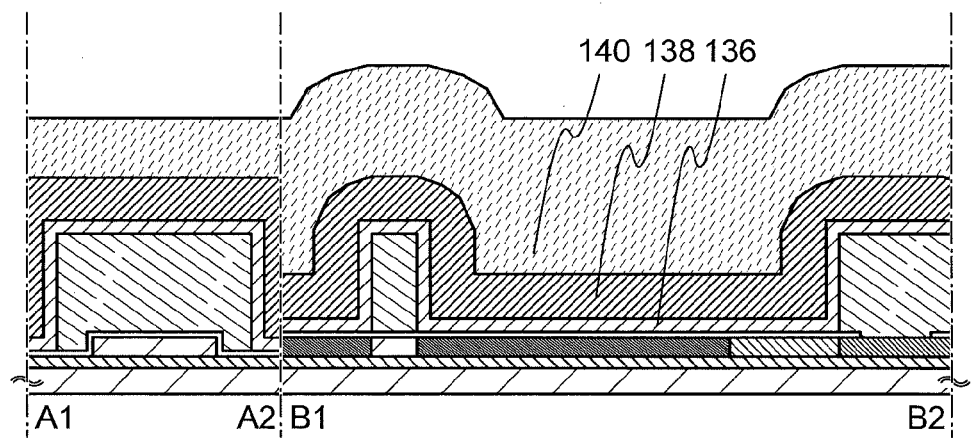

Next, the insulating layer 136, the insulating layer 138, and the insulating layer 140 are formed so as to cover the gate insulating layer 122a, the gate electrode 128a, and the conductive layer 128b (see FIG. 8B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. The insulating layer 136, the insulating layer 138, and the insulating layer 140 are particularly preferably formed using a low dielectric constant (low-k) material, because capacitance due to overlapping electrodes or wirings can be sufficiently reduced. Note that the insulating layer 136, the insulating layer 138, and the insulating layer 140 may be porous insulating layers formed using any of these materials. Since the porous insulating layer has low dielectric constant as compared to a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 will be described. A stacked-layer structure of the insulating layer 136, the insulating layer 138, and the insulating layer 140 is employed here; however, one embodiment of the disclosed invention is not limited to this. A single-layer structure, a stacked-layer structure of two layers, or a stacked-layer structure of four or more layers may also be used.

Figure 8C:
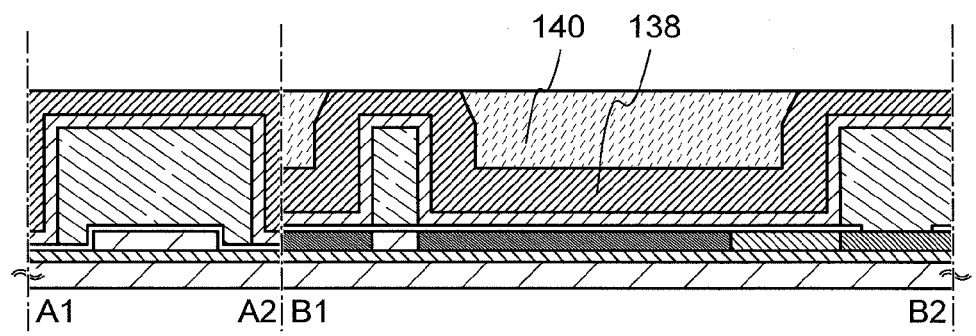

Next, the insulating layer 138 and the insulating layer 140 are subjected to chemical mechanical polishing (CMP) treatment, or etching treatment, so that the insulating layer 138 and the insulating layer 140 are flattened (see FIG. 8C). Here, CMP treatment is performed until the insulating layer 138 is partly exposed. When silicon nitride oxide is used for the insulating layer 138 and silicon oxide is used for the insulating layer 140, the insulating layer 138 functions as an etching stopper.

Figure 8D:
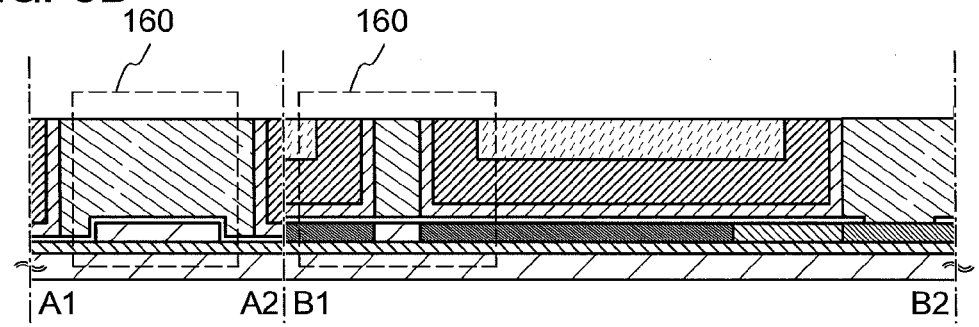

Next, the insulating layer 138 and the insulating layer 140 are subjected to CMP treatment, or etching treatment, so that upper surfaces of the gate electrode 128a and the conductive layer 128b are exposed (see FIG. 8D). Here, etching is performed until the gate electrode 128a and the conductive layer 128b are partly exposed. For the etching treatment, dry etching is preferably performed, but wet etching may be performed. In the step of partly exposing the gate electrode 128a and the conductive layer 128b, in order to improve the characteristics of the transistor 162 which is formed later, the surfaces of the insulating layer 136, the insulating layer 138, and the insulating layer 140 are preferably flattened as much as possible.

Through the above steps, the transistor 160 in the lower portion can be formed (see FIG. 8D).

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, whereby a highly integrated semiconductor device can be provided.

<Method for Manufacturing Upper Transistor>

Next, a method for forming the transistor 162 in the upper portion is described with reference to FIGS. 9A to 9D and FIGS. 10A to 10C.

Figure 9A:
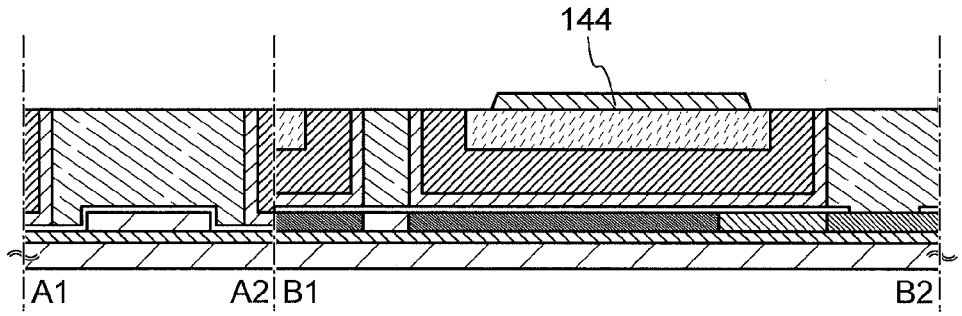
FIGS. 9A to 9D are cross-sectional views relating to a manufacturing process of a semiconductor device.

First, an oxide semiconductor layer is formed over the gate electrode 128a, the conductive layer 128b, the insulating layer 136, the insulating layer 138, the insulating layer 140, and the like and is processed, so that the oxide semiconductor layer 144 is formed (see FIG. 9A). Note that an insulating layer functioning as a base may be formed over the insulating layer 136, the insulating layer 138, and the insulating layer 140 before the oxide semiconductor layer is formed. The insulating layer can be formed by a PVD method such as a sputtering method, or a CVD method such as a plasma CVD method.

As a material used for the oxide semiconductor layer, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like can be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based material may contain an element other than In, Ga, and Zn.

As the oxide semiconductor layer, a thin film using a material represented by the chemical formula, $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

The thickness of the oxide semiconductor layer is preferably greater than or equal to 3 nm and less than or equal to 30 nm. This is because the transistor might possibly be normally on when the oxide semiconductor layer is too thick (e.g., the thickness is 50 nm or more).

The oxide semiconductor layer is preferably formed by a method in which impurities such as hydrogen, water, a hydroxyl group, or hydride do not enter the oxide semiconductor layer. For example, a sputtering method can be used.

In this embodiment, the oxide semiconductor layer is formed by a sputtering method with the use of an In—Ga—Zn—O-based oxide target.

As the In—Ga—Zn—O-based oxide target, for example, an oxide target having a composition ratio of $In_2O_3:Ga_2O_3:ZnO=1:1:1$ [molar ratio] can be used. Note that it is not necessary to limit the material and the composition ratio of the target to the above. For example, an oxide target having a composition ratio of $In_2O_3:Ga_2O_3:ZnO=1:1:2$ [molar ratio] can be used.

In the case where an In—Zn—O-based material referred to as IZO is used, a target therefor has a composition ratio of In:Zn=50:1 to 1:2 in an atomic ratio ($In_2O_3:ZnO=25:1$ to 1:4 in a molar ratio), preferably, In:Zn=20:1 to 1:1 in an atomic ratio ($In_2O_3:ZnO=10:1$ to 1:2 in a molar ratio), further preferably, In:Zn=15:1 to 1.5:1 in an atomic ratio ($In_2O_3:ZnO=15:2$ to 3:4 in a molar ratio). For example, in a target used for formation of an In—Zn—O-based oxide semiconductor which has an atomic ratio of In:Zn:O=Y:Z, the relation of Z>1.5X+Y is satisfied.

Further, in the case where an In—Sn—Zn-based oxide referred to as ITZO is formed, an oxide target which has a composition ration of In:Sn:Zn=1:2:2, 2:1:3, 1:1:1, 20:45:35, or the like in an atomic ratio is used.

The filling rate of the oxide target is higher than or equal to 90% and lower than or equal to 100%, preferably, higher than or equal to 95% and lower than or equal to 99.9%. With the use of the metal oxide target with a high filling rate, a dense oxide semiconductor layer can be formed.

The deposition atmosphere may be a rare gas (typically argon) atmosphere, an oxygen atmosphere, or a mixed atmosphere containing a rare gas and oxygen. An atmosphere of a high-purity gas from which an impurity such as hydrogen, water, a hydroxyl group, or hydride is removed is preferable, in order to prevent hydrogen, water, a hydroxyl group, hydride, or the like from entering the oxide semiconductor layer.

For example, the oxide semiconductor layer can be formed as follows.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas in which impurities such as hydrogen, water, a hydroxyl group, or hydride are sufficiently removed is introduced into the deposition chamber from which remaining moisture is being removed, and the oxide semiconductor layer is formed over the substrate with the use of the target. To remove moisture remaining in the deposition chamber, an entrapment vacuum pump such as a cryopump, an ion pump, or a titanium sublimation pump is desirably used. Further, an evacuation unit may be a turbo pump provided with a cold trap. In the deposition chamber which is evacuated with the cryopump, for example, impurities such as hydrogen, water, a hydroxyl group, or hydride (preferably, also a compound containing a carbon atom) or the like are removed, whereby the concentration of impurities such as hydrogen, water, a hydroxyl group, or hydride in the oxide semiconductor layer formed in the deposition chamber can be reduced.

In the case where the substrate temperature is low (for example, 100° C. or lower) during deposition, a substance including a hydrogen atom may enter the oxide semiconductor; thus, it is preferable that the substrate be heated at a temperature in the above range. When the oxide semiconductor layer is formed with the substrate heated at the temperature, the substrate temperature is increased, so that hydrogen bonds are cut by heat and are less likely to be taken into the oxide semiconductor layer. Therefore, the oxide semiconductor layer is formed with the substrate heated at the temperature, whereby the concentration of impurities such as hydrogen, water, a hydroxyl group, or hydride in the oxide semiconductor layer can be sufficiently reduced. Moreover, damage due to sputtering can be reduced.

As an example of the film formation conditions, the following conditions can be employed: the distance between the substrate and the target is 60 mm, the pressure is 0.4 Pa, the direct-current (DC) power is 0.5 kW, the substrate temperature is 400° C., and the film formation atmosphere is an oxygen atmosphere (the proportion of the oxygen flow rate is 100%). Note that a pulse direct current power source is preferable because powder substances (also referred to as particles or dust) generated in deposition can be reduced and the film thickness can be uniform.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering refers to a method in which a voltage is applied to a substrate side to generate plasma in the vicinity of the substrate to modify a surface. Note that instead of argon, a gas of nitrogen, helium, oxygen or the like may be used.

The oxide semiconductor layer can be processed by being etched after a mask having a desired shape is formed over the oxide semiconductor layer. The mask can be formed by a method such as photolithography. Alternatively, the mask may be formed by a method such as an ink jet method. For the etching of the oxide semiconductor layer, either wet etching or dry etching may be employed. It is needless to say that both of them may be employed in combination.

After that, heat treatment (first heat treatment) may be performed on the oxide semiconductor layer 144. The heat treatment eliminates substances including hydrogen atoms in the oxide semiconductor layer 144; thus, a structure of the oxide semiconductor layer 144 can be improved and defect levels in energy gap can be reduced. The heat treatment is performed under an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

The heat treatment can be performed in such a way that, for example, an object to be heated is introduced into an electric furnace in which a resistance heating element or the like is used and heated at 450° C. for one hour under a nitrogen atmosphere. The oxide semiconductor layer 144 is not exposed to the air during the heat treatment so that entry of water and hydrogen can be prevented.

The impurities are reduced by the heat treatment, whereby an i-type (intrinsic) or substantially i-type oxide semiconductor layer is formed. Accordingly, a transistor having extremely excellent characteristics can be realized.

The above heat treatment has an effect of removing hydrogen, water, and the like and can be referred to as dehydration treatment, dehydrogenation treatment, or the like. The heat treatment can be performed at the timing, for example, before the oxide semiconductor layer is processed to have an island shape, after the gate insulating film is formed, or the like. Such dehydration treatment or dehydrogenation treatment may be conducted once or plural times.

Figure 9B:
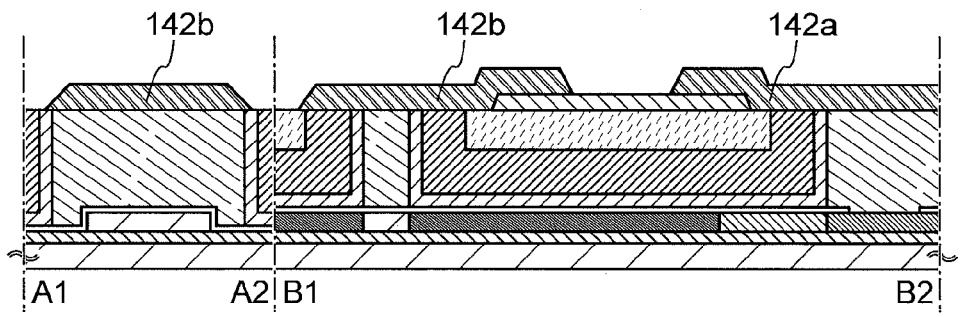

Next, a conductive layer to be a source electrode and a drain electrode (including a wiring formed using the same layer as the source electrode and the drain electrode) is formed over the oxide semiconductor layer 144 and the like and is processed, so that the source and drain electrodes 142a and 142b are formed (see FIG. 9B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the source electrode 142a and the drain electrode 142b having tapered shapes.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that end portions of the source electrode 142a and the drain electrode 142b that are to be formed are tapered. Here, a taper angle is, for example, preferably greater than or equal to 30° and less than or equal to 60°. The etching is performed so that the end portions of the source electrode 142a and the drain electrode 142b are tapered, whereby coverage with the gate insulating layer 146 formed later can be improved and disconnection can be prevented.

The channel length (L) of the transistor in the upper portion is determined by the distance between a lower end portion of the source electrode 142a and a lower end portion of the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure with extreme ultraviolet light, the resolution is high and the focus depth is large. For these reasons, the channel length (L) of the transistor to be formed later can be in the range of greater than or equal to 10 nm and less than or equal to 1000 nm (1 µm), and the circuit can operate at higher speed. Moreover, miniaturization can lead to low power consumption of a semiconductor device.

Figure 9C:
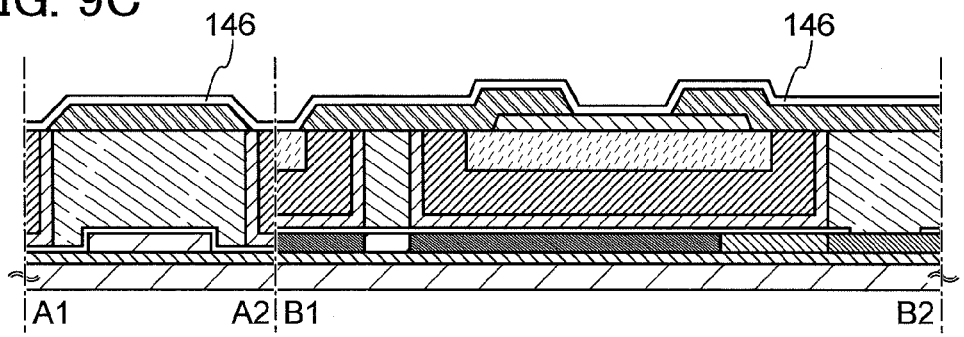

Next, the gate insulating layer 146 is formed so as to cover the source and drain electrodes 142a and 142b and to be in contact with part of the oxide semiconductor layer 144 (see FIG. 9C).

The gate insulating layer 146 can be formed by a CVD method, a sputtering method, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a stacked-layer structure in which these elements are combined. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as in the above description, a problem of gate leakage due to a tunnel effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. By using a high-k material for the gate insulating layer 146, electrical characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

Further, the insulating layer in contact with the oxide semiconductor layer 144 (in this embodiment, the gate insulating layer 146) may be an insulating material containing a Group 13 element and oxygen. There are a great number of materials containing a Group 13 element among oxide semiconductor materials, and an insulating material containing a Group 13 element has a good compatibility with an oxide semiconductor. By using an insulating material containing a Group 13 element for the insulating layer in contact with the oxide semiconductor layer, an interface with the oxide semiconductor layer can keep a favorable state.

An insulating material containing a Group 13 element refers to an insulating material containing one or more Group 13 elements. As the insulating material containing a Group 13 element, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in forming a gate insulating layer in contact with an oxide semiconductor layer containing gallium, a material containing gallium oxide may be used as a gate insulating layer, so that favorable characteristics can be kept at the interface between the oxide semiconductor layer and the gate insulating layer. When the oxide semiconductor layer and the insulating layer containing gallium oxide are provided in contact with each other, pileup of hydrogen at the interface between the oxide semiconductor layer and the insulating layer can be reduced, for example. Note that a similar effect can be obtained in the case where an element belonging to the same group as a constituent element of the oxide semiconductor is used for the insulating layer. For example, it is effective to form an insulating layer with the use of a material containing an aluminum oxide. Note that aluminum oxide has a property of not easily transmitting water. Thus, it is preferable to use a material containing an aluminum oxide in terms of preventing entry of water to the oxide semiconductor layer.

The insulating material of the insulating layer in contact with the oxide semiconductor layer 144 preferably contains oxygen in a proportion higher than that in the stoichiometric composition, by heat treatment under an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in a case where the insulating layer in contact with the oxide semiconductor layer 144 is formed of gallium oxide, the composition of gallium oxide can be set to be $Ga_2O_X$ ($X=3+\alpha$, $0<\alpha<1$) by heat treatment under an oxygen atmosphere or oxygen doping. In a case where the insulating layer in contact with the oxide semiconductor layer 144 is formed of aluminum oxide, the composition of aluminum oxide can be set to be $Al_2O_X$ ($X=3+\alpha$, $0<\alpha<1$) by heat treatment under an oxygen atmosphere or oxygen doping. In a case where the insulating layer in contact with the oxide semiconductor layer 144 is formed of gallium aluminum oxide (or aluminum gallium oxide), the composition of gallium aluminum oxide (or aluminum gallium oxide) can be set to be $Ga_XAl_{2-X}O_{3+\alpha}$ ($0<X<2$, $0<\alpha<1$) by heat treatment under an oxygen atmosphere or oxygen doping.

By oxygen doping or the like, an insulating layer which includes a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen deficiency in the oxide semiconductor layer or at the interface between the oxide semiconductor layer and the insulating layer is reduced.

Thus, the oxide semiconductor layer can be an i-type or substantially i-type oxide semiconductor.

The insulating layer which includes a region where the proportion of oxygen is higher than that in the stoichiometric composition may be applied to the insulating layer serving as a base film of the oxide semiconductor layer 144 instead of the gate insulating layer 146, or both the gate insulating layer 146 and the base insulating layer.

After the gate insulating layer 146 is formed, second heat treatment is desirably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce variation in electric characteristics of the transistor. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that in this embodiment, the second heat treatment is performed after the gate insulating layer 146 is formed; however, the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, by employing at least one of the first heat treatment and the second heat treatment, the oxide semiconductor layer 144 can be purified so as to contain the substance including a hydrogen atom as little as possible.

Figure 9D:
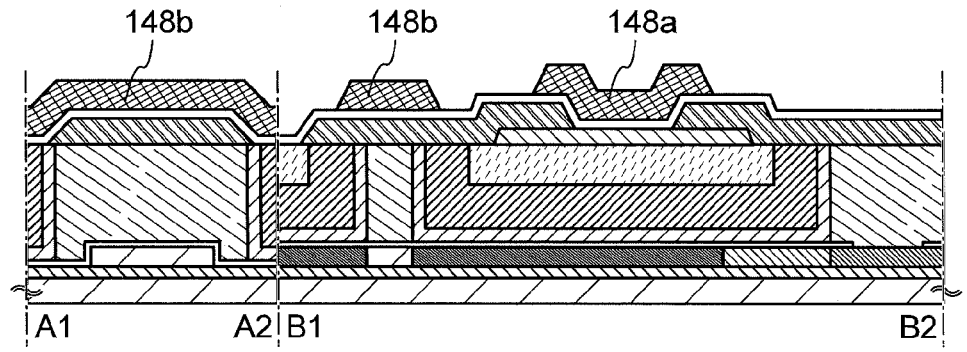

Next, a conductive layer used for forming a gate electrode (including a wiring formed using the same layer as the gate electrode) is formed and processed, so that the gate electrode 148a and the conductive layer 148b are formed (see FIG. 9D).

The gate electrode 148a and the conductive layer 148b can be formed using a metal material such as molybdenum, titanium, tantalum, tungsten, aluminum, copper, neodymium, or scandium, or an alloy material containing any of these materials as a main component. Note that the gate electrode 148a and the conductive layer 148b may have a single-layer structure or a stacked-layer structure.

Figure 10A:
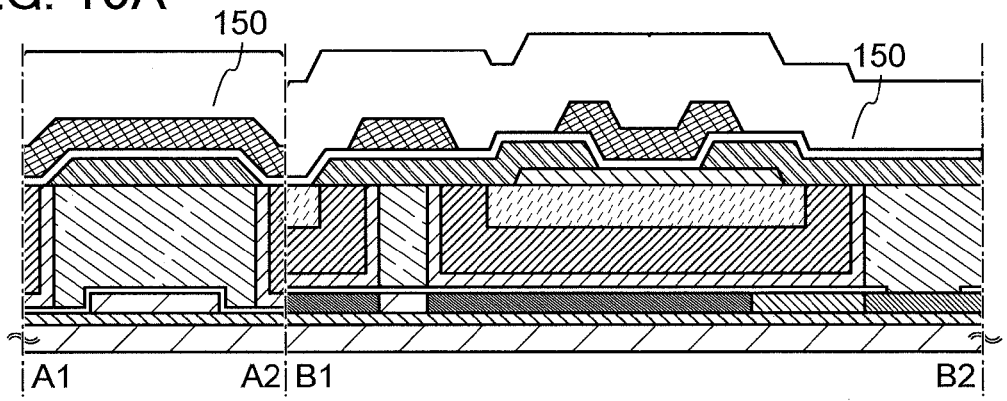
FIGS. 10A to 10C are cross-sectional views relating to a manufacturing process of a semiconductor device.

Next, the insulating layer 150 is formed over the gate insulating layer 146, the gate electrode 148a, and the conductive layer 148b (see FIG. 10A). The insulating layer 150 can be formed by a PVD method, a CVD method, or the like. The insulating layer 150 can be formed using a material including an inorganic insulating material such as silicon oxide, silicon oxynitride, silicon nitride, hafnium oxide, gallium oxide, or aluminum oxide. Note that for the insulating layer 150, a material with a low dielectric constant may be preferably used or a structure with a low dielectric constant (e.g., a porous structure) may be preferably employed. This is because by reducing the dielectric constant of the insulating layer 150, capacitance between wirings and electrodes can be reduced, which will increase operation speed. Note that although the insulating layer 150 has a single-layer structure in this embodiment, one embodiment of the disclosed invention is not limited to this. The insulating layer 150 may have a stacked structure including two or more layers.

Next, an opening reaching the source electrode 142a is formed in the gate insulating layer 146 and the insulating layer 150. Then, the wiring 154 connected to the source electrode 142a is formed over the insulating layer 150 (see FIG. 10B). The opening is formed by selective etching using a mask or the like.

A conductive layer is formed by a PVD method or a CVD method and then is patterned, so that the wiring 154 is formed. As a material for the conductive layer, an element selected from aluminum, chromium, copper, tantalum, titanium, molybdenum, and tungsten; an alloy containing any of these elements as a component; or the like can be used. Any one of manganese, magnesium, zirconium, beryllium, neodymium, and scandium or a material including any of these in combination may be used.

Specifically, it is possible to employ a method, for example, in which a thin titanium film is formed in a region including the opening of the insulating layer 150 by a PVD method and a thin titanium nitride film (about 5 nm) is formed by a PVD method, and then, an aluminum film is formed so as to be embedded in the opening. Here, the titanium film formed by a PVD method has a function of reducing an oxide film (such as a native oxide film) over which the titanium film is to be formed, and thereby lowering contact resistance with lower electrodes or the like (the source electrode 142a here). In addition, hillock of the aluminum film can be prevented. A copper film may be formed by a plating method after the formation of the barrier film of titanium, titanium nitride, or the like.

The opening formed in the insulating layer 150 is preferably formed in a region overlapping with the conductive layer 128b. With the opening in such a region, the element area can be prevented from increasing due to contact regions of the electrodes Here, the case where a position where the impurity region 126 and the source electrode 142a are connected and a position where the source electrode 142a and the wiring 154 are connected overlap with each other without using the conductive layer 128b will be described. In this case, an opening (also referred to as a contact in a lower portion) is formed in the insulating layer 136, the insulating layer 138, and the insulating layer 140 that are formed over the impurity region 126, and the source electrode 142a is formed in the contact in the lower portion. After that, an opening (also referred to as a contact in an upper portion) is formed in a region overlapping with the contact in the lower portion in the gate insulating layer 146 and the insulating layer 150, and then the wiring 154 is formed. When the contact in the upper portion is formed in the region overlapping with the contact in the lower portion, the source electrode 142a formed in the contact in the lower portion by etching might be disconnected. When the contacts in the lower portion and in the upper portion are formed so as not to overlap with each other in order to avoid the disconnection, an increase in the element area is caused.

As described in this embodiment, with the use of the conductive layer 128b, the contact in the upper portion can be formed without disconnection of the source electrode 142a. Thus, the contact in the lower portion and in the upper portion can be formed overlapping with each other, so that the element area can be prevented from increasing due to contact regions of the electrodes. In other words, the degree of integration of the semiconductor device can be increased.

Figure 10B:
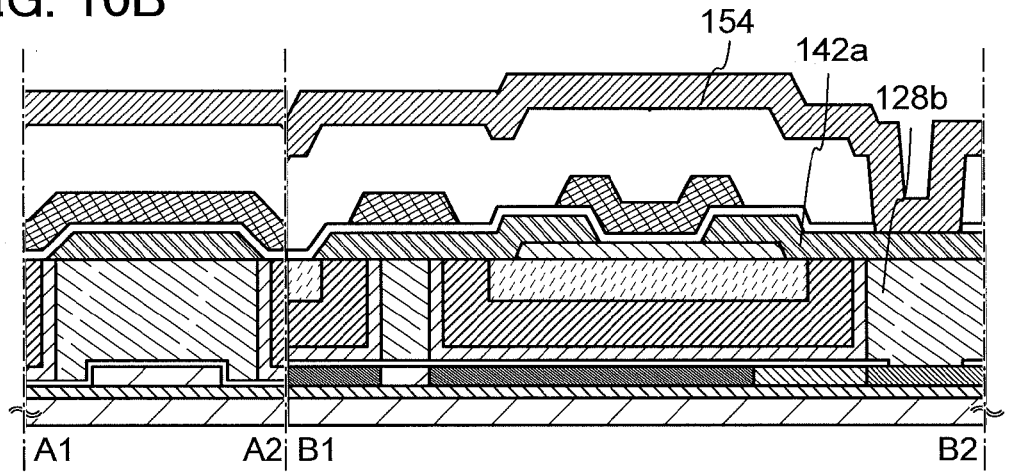
Figure 10C:
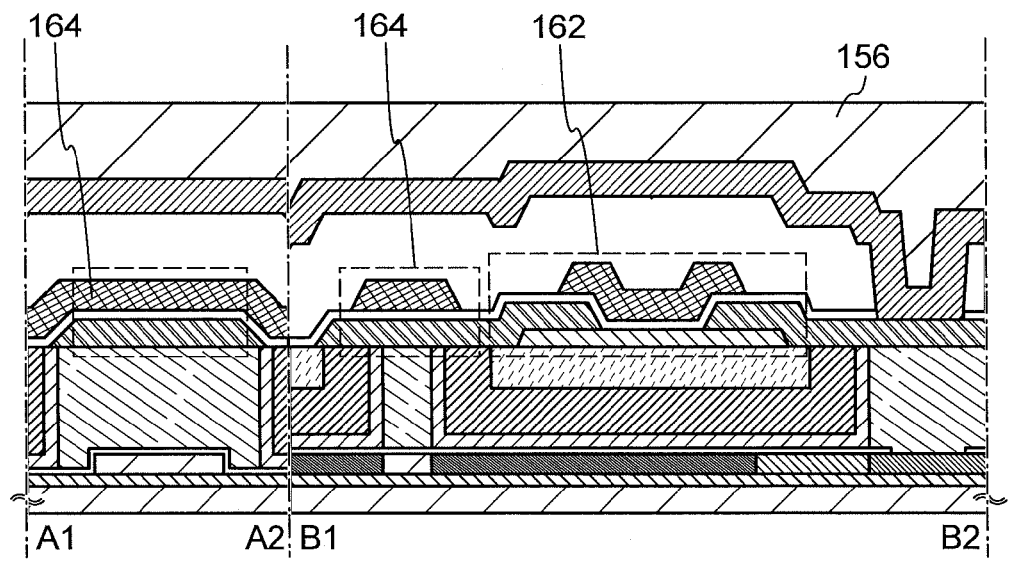

Next, the insulating layer 156 is formed so as to cover the wiring 154 (see FIG. 10C).

Through the above process, the transistor 162 and the capacitor 164 including the purified oxide semiconductor layer 144 are completed (see FIG. 10C).

Figure 11A:
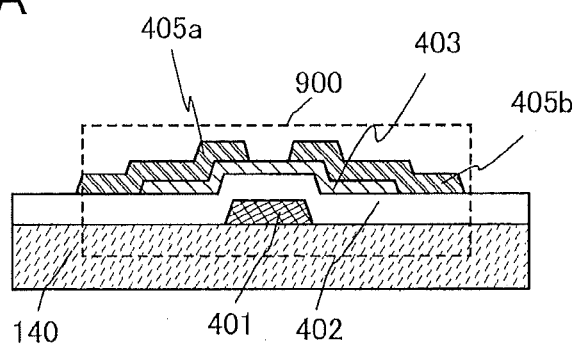
FIGS. 11A to 11C are cross-sectional views each illustrating a semiconductor device according to one embodiment of the present invention.
Figure 11B:
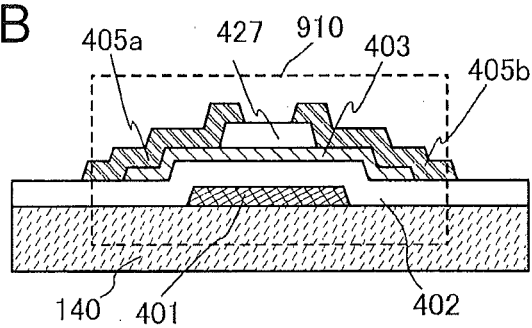
Figure 11C:
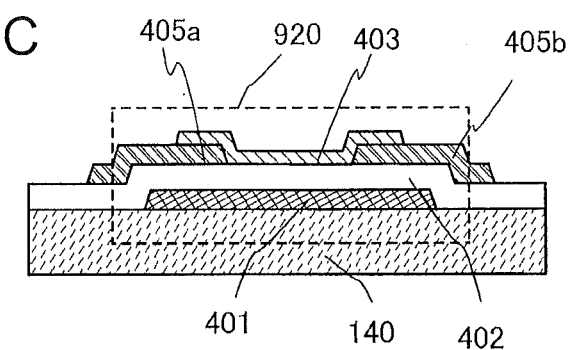

A top-gate structure is employed as the structure of the transistor 162 illustrated in FIGS. 10A and 10B; however, one embodiment of the present invention is not limited thereto, and a bottom gate structure may be employed. FIGS. 11A to 11C illustrate examples of a bottom-gate structure.

In a transistor 900 illustrated in FIG. 11A, a gate insulating layer 402 is provided over the gate electrode 401, an oxide semiconductor layer 403 is provided over the gate insulating layer 402, and a source electrode 405a and a drain electrode 405b which are connected to the oxide semiconductor layer 403 are provided. Note that the gate electrode 401, the oxide semiconductor layer 403, the gate insulating layer 402, the source electrode 405a, and the drain electrode 405b correspond to the gate electrode 148a, the oxide semiconductor layer 144, the gate insulating layer 146, the source electrode 142a, and the drain electrode 142b in FIGS. 10A to 10C, respectively.

A transistor 910 illustrated in FIG. 11B is the same as the transistor of FIG. 11A in that the gate electrode 401, the gate insulating layer 402, the oxide semiconductor layer 403, the source electrode 405a, and the drain electrode 405b are provided. The transistor of FIG. 11B is different from the transistor of FIG. 11A in that an insulating layer 427 is provided in contact with the oxide semiconductor layer 403.

A transistor 920 illustrated in FIG. 11C is the same as the transistor of FIG. 11A in that the gate electrode 401, the gate insulating layer 402, the oxide semiconductor layer 403, the source electrode 405a, and the drain electrode 405b are provided. A difference between the transistor 920 in FIG. 11C and the transistor 900 in FIG. 11A is positions where the source electrode 405a and the drain electrode 405b are in contact with the oxide semiconductor layer 403. In other words, the source electrode 405a and the drain electrode 405b are provided over and in contact with the oxide semiconductor layer 403 in the transistor 900 illustrated in FIG. 11A, whereas the source electrode 405a and the drain electrode 405b are provided below and in contact with the oxide semiconductor layer 403 in the transistor 920 illustrated in FIG. 11C.

Figure 12A:
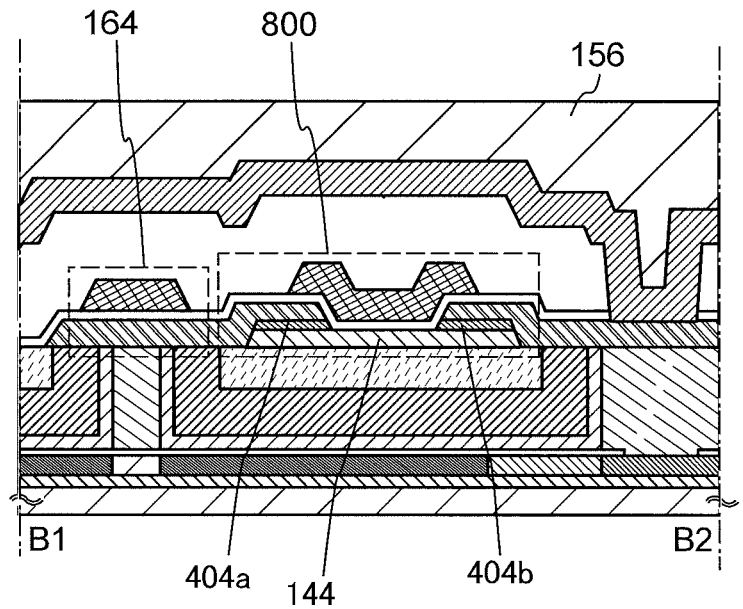
FIGS. 12A and 12B are cross-sectional views each illustrating a semiconductor device according to one embodiment of the present invention.
Figure 12B:
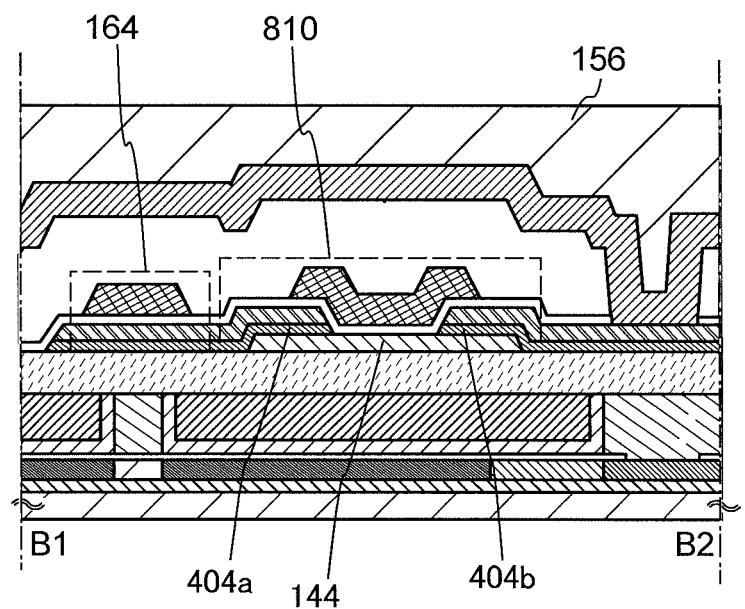

Note that oxide conductive layers serving as source and drain regions may be provided between the oxide semiconductor layer 144 and the source and drain electrodes 142a and 142b, as buffer layers in the transistor 162. FIGS. 12A and 12B illustrate a transistor 800 and a transistor 810, respectively, where oxide conductive layers are provided in the transistor 162 in FIG. 5A.

In each of the transistors 800 and 810 in FIGS. 12A and 12B, oxide conductive layers 404a and 404b serving as a source region and a drain region are provided between the oxide semiconductor layer 144 and the source electrode 142a and between the oxide semiconductor layer 144 and the drain electrode 142b. The shapes of the oxide conductive layers 404a and 404b are different between the transistors 800 and 810 of FIGS. 12A and 12B because of the difference between their manufacturing processes.

In the transistor 800 in FIG. 12A, a stack of an oxide semiconductor layer and an oxide conductive film is formed and processed by the same photolithography step, so that the oxide semiconductor layer 144 having an island shape and an oxide conductive film having an island shape are formed. The source electrode 142a and the drain electrode 142b are formed over the oxide semiconductor layer and the oxide conductive film, and then the island-shaped oxide conductive film is etched using the source electrode 142a and the drain electrode 142b as masks, so that the oxide conductive layer 404a and the oxide conductive layer 404b which serve as a source region and a drain region are formed.

In the transistor 810 in FIG. 12B, an oxide conductive film is formed over the oxide semiconductor layer 144, a metal conductive film is formed over the oxide conductive film, and the oxide conductive film and the metal conductive film are processed by the same photolithography step; thus, the oxide conductive layer 404a and the oxide conductive layer 404b which serve as a source region and a drain region, the source electrode 142a, and the drain electrode 142b are formed.

Note that when etching treatment for processing the oxide conductive layer is performed, etching conditions (e.g., type of etching agent, the concentration of an etching agent, and etching time) are adjusted as appropriate in order to prevent excessive etching of the oxide semiconductor layer.

As a method for forming the oxide conductive layer 404a and the oxide conductive layer 404b, a sputtering method, a vacuum evaporation method (such as an electron beam evaporation method), an arc discharge ion plating method, or a spray method is used. As a material for the oxide conductive layers, zinc oxide, zinc aluminum oxide, zinc aluminum oxynitride, zinc gallium oxide, or the like can be used. In addition, the above materials may include silicon oxide.

When the oxide conductive layers are provided between the oxide semiconductor layer 144 and the source and drain electrodes 142a and 142b as the source region and the drain region, the source region and the drain region can have lower resistance and the transistors 800 and 810 can operate at high speed.

With the structure including the oxide semiconductor layer 144, the oxide conductive layers 404a and 404b, and the source and drain electrodes 142a and 142b, the withstand voltage of the transistor 800 and the transistor 810 can be improved.

Since the oxide semiconductor layer 144 is highly purified in the transistor 162 illustrated in this embodiment, the hydrogen concentration is $5\times10^{19}$ atoms/cm$^3$ or lower, preferably $5\times10^{18}$ atoms/cm$^3$ or lower, further preferably $5\times10^{17}$ atoms/cm$^3$ or lower. In addition, the value of the carrier concentration of the oxide semiconductor layer 144 is sufficiently low (e.g., lower than $1\times10^{12}$/cm$^3$, preferably lower than $1.45\times10^{10}$/cm$^3$) in comparison with that of a general silicon wafer (approximately $1\times10^{14}$/cm$^3$). Accordingly, the off-state current is also sufficiently small. For example, the off-state current (here, current per micrometer (μm) of channel width) of the transistor 162 at room temperature (25° C.) is lower than or equal to 100 zA (1 zA (zeptoampere) is $1\times10^{-21}$ A), preferably lower than or equal to 10 zA.

In the transistor 162 described in this embodiment, the concentrations of sodium, lithium, and potassium contained in the oxide semiconductor layer 144 are respectively $5\times10^{16}$ cm$^{-3}$ or lower, preferably $1\times10^{16}$ cm$^{-3}$ or lower, further preferably $1\times10^{15}$ cm$^{-3}$ or lower; $5\times10^{15}$ cm$^{-3}$ or lower, preferably $1\times10^{15}$ cm$^{-3}$ or lower; and $5\times10^{15}$ cm$^{-3}$ or lower, preferably $1\times10^{15}$ cm$^{-3}$ or lower. Therefore, deterioration of transistor characteristics (e.g., the shift of a threshold value to the negative side (causing the transistor to be normally on) or a decrease in mobility) can be suppressed. In addition, variation in characteristics can be suppressed.

With the use of the highly purified intrinsic oxide semiconductor layer 144, the off-state current of the transistor can be sufficiently reduced easily. Further, by using such a transistor, a semiconductor device in which stored data can be held for an extremely long time can be obtained.

In addition, in the semiconductor device described in this embodiment, a wiring can be shared; thus, a semiconductor device with sufficiently increased degree of integration can be achieved.

Embodiment 4

One embodiment of the oxide semiconductor layer 144 which can be used as the semiconductor layer of the transistor 162 in Embodiment 3 will be described.

An oxide semiconductor to be used for the oxide semiconductor layer 144 preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component, in which there is no particular limitation on the ratio of In:Ga:Zn. The In—Ga—Zn-based oxide may contain a metal element other than the In, Ga, and Zn.

Alternatively, a material represented by InMO$_3$(ZnO)$_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, In$_3$SnO$_5$(ZnO)$_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that the average surface roughness ($R_a$) is obtained by expanding, into three dimensions, center line average roughness that is defined by JIS B 0601 so as to be applied to a surface. The $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[FORMULA 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

As a preferred embodiment of the oxide semiconductor, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase that has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 15A to 15E, FIGS. 16A to 16C, and FIGS. 17A to 17C. In FIGS. 15A to 15E, FIGS. 16A to 16C, and FIGS. 17A to 17C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 15A to 15E, O surrounded by a circle represents tetracoodianate O and O surrounded by a double circle represents tricoodenate O.

Figure 15A:
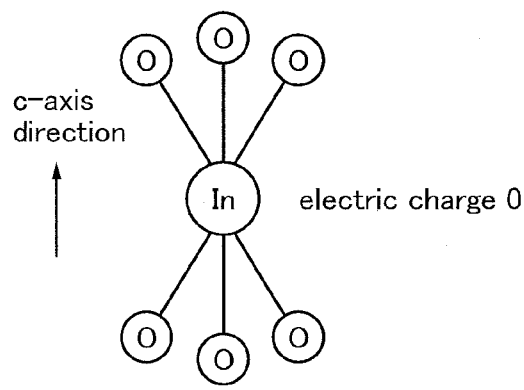
FIGS. 15A to 15E show crystal structures of oxide materials.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of an upper half and a lower half in FIG. 15A. In the small group illustrated in FIG. 15A, electric charge is 0.

Figure 15D:
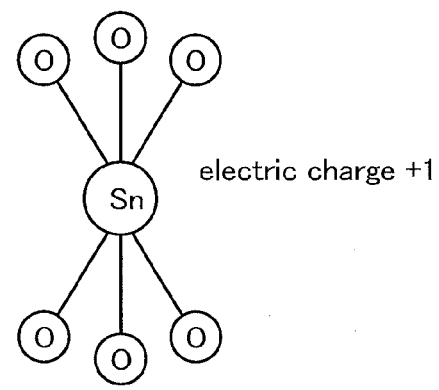
Figure 15B:
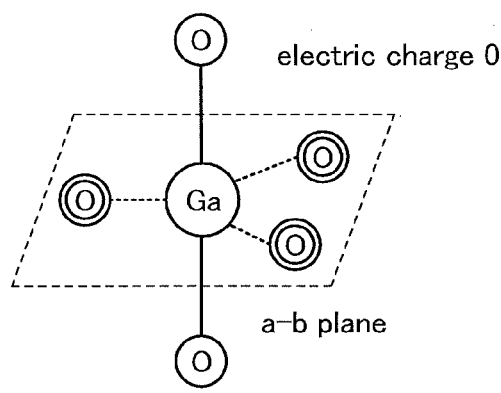

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 15B. An In atom can also have the structure illustrated in FIG. 15B because an In atom can have five ligands. In the small group illustrated in FIG. 15B, electric charge is 0.

Figure 15E:
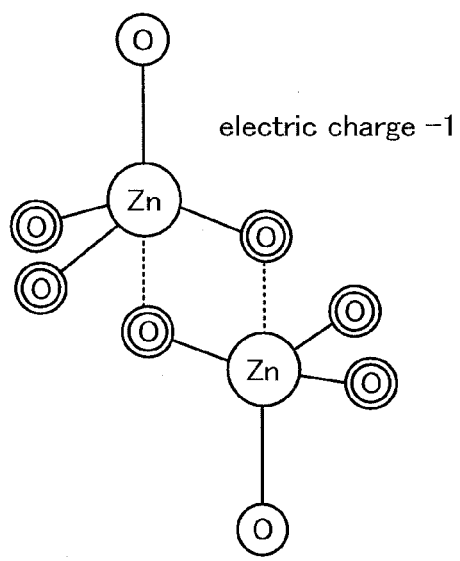
Figure 15C:
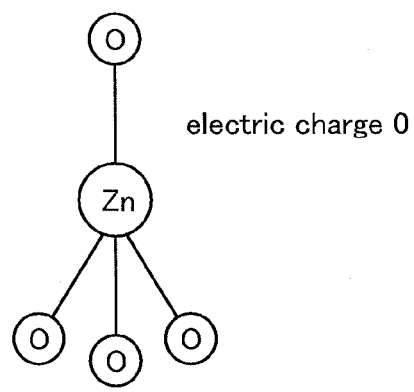

FIG. 15C illustrates a structure including one tetracoordinate Zn atom and four tetracoordinate O atoms proximate to the Zn atom. In FIG. 15C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 15C. In the small group illustrated in FIG. 15C, electric charge is 0.

FIG. 15D illustrates a structure including one hexacoordinate Sn atom and six tetracoordinate O atoms proximate to the Sn atom. In FIG. 15D, three tetracoordinate O atoms exist in each of an upper half and a lower half. In the small group illustrated in FIG. 15D, electric charge is +1.

FIG. 15E illustrates a small group including two Zn atoms. In FIG. 15E, one tetracoordinate O atom exists in each of an upper half and a lower half. In the small group illustrated in FIG. 15E, electric charge is −1.

Here, a plurality of small groups form a medium group, and a plurality of medium groups form a large group (also referred to as a unit cell).

The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. When the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 16A:
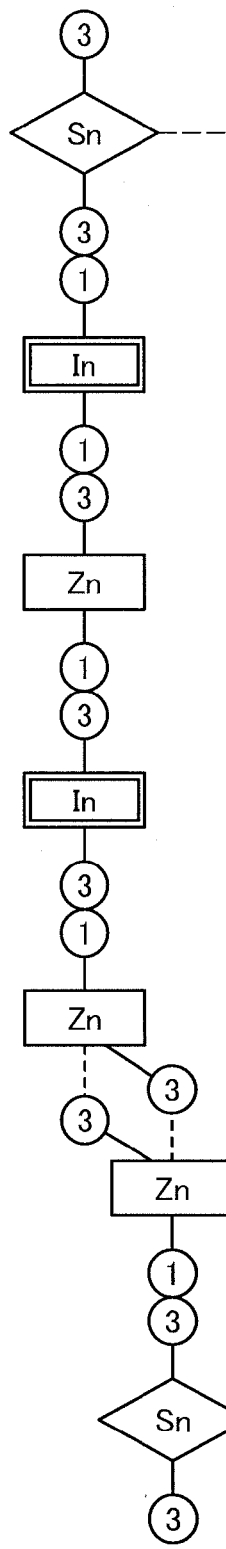
FIGS. 16A to 16C show crystal structures of oxide materials.
Figure 16B:
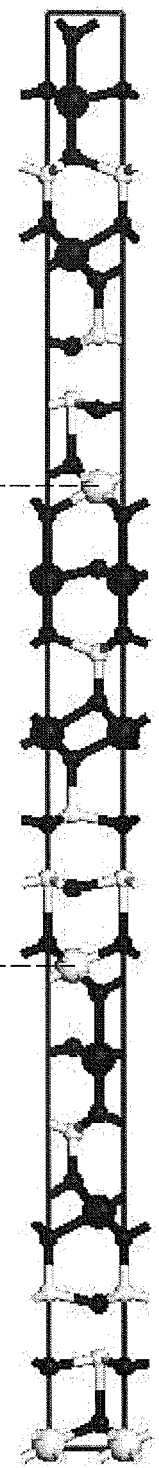
Figure 16C:
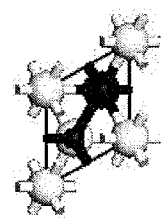

FIG. 16A illustrates a model of a medium group included in a layered structure of an In—Sn—Zn—O-based material. FIG. 16B illustrates a large group including three medium groups. Note that FIG. 16C illustrates an atomic arrangement in the case where the layered structure in FIG. 16B is observed from the c-axis direction.

In FIG. 16A, for simplicity, a tricoordinate O atom is omitted and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 16A, one tetracoordinate O atom existing in each of an upper half and a lower half with respect to an In atom is denoted by circled 1. FIG. 16A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 16A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracooridnate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 15E can be given. For example, with one small group including two Zn atoms, electric charge of one small group including a Sn atom can be cancelled, so that the total electric charge of the layered structure can be 0.

When the large group illustrated in FIG. 16B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 17A:
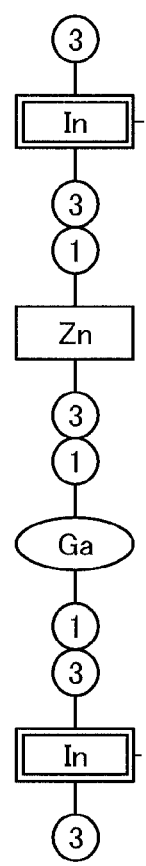
FIGS. 17A to 17C show crystal structures of oxide materials.

As an example, FIG. 17A illustrates a model of a medium group included in a layered structure of an In—Ga—Zn—O-based material.

In the medium group included in the layered structure of the In—Ga—Zn—O-based material in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 17B:
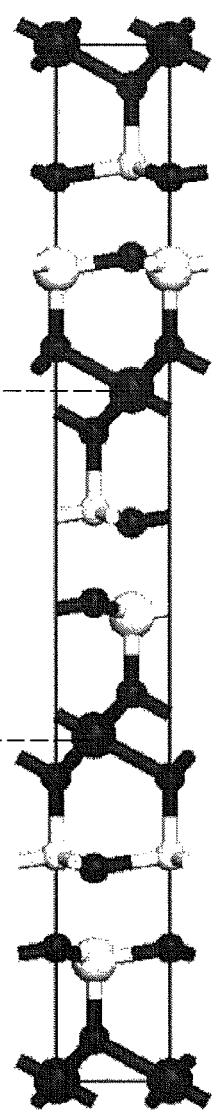
Figure 17C:
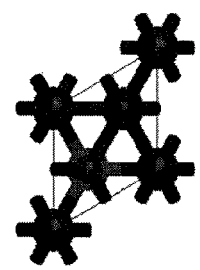

FIG. 17B illustrates a large group including three medium groups. Note that FIG. 17C illustrates an atomic arrangement in the case where the layered structure in FIG. 17B is observed from the c-axis direction.

Here, since electric charge of a (hexacoordinate or pentacoordinate) In atom, electric charge of a (tetracooridnate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 17A but also a medium group in which the arrangement of the In atom, the Ga atom, and the Zn atom is different from that in FIG. 17A.

The oxide semiconductor layer 144 of this embodiment has a structure including a first crystalline oxide semiconductor layer and a second crystalline oxide semiconductor layer which is stacked over the first crystalline oxide semiconductor layer and is thicker than the first crystalline oxide semiconductor layer.

An insulating layer 437 is formed over an insulating layer 140. In this embodiment, an oxide insulating layer with a thickness greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor film with a thickness greater than or equal to 1 nm and less than or equal to 10 nm is formed over the insulating layer 437. The first oxide semiconductor film is formed by a sputtering method, and the substrate temperature in the film formation by a sputtering method is set to be higher than or equal to 200° C. and lower than or equal to 400° C.

In this embodiment, the first oxide semiconductor film is formed to a thickness of 5 mu in an oxygen atmosphere, an argon atmosphere, or a mixed atmosphere of argon and oxygen under the following conditions: a target for an oxide semiconductor (a target for an In—Ga—Zn—O-based oxide semiconductor containing $In_2O_3$, $Ga_2O_3$, and ZnO at 1:1:2 [molar ratio]) is used; the distance between the substrate and the target is 170 mm; the substrate temperature is 250° C.; the pressure is 0.4 Pa; and the direct current (DC) power is 0.5 kW.

Figure 13A:
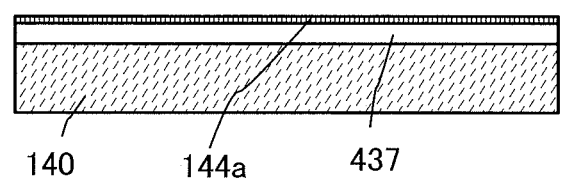
FIGS. 13A to 13C are cross-sectional views relating to a manufacturing process of a semiconductor device.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 144a is formed (see FIG. 13A).

Although it depends on the temperature of the first heat treatment, the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 144a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating layer or at the interface between the first crystalline oxide semiconductor layer 144a and the insulating layer 437 at an amount that exceeds at least the amount of oxygen in the stoichiometric composition ratio.

Next, a second oxide semiconductor film with a thickness more than 10 nm is formed over the first crystalline oxide semiconductor layer 144a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor layer formed over and in contact with the surface of the first crystalline oxide semiconductor layer and so-called orderliness can be obtained.

In this embodiment, the second oxide semiconductor film is formed to a thickness of 25 nm in an oxygen atmosphere, an argon atmosphere, or a mixed atmosphere of argon and oxygen under the following conditions: a target for an oxide semiconductor (a target for an In—Ga—Zn—O-based oxide semiconductor containing $In_2O_3$, $Ga_2O_3$, and ZnO at 1:1:2 [molar ratio]) is used; the distance between the substrate and the target is 170 mm; the substrate temperature is 400° C.; the pressure is 0.4 Pa; and the direct current (DC) power is 0.5 kW.

Figure 13B:
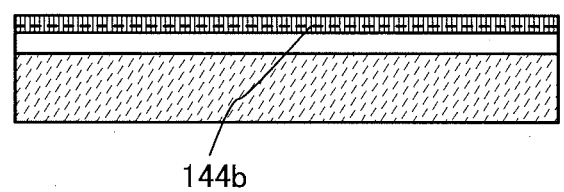

Next, second heat treatment is performed under a condition where the atmosphere of a chamber in which the substrate is set is an atmosphere of nitrogen or dry air. The temperature of the second heat treatment is higher than or equal to 400° C. and lower than or equal to 750° C. Through the second heat treatment, a second crystalline oxide semiconductor layer 144b is formed (see FIG. 13B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 144a as a nucleus, that is, crystal growth proceeds from the bottom to the inside; thus, the second crystalline oxide semiconductor layer 144b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 13C:
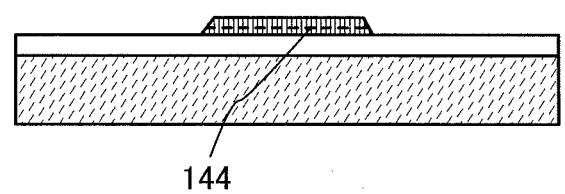

Next, the stack of the oxide semiconductor layers, the first crystalline oxide semiconductor layer 144*a* and the second crystalline oxide semiconductor layer 144*b*, is processed to form the oxide semiconductor layer 144 including a stack of island-shaped oxide semiconductor layers (see FIG. 13C). In the drawing, the interface between the first crystalline oxide semiconductor layer 144*a* and the second crystalline oxide semiconductor layer 144*b* is indicated by a dotted line, and the first crystalline oxide semiconductor layer 144*a* and the second crystalline oxide semiconductor layer 144*b* are illustrated as a stack of oxide semiconductor layers; however, the interface is actually not distinct and is illustrated for easy understanding.

The stacked layer of the oxide semiconductor films can be processed by etching after a mask having a desired shape is formed over the stacked layer of the oxide semiconductor films The mask can be formed by a method such as photolithography. Alternatively, the mask may be formed by a method such as an ink-jet method.

For the etching of the stacked layer of the oxide semiconductor films, either wet etching or dry etching may be employed. It is needless to say that both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer comprise an oxide including a crystal with c-axis alignment (also referred to as C-Axis Aligned Crystal (CAAC)), which has neither a single crystal structure nor an amorphous structure. The first crystalline oxide semiconductor layer and the second crystalline oxide semiconductor layer partly include a crystal grain boundary. In any case, in order to obtain CAAC, it is important to form hexagonal crystals at an initial stage of deposition of an oxide semiconductor film and to cause crystal growth from the hexagonal crystals as seeds. In order to achieve this, the substrate heating temperature is preferably higher than or equal to 100° C. and lower than or equal to 500° C., further preferably higher than or equal to 200° C. and lower than or equal to 400° C., still further preferably higher than or equal to 250° C. and lower than or equal to 300° C. In addition to this, the deposited oxide semiconductor film is subjected to heat treatment at a temperature higher than the substrate heating temperature in the deposition. Therefore, microdefects in the film and defects at the interface of a stacked layer can be compensated.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

The oxide semiconductor layer 144 including the stack of the oxide semiconductor layers formed by the above formation method can be used as appropriate for a transistor (e.g., the transistor 162 in Embodiment 1 and Embodiment 3 or the transistor 800 or 810 in Embodiment 3) which can be applied to a semiconductor device disclosed in this specification.

In the transistor 162 in Embodiment 3 in which the stack of the oxide semiconductor layers of this embodiment is used as the oxide semiconductor layer 144, an electric field is not applied from one surface to the other surface of the oxide semiconductor layer and current does not flow in the thickness direction (from one surface to the other surface; specifically, in the vertical direction in FIG. 5A) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 144, the transistor can have stable electric characteristics and high reliability.

This embodiment can be implemented in appropriate combination with the structures described in the other embodiments.

Embodiment 5

In this embodiment, the case where the semiconductor device described in any of the above embodiments is applied to an electronic device will be described with reference to FIGS. 14A to 14F. In this embodiment, examples of the electronic device to which the semiconductor device described in any of the above embodiments is applied include a computer, a mobile phone handset (also referred to as a mobile phone or a mobile phone device), a personal digital assistant (including a portable game machine, an audio reproducing device, and the like), a camera such as a digital camera or a digital video camera, an electronic paper, and a television device (also referred to as a television or a television receiver).

Figure 14A:
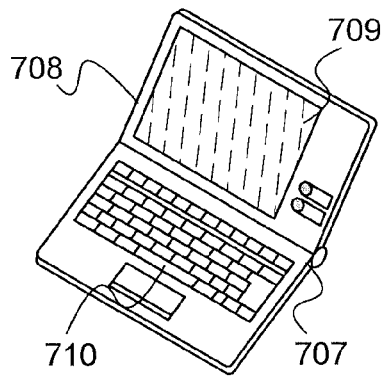
FIGS. 14A to 14F illustrate examples of electronic devices.

FIG. 14A illustrates a laptop computer including a housing 707, a housing 708, a display portion 709, a keyboard 710, and the like. At least one of the housing 707 and the housing 708 is provided with the semiconductor device described in any of the above embodiments. Therefore, a laptop computer with sufficiently low power consumption in which writing and reading of data can be performed at high speed and data can be stored for a long time can be realized.

Figure 14D:
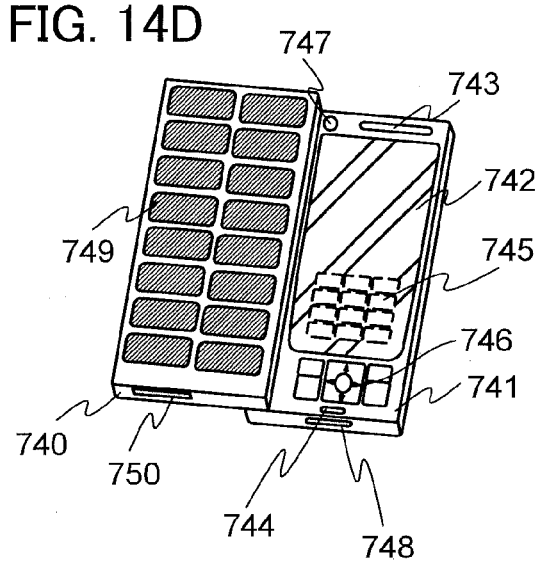
Figure 14B:
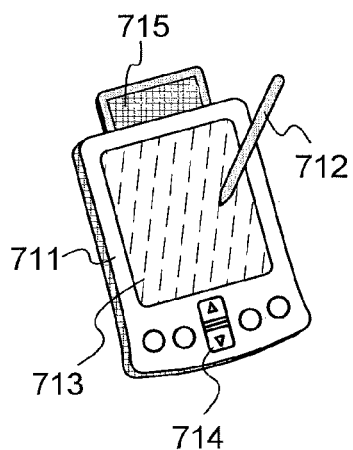

FIG. 14B is a portable information terminal (personal digital assistant (PDA)). A main body 711 is provided with a display portion 713, an external interface 715, operation buttons 714, and the like. Further, a stylus 712 and the like for operation of the portable information terminal are provided. In the main body 711, the semiconductor device described in any of the above embodiments is provided. Therefore, a portable information terminal with sufficiently low power consumption in which writing and reading of data can be performed at high speed and data can be stored for a long time can be realized.

Figure 14E:
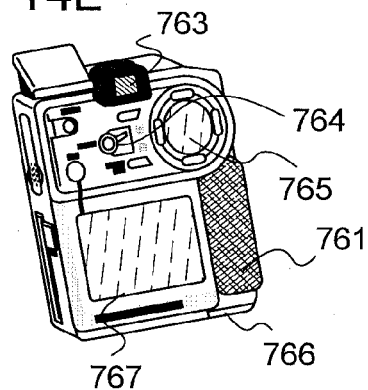
Figure 14C:
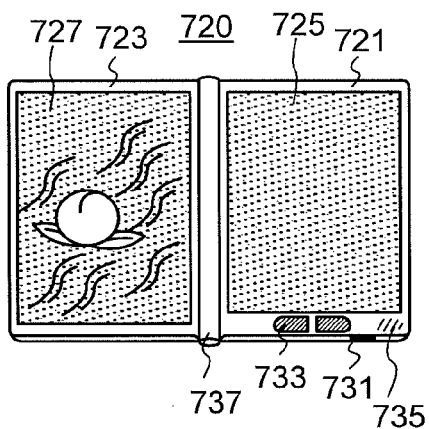

FIG. 14C illustrates an e-book reader including electronic paper. The e-book reader includes two housings 721 and 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. Thus, an e-book reader with sufficiently low power consumption in which writing and reading of data can be performed at high speed and data can be stored for a long time can be realized.

FIG. 14D is a mobile phone including two housings of a housing 740 and a housing 741. Further, the housing 740 and the housing 741 in a state where they are developed as illustrated in FIG. 14D can shift by sliding so that one is lapped over the other; therefore, the size of the mobile phone can be reduced, which makes the mobile phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone, an external memory slot 750, and the like. In addition, an antenna is incorporated in the housing 741. At least one of the housings 740 and 741 is provided with the semiconductor device described in any of the above embodiments. Therefore, a mobile phone in which writing and reading of data are performed at high speed, data is stored for a long time, and power consumption is sufficiently reduced can be realized.

FIG. 14E is a digital camera including a main body 761, a display portion 767, an eyepiece 763, an operation switch 764, a display portion 765, a battery 766, and the like. In the main body 761, the semiconductor device described in any of the above embodiments is provided. Thus, a digital camera with sufficiently low power consumption in which writing and reading of data can be performed at high speed and data can be stored for a long time can be realized.

Figure 14F:
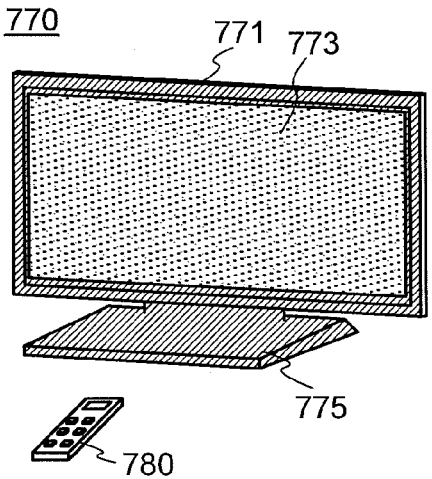

FIG. 14F is a television device including a housing 771, a display portion 773, a stand 775, and the like. A television device 770 can be operated with an operation switch of the housing 771 or a remote controller 780. The semiconductor device described in any of the above embodiments is mounted in the housing 771 and the remote controller 780. Thus, a television device with sufficiently low power consumption in which writing and reading of data can be performed at high speed and data can be stored for a long time can be realized.

As described above, the electronic devices described in this embodiment each include the semiconductor device described in the above embodiment; thus, electronic devices with low power consumption can be realized.

Embodiment 6

In this embodiment, an example of a transistor that can be applied to a semiconductor device disclosed in this specification will be described. In addition, calculation results of characteristics of the transistor will be described. The transistor described in this embodiment can be suitably used as the transistor 162 described in any of the above embodiments.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically. In view of this, the field-effect mobility of an ideal oxide semiconductor without defects inside the semiconductor is theoretically calculated and calculation results of characteristics of minute transistors which are manufactured using such an oxide semiconductor are shown in this embodiment.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \qquad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[FORMULA 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region is expressed as the following formula.

$$I_d = \frac{W \mu V_g V_d C_{ox}}{L} \exp\left(-\frac{E}{kT}\right) \qquad \text{[FORMULA 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} \qquad \text{[FORMULA 5]}$$
$$= \ln\left(\frac{W \mu V_d C_{ox}}{L}\right) - \frac{e^3 N^2 t}{8 k T \varepsilon C_{ox} V_g}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$–$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 40 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{l}\right) \qquad [\text{FORMULA 6}]$$

Here, D represents the electric field in the gate direction, and B and l are constants. B and l can be obtained from actual measurement results; according to the above measurement results, B is 4.75×10⁷ cm/s and l is 10 nm (the depth to which the influence of interface scattering reaches). When D is increased (i.e., when the gate voltage is increased), the second term of Formula 6 is increased and accordingly the mobility $\mu_1$ is decreased.

Figure 18:
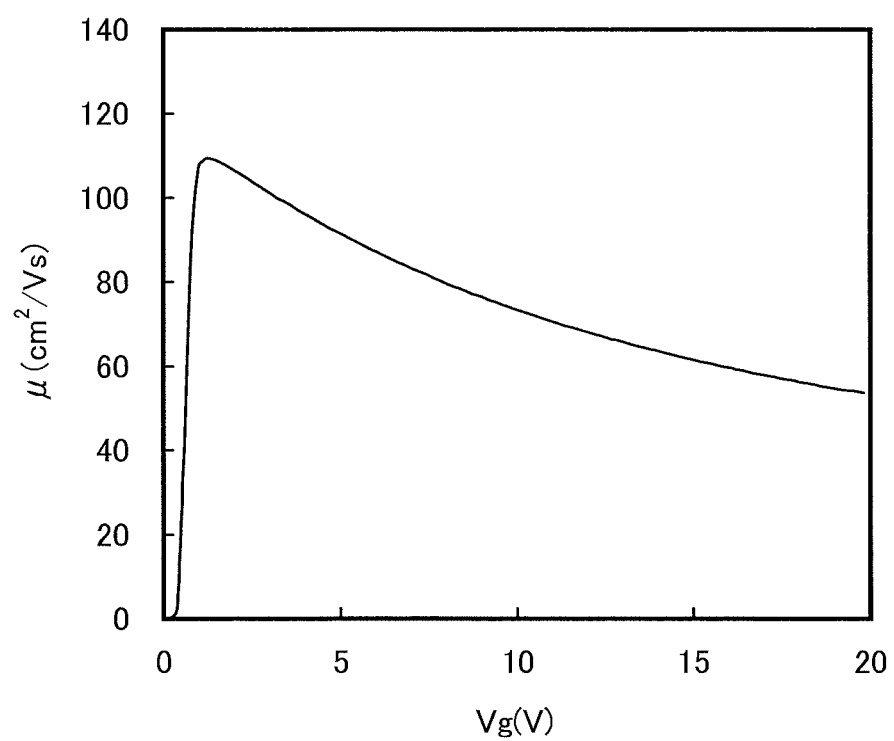
FIG. 18 shows gate voltage dependence of mobility obtained by calculation.

Calculation results of the mobility $\mu_2$ of a transistor whose channel includes an ideal oxide semiconductor without a defect inside the semiconductor are shown in FIG. 18. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 18, the mobility has a peak of more than 100 cm²/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 19A to 19C, FIGS. 20A to 20C, and FIGS. 21A to 21C. FIGS. 22A and 22B illustrate cross-sectional structures of the transistors used for the calculation. The transistors illustrated in FIGS. 22A and 22B each include a semiconductor region 8103a and a semiconductor region 8103c which have n⁺-type conductivity in an oxide semiconductor layer. The resistivities of the semiconductor region 8103a and the semiconductor region 8103c are 2×10⁻³ Ωcm.

The transistor illustrated in FIG. 22A is formed over a base insulating layer 8101 and an embedded insulator 8102 which is embedded in the base insulating layer 8101 and formed of aluminum oxide. The transistor includes the semiconductor region 8103a, the semiconductor region 8103c, an intrinsic semiconductor region 8103b serving as a channel formation region therebetween, and a gate 8105.

A gate insulating layer 8104 is formed between the gate 8105 and the semiconductor region 8103b. In addition, a sidewall insulator 8106a and a sidewall insulator 8106b are formed on both side surfaces of the gate 8105, and an insulator 8107 is formed over the gate 8105 so as to prevent a short circuit between the gate 8105 and another wiring. The sidewall insulator has a width of 5 nm. A source 8108a and a drain 8108b are provided in contact with the semiconductor region 8103a and the semiconductor region 8103c, respectively. Note that the channel width of this transistor is 40 nm.

The transistor of FIG. 22B is the same as the transistor of FIG. 22A in that it is formed over the base insulating layer 8101 and the embedded insulator 8102 formed of aluminum oxide and that it includes the semiconductor region 8103a, the semiconductor region 8103c, the intrinsic semiconductor region 8103b provided therebetween, the gate 8105 having a width of 33 nm, the gate insulating layer 8104, the sidewall insulator 8106a, the sidewall insulator 8106b, the insulator 8107, the source 8108a, and the drain 8108b.

The transistor illustrated in FIG. 22A is different from the transistor illustrated in FIG. 22B in the conductivity type of semiconductor regions under the sidewall insulator 8106a and the sidewall insulator 8106b. In the transistor illustrated in FIG. 22A, the semiconductor regions under the sidewall insulator 8106a and the sidewall insulator 8106b are part of the semiconductor region 8103a and the semiconductor region 8103c having n⁺-type conductivity, whereas in the transistor illustrated in FIG. 22B, the semiconductor regions under the sidewall insulator 8106a and the sidewall insulator 8106b are part of the intrinsic semiconductor region 8103b. In other words, in the semiconductor layer of FIG. 22B, a region having a width of $L_{off}$ which overlaps with neither the semiconductor region 8103a (the semiconductor region 8103c) nor the gate 8105 is provided. This region is called an offset region, and the width $L_{off}$ is called an offset length. As is seen from the drawing, the offset length is equal to the width of the sidewall insulator 8106a (the sidewall insulator 8106b).

Figure 19A:
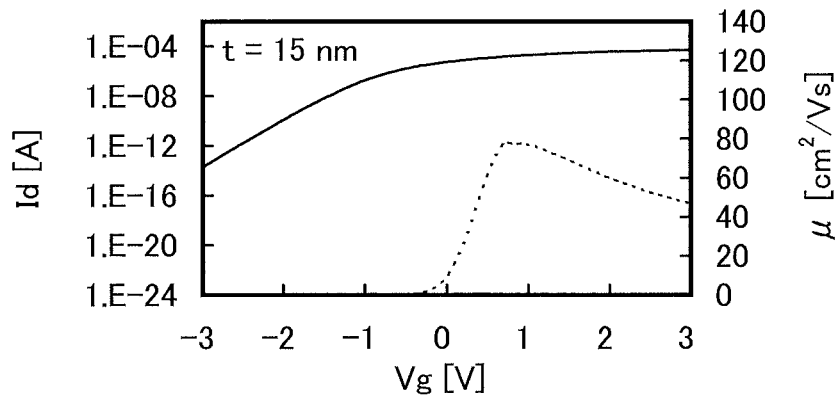
FIGS. 19A to 19C show gate voltage dependence of drain current and mobility obtained by calculation.
Figure 19B:
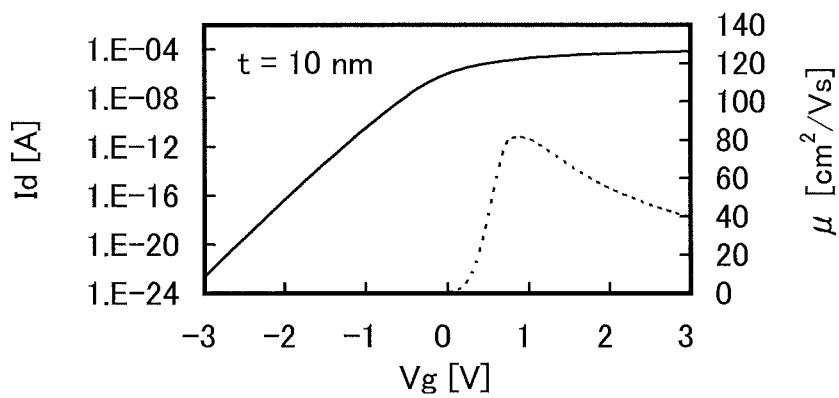
Figure 19C:
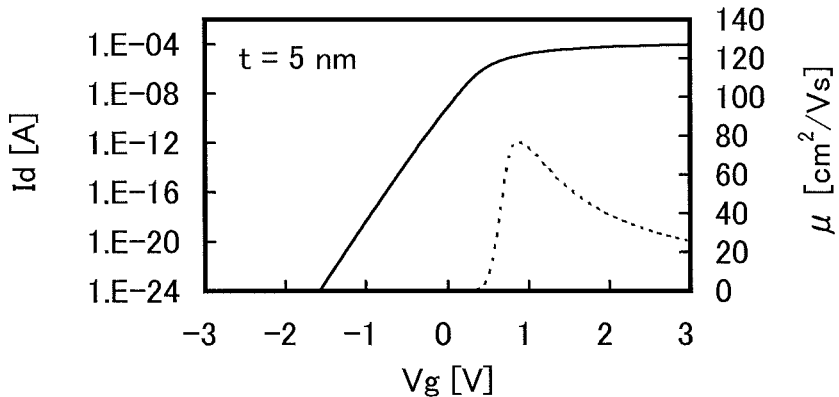

The other parameters used in calculation are as described above. For the calculation, device simulation software Sentaurus Device manufactured by Synopsys, Inc. was used. FIGS. 19A to 19C show the gate voltage ($V_g$: a potential difference between the gate and the source) dependence of the drain current ($I_d$, a solid line) and the mobility (μ, a dotted line) of the transistor having the structure illustrated in FIG. 22A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 19A shows the gate voltage dependence of the transistor in the case where the thickness of the gate insulating layer is 15 nm, FIG. 19B shows that of the transistor in the case where the thickness of the gate insulating layer is 10 nm, and FIG. 19C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ (on-state current) in an on state. The graphs show that the drain current exceeds 10 μA, which is required in a memory element and the like, at a gate voltage of around 1 V.

Figure 20A:
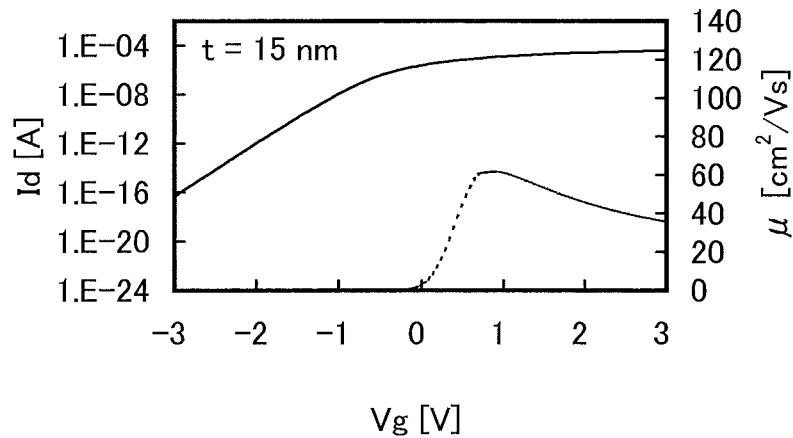
FIGS. 20A to 20C show gate voltage dependence of drain current and mobility obtained by calculation.
Figure 20B:
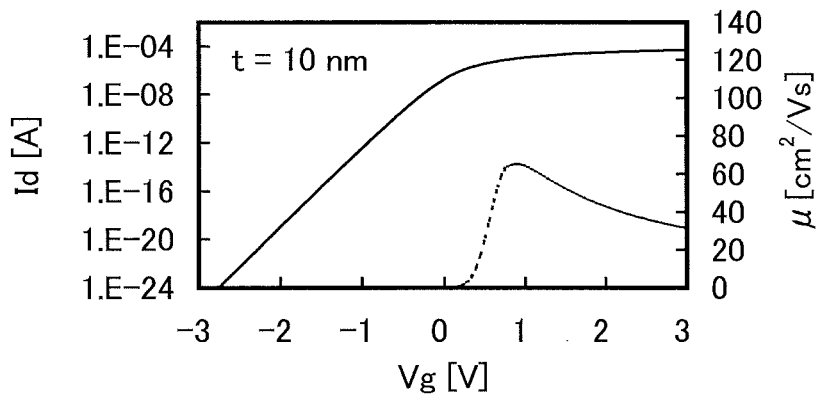
Figure 20C:
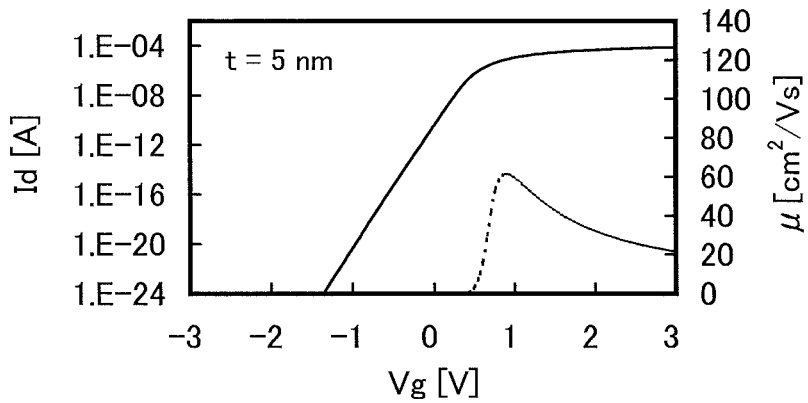

FIGS. 20A to 20C show the gate voltage $V_g$ dependence of the drain current $I_d$ (a solid line) and the mobility μ (a dotted line) of the transistor having the structure illustrated in FIG. 22B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 20A shows the gate voltage dependence of the transistor in the case where the thickness of the gate insulating layer is 15 nm, FIG. 20B shows that of the transistor in the case where the thickness of the gate insulating layer is 10 nm, and FIG. 20C shows that of the transistor in the case where the thickness of the gate insulating layer is 5 nm.

Figure 21A:
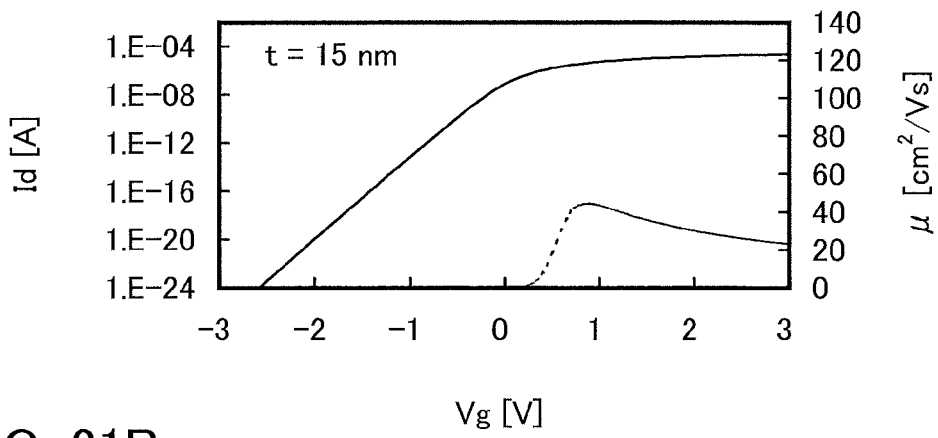
FIGS. 21A to 21C show gate voltage dependence of drain current and mobility obtained by calculation.
Figure 21B:
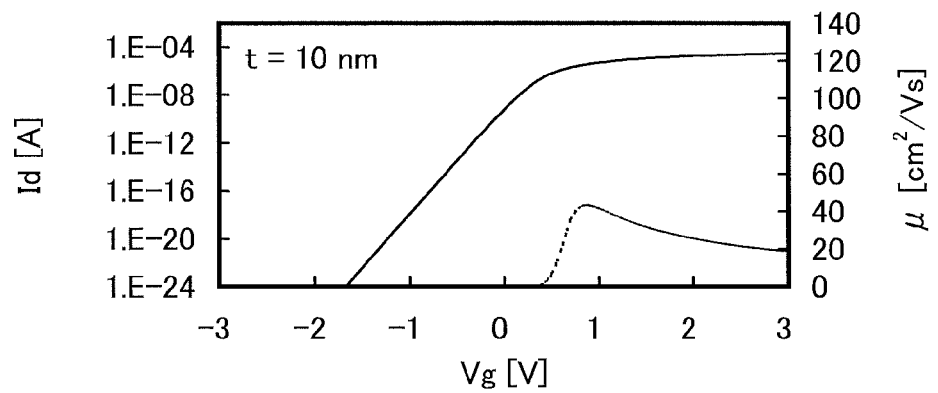
Figure 21C:
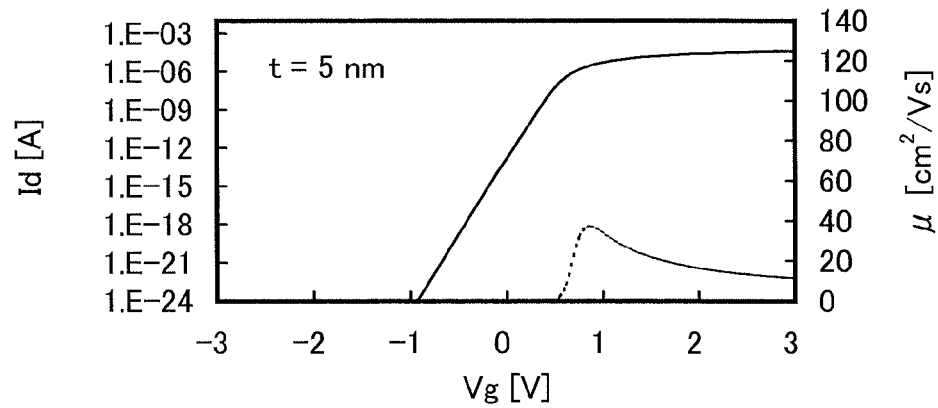
Figure 22A:
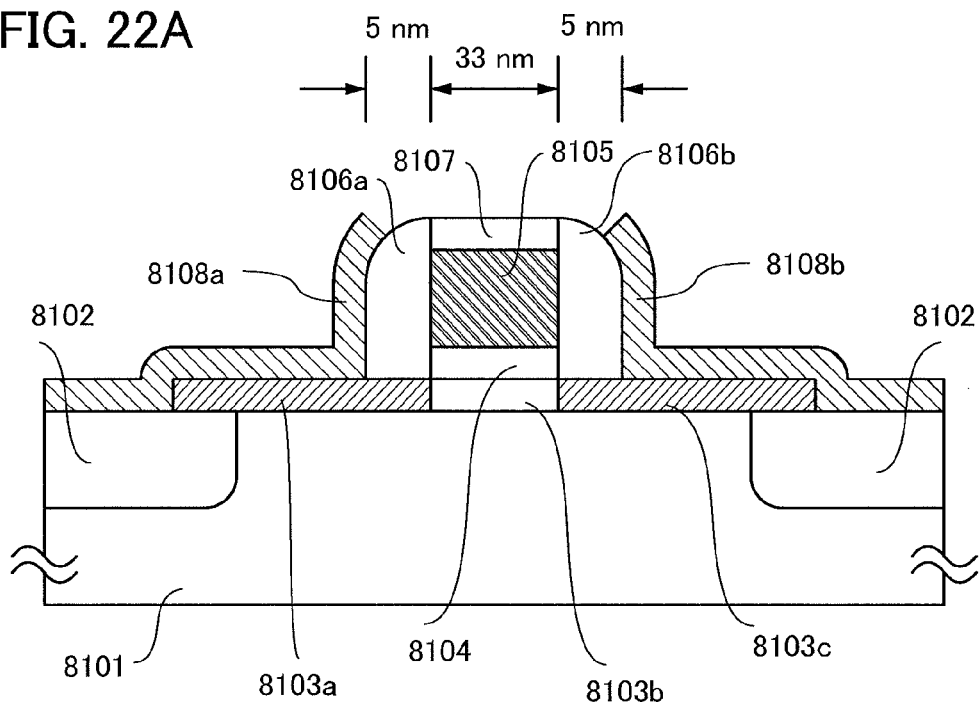
FIGS. 22A and 22B illustrate cross-sectional structures of transistors used for calculation.
Figure 22B:
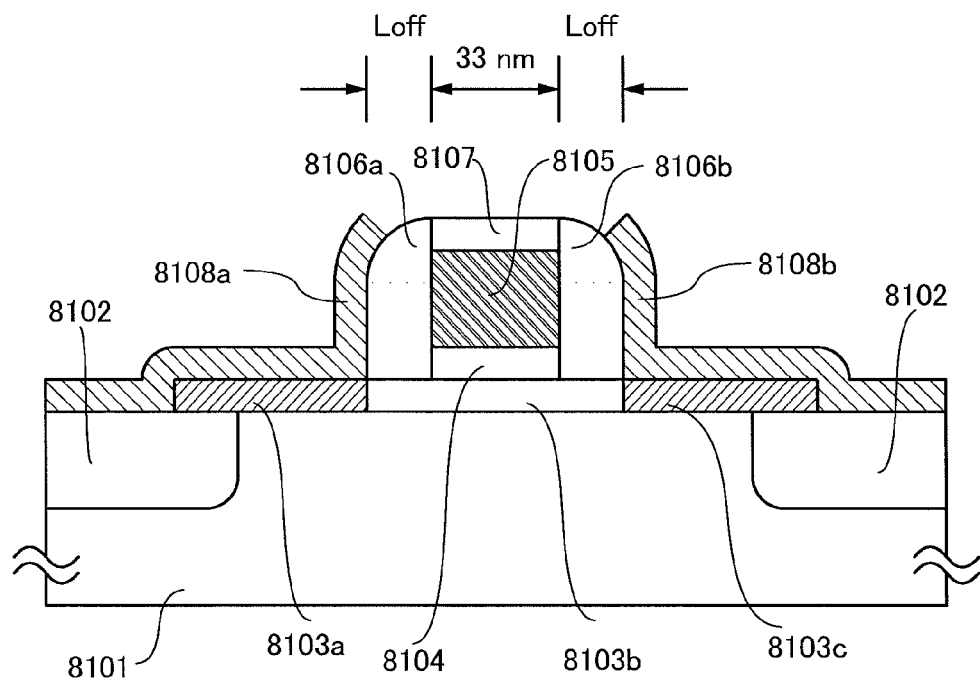

Further, FIGS. 21A to 21C show the gate voltage dependence of the drain current $I_d$ (a solid line) and the mobility μ (a dotted line) of the transistor having the structure illustrated in FIG. 22B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 21A shows the gate voltage dependence of the transistor in the case where the thickness of the gate insulating layer is 15 nm, FIG. 21B shows that of the transistor in the case where the thickness of the gate insulating layer is 10 nm, and FIG. 21C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 cm²/Vs in FIGS. 19A to 19C, approximately 60 cm²/Vs in FIGS. 20A to 20C, and approximately 40 cm²/Vs in FIGS. 21A to 21C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Embodiment 7

In this embodiment, an example of a transistor that can be applied to a semiconductor device disclosed in this specification will be described. In addition, calculation results of characteristics of the transistor will be described. The transistor described in this embodiment can be suitably used as the transistor 162 described in any of the above embodiments.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in a composition at 5 atomic % or more. Thus, in this embodiment, the case where the field-effect mobility of the transistor is improved by intentionally heating the substrate after formation of the oxide semiconductor film will be described with reference to FIGS. 23A to 23C, FIGS. 24A and 24B, FIGS. 25A and 25B, FIG. 26, FIGS. 27A and 27B, FIG. 28, and FIG. 29.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 23A:
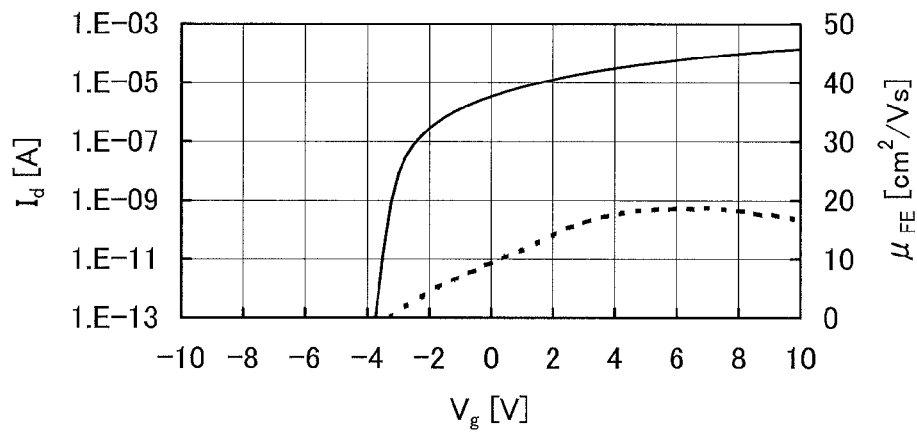
FIGS. 23A to 23C each show characteristics of a transistor according to one embodiment of the present invention.
Figure 23B:
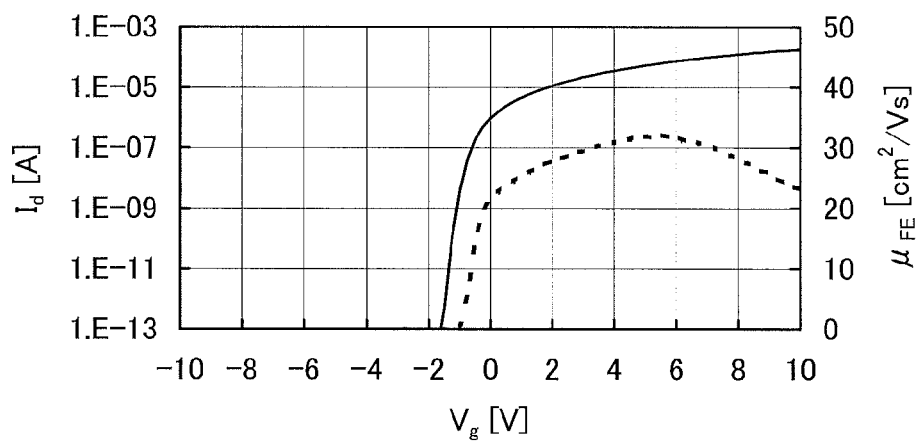
Figure 23C:
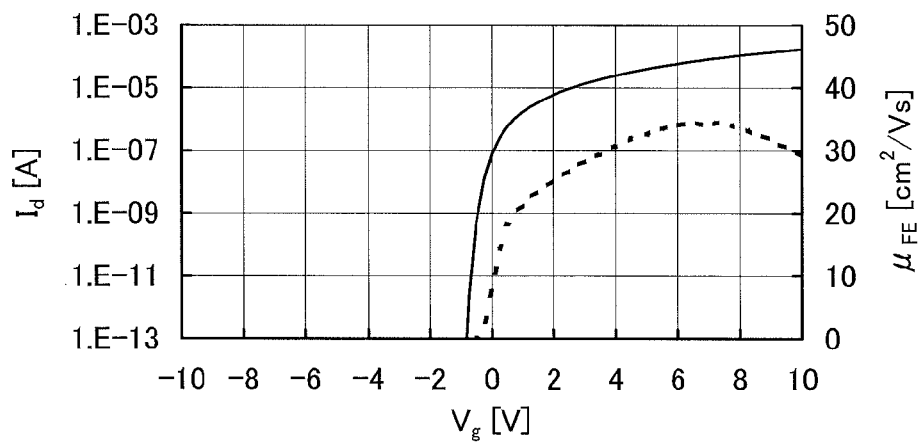

As an example, FIGS. 23A to 23C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 23A shows characteristics of a transistor whose oxide semiconductor film including In, Sn, and Zn as main components was formed by a sputtering method without heating a substrate intentionally. The field-effect mobility of the transistor is 18.8 cm²/Vs. On the other hand, when the oxide semiconductor film including In, Sn, and Zn as main components is conned while heating the substrate intentionally, the field-effect mobility can be improved. FIG. 23B shows characteristics of a transistor whose oxide semiconductor film including In, Sn, and Zn as main components was formed while heating a substrate at 200° C. The field-effect mobility of the transistor is 32.2 cm²/Vs.

The field-effect mobility can be further improved by performing heat treatment after formation of the oxide semiconductor film including In, Sn, and Zn as main components. FIG. 23C shows characteristics of a transistor whose oxide semiconductor film including In, Sn, and Zn as main components was formed by sputtering at 200° C. and then subjected to heat treatment at 650° C. The field-effect mobility of the transistor is 34.5 cm²/Vs.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single crystal oxide semiconductor, ideally, a field-effect mobility exceeding 100 cm²/Vs is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 23A and 23B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$—$I_d$ characteristics of the transistors were measured at a substrate temperature of 25° C. and $V_d$ of 10 V. Note that $V_d$ refers to a drain voltage (a potential difference between a drain and a source). Then, the substrate temperature was set to 150° C. and $V_d$ was set to 0.1 V. After that, 20 V of $V_g$ was applied so that the intensity of an electric field applied to the gate insulating layers was 2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a positive BT test.

In a similar manner, first, $V_g$—$I_d$ characteristics of the transistors were measured at a substrate temperature of 25° C. and $V_d$ of 10 V. Then, the substrate temperature was set to 150° C. and $V_d$ was set to 0.1 V. After that, −20 V of $V_g$ was applied so that the intensity of an electric field applied to the gate insulating layers was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 24A:
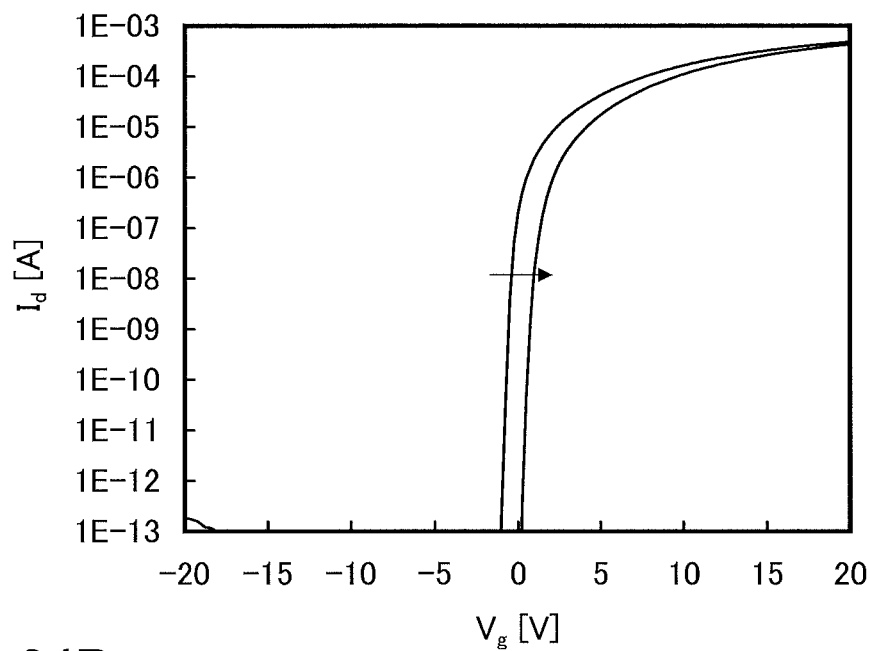
FIGS. 24A and 24B each show characteristics of a transistor according to one embodiment of the present invention.
Figure 24B:
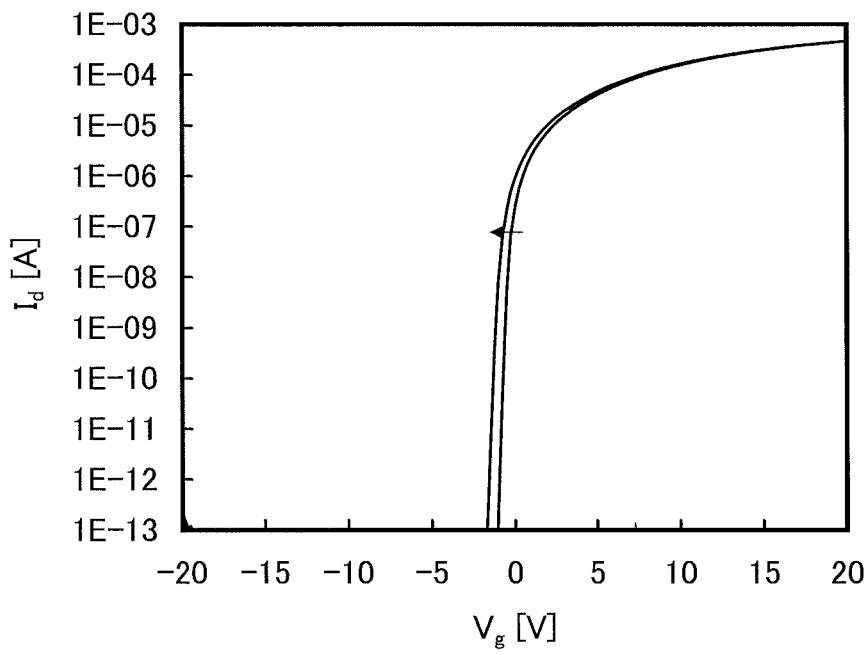
Figure 25A:
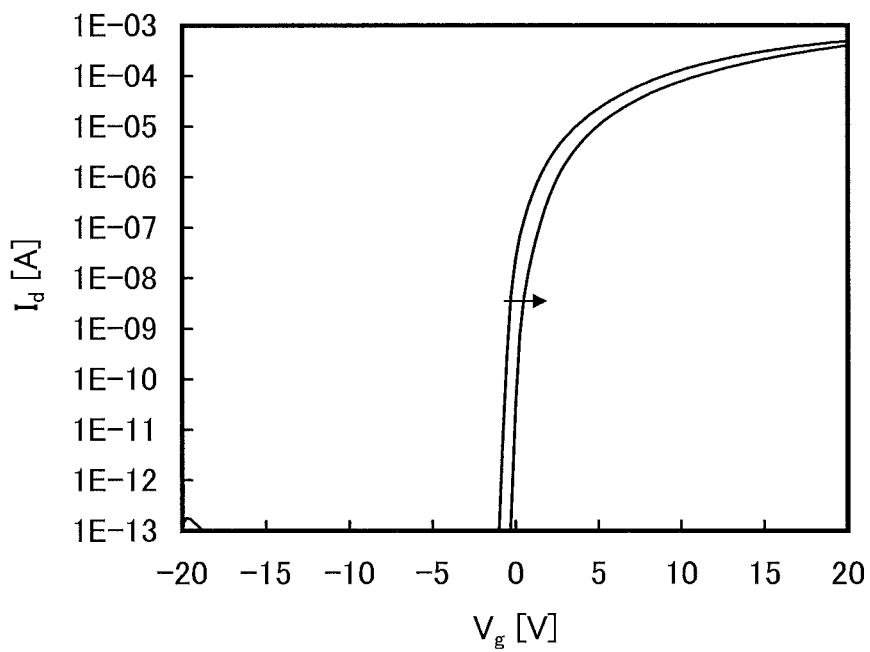
FIGS. 25A and 25B each show characteristics of a transistor according to one embodiment of the present invention.
Figure 25B:
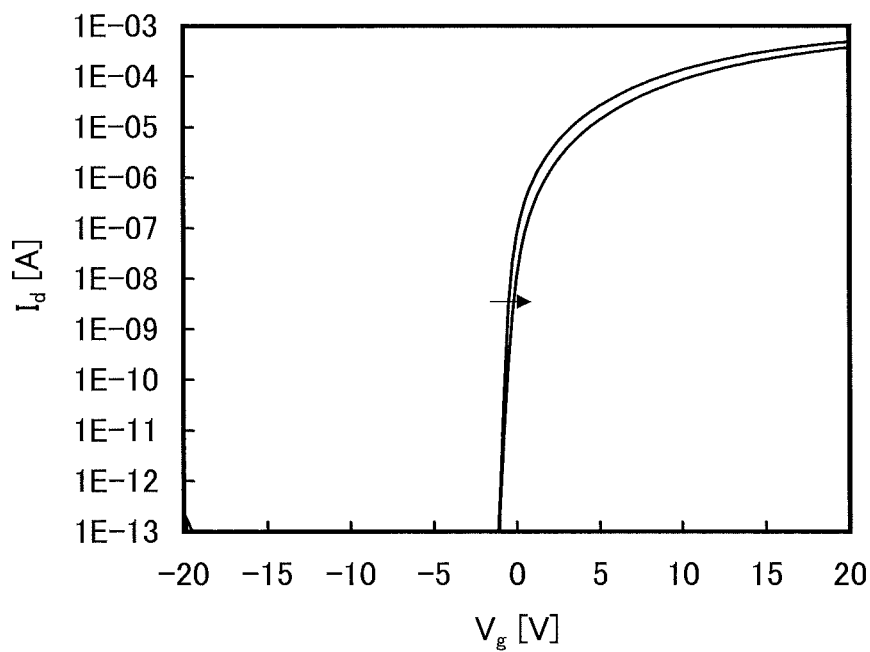

FIGS. 24A and 24B show a result of the positive BT test of Sample 1 and a result of the negative BT test of Sample 1, respectively. FIGS. 25A and 25B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing between lattices. When the concentration of excess oxygen is set to higher than or equal to $1\times10^{16}/cm^3$ and lower than or equal to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 28:
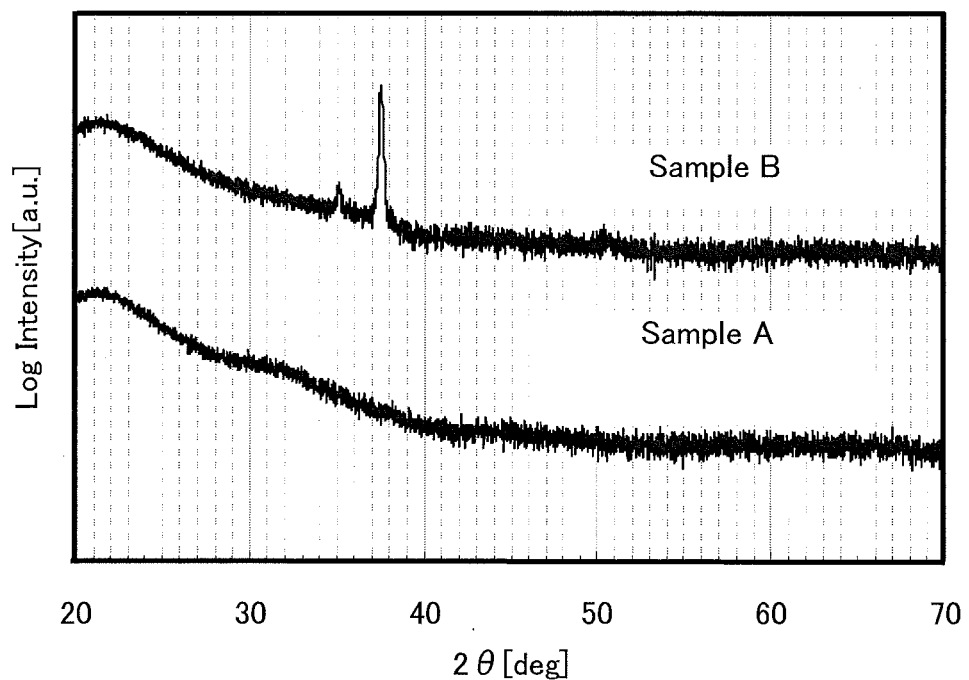
FIG. 28 shows XRD spectra of transistors according to one embodiment of the present invention.

FIG. 28 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current represents current per micrometer of a channel width.

Figure 29:
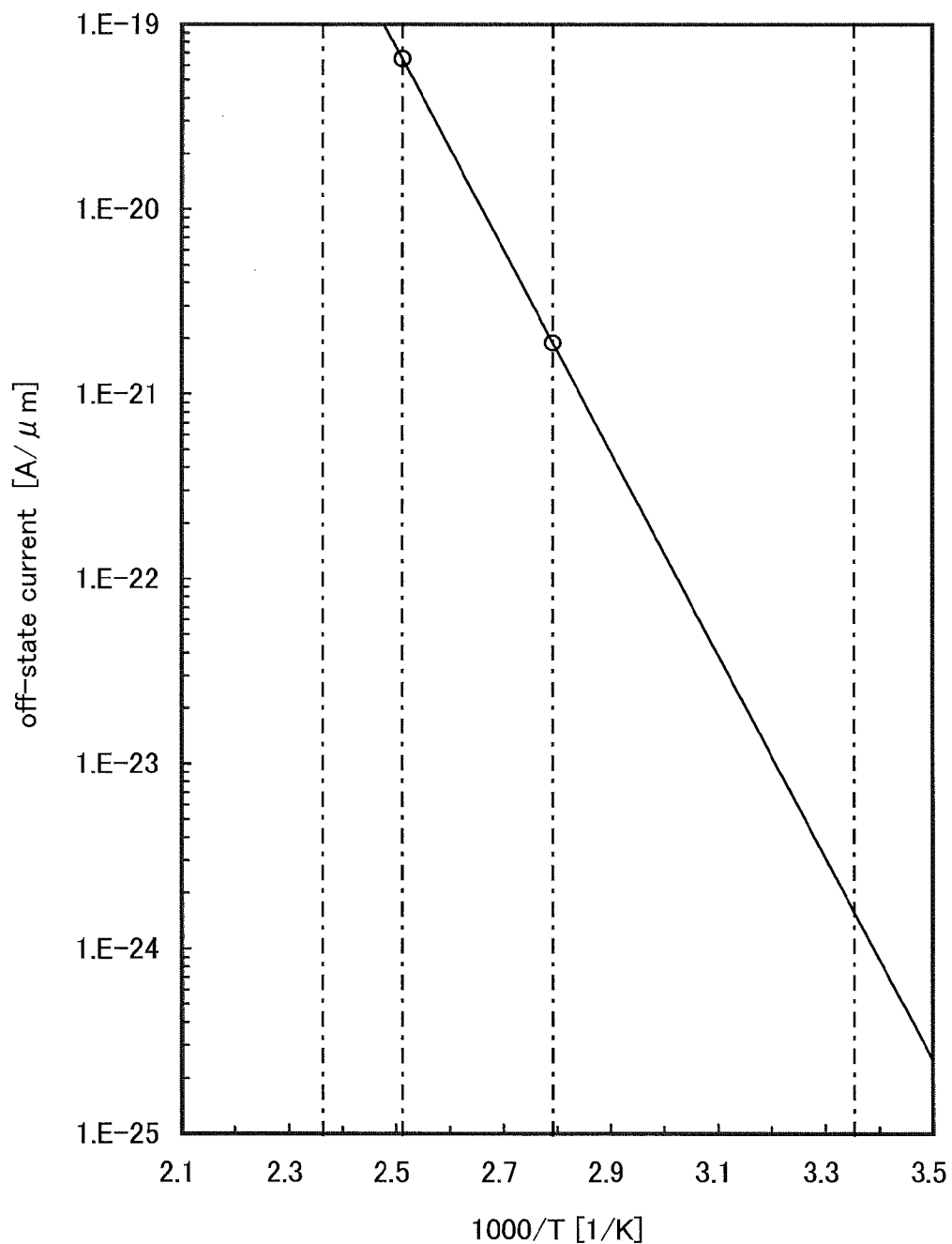
FIG. 29 shows characteristics of a transistor according to one embodiment of the present invention.

Specifically, as shown in FIG. 29, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 26:
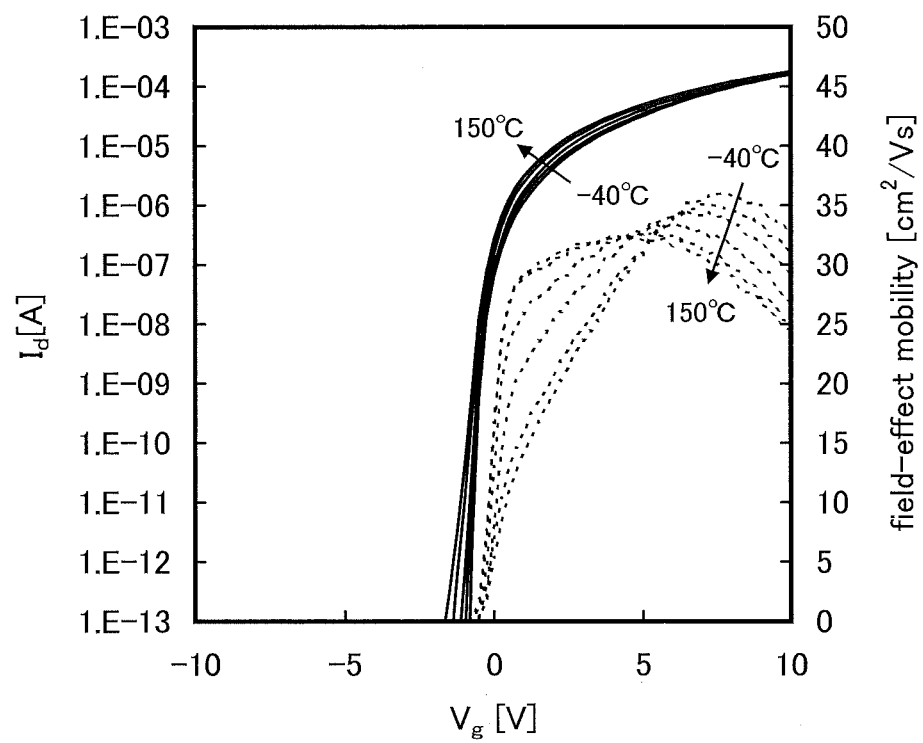
FIG. 26 shows characteristics of a transistor according to one embodiment of the present invention.
Figure 27A:
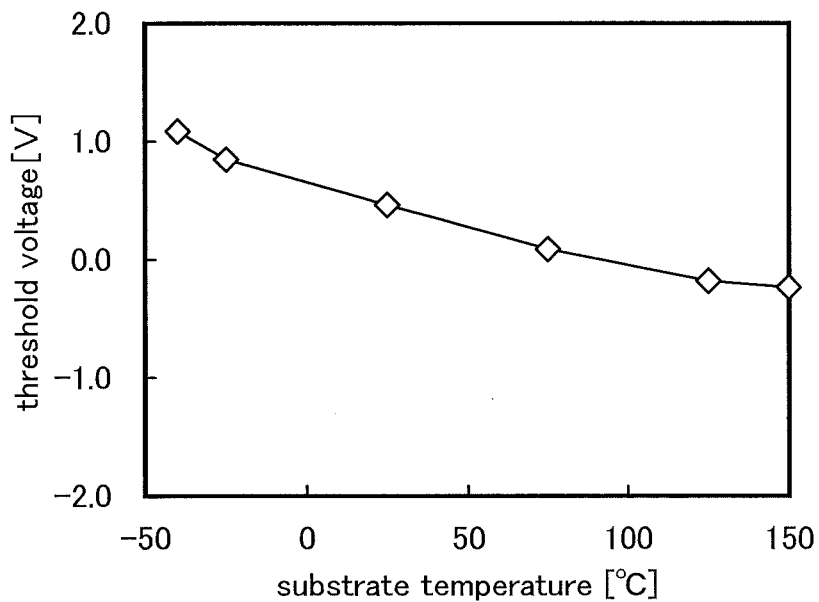
FIGS. 27A and 27B each show characteristics of a transistor according to one embodiment of the present invention.

FIG. 26 shows the $V_g$ dependence of $I_d$ (a solid line) and field-effect mobility (a dotted line). FIG. 27A shows a relation between the substrate temperature and the threshold voltage, and FIG. 27B shows a relation between the substrate temperature and the field-effect mobility.

From FIG. 27A, it is found that the threshold voltage gets lower as the substrate temperature increases. Note that the threshold voltage is decreased from 1.09 V to −0.23 V in the range from −40° C. to 150° C.

Figure 27B:
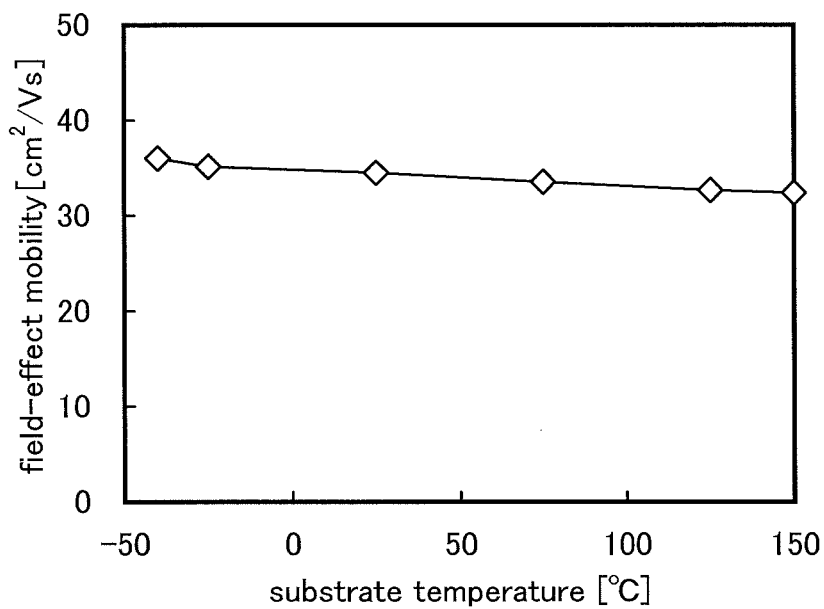

From FIG. 27B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vs or higher, preferably 40 cm$^2$/Vs or higher, further preferably 60 cm$^2$/Vs or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Embodiment 8

In this embodiment, an example of a transistor in which an In—Sn—Zn—O film is used as an oxide semiconductor film will be described with reference to FIGS. 30A and 30B and FIGS. 31A and 31B. The transistor described in this embodiment can be suitably used as the transistor 162 described in any of the above embodiments.

Figure 30A:
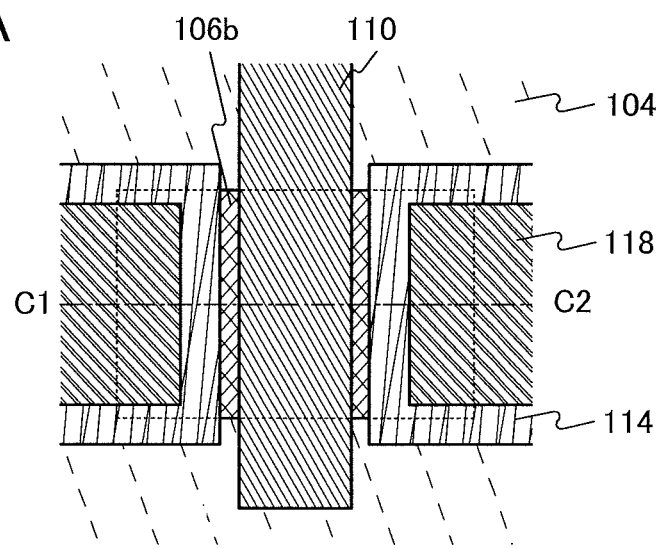
FIGS. 30A and 30B illustrate a structure of a transistor according to one embodiment of the present invention.
Figure 30B:
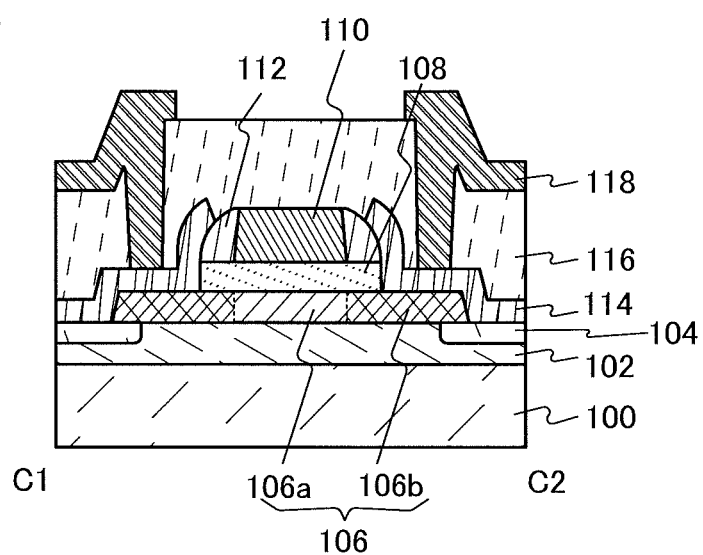

FIGS. 30A and 30B are a top view and a cross-sectional view of a coplanar transistor having a top-gate top-contact structure. FIG. 30A is the top view of the transistor. FIG. 30B illustrates a cross section C1-C2 along dashed-dotted line C1-C2 in FIG. 30A.

The transistor illustrated in FIG. 30B includes a substrate 100; a base insulating layer 102 provided over the substrate 100; a protective insulating film 104 provided in the periphery of the base insulating layer 102; an oxide semiconductor film 106 provided over the base insulating layer 102 and the protective insulating film 104 and including a high-resistance region 106a and low-resistance regions 106b; a gate insulating layer 108 provided over the oxide semiconductor film 106; a gate electrode 110 provided to overlap with the oxide semiconductor film 106 with the gate insulating layer 108 positioned therebetween; a sidewall insulating film 112 provided in contact with a side surface of the gate electrode 110; a pair of electrodes 114 provided in contact with at least the low-resistance regions 106b; an interlayer insulating film 116 provided to cover at least the oxide semiconductor film 106, the gate electrode 110, and the pair of electrodes 114; and a wiring 118 provided to be connected to at least one of the pair of electrodes 114 through an opening formed in the interlayer insulating film 116.

Although not illustrated, a protective film may be provided to cover the interlayer insulating film 116 and the wiring 118. With the protective film, a minute amount of leakage current generated by surface conduction of the interlayer insulating film 116 can be reduced and thus the off-state current of the transistor can be reduced.

Next, another example of a transistor in which an In—Sn—Zn—O film is used as an oxide semiconductor film will be described.

Figure 31A:
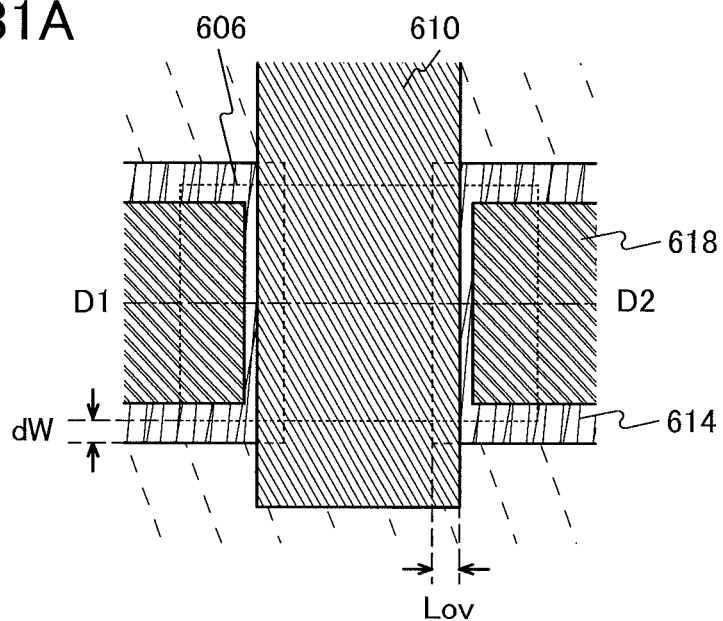
FIGS. 31A and 31B illustrate a structure of a transistor according to one embodiment of the present invention.
Figure 31B:
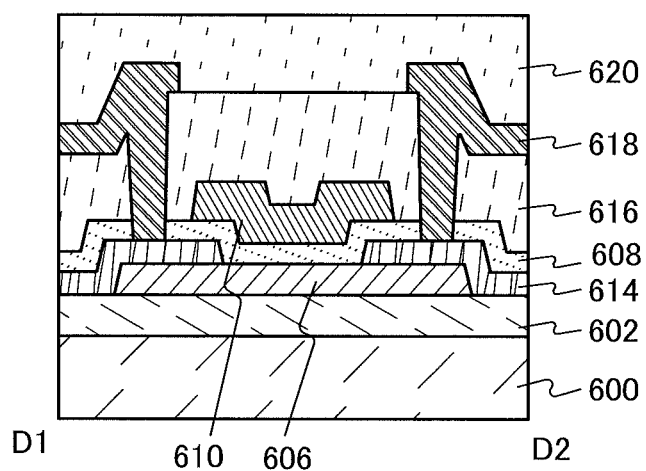

FIGS. 31A and 31B are a top view and a cross-sectional view which illustrate a structure of a transistor described in this embodiment. FIG. 31A is the top view of the transistor. FIG. 31B is a cross-sectional view along dashed-dotted line D1-D2 in FIG. 31A.

The transistor illustrated in FIG. 31B includes a substrate 600; a base insulating layer 602 provided over the substrate 600; an oxide semiconductor film 606 provided over the base insulating layer 602; a pair of electrodes 614 in contact with the oxide semiconductor film 606; a gate insulating layer 608 provided over the oxide semiconductor film 606 and the pair of electrodes 614; a gate electrode 610 provided to overlap with the oxide semiconductor film 606 with the gate insulating layer 608 positioned therebetween; an interlayer insulating film 616 provided to cover the gate insulating layer 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate can be used. As the base insulating layer 602, a silicon oxide film can be used. As the oxide semiconductor film 606, an In—Sn—Zn—O film can be used. As the pair of electrodes 614, a tungsten film can be used. As the gate insulating layer 608, a silicon oxide film can be used. The gate electrode 610 can have a stacked structure of a tantalum nitride film and a tungsten film The interlayer insulating film 616 can have a stacked structure of a silicon oxynitride film and a polyimide film. The wirings 618 can each have a stacked structure in which a titanium film, an aluminum film, and a titanium film are formed in this order. As the protective film 620, a polyimide film can be used.

Note that in the transistor having the structure illustrated in FIG. 31A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

This application is based on Japanese Patent Application serial no. 2010-196611 filed with Japan Patent Office on Sep. 2, 2010 and Japanese Patent Application serial no. 2011-107621 filed with Japan Patent Office on May 12, 2011, the entire contents of which are hereby incorporated by reference.

What is claimed is:

1. A driving method of a semiconductor device, the semiconductor device comprising:
   a memory cell comprising a first transistor, a capacitor and a second transistor, wherein a gate of the first transistor is electrically connected to one electrode of the capacitor and a source of the second transistor;
   a selection transistor, wherein a source of the selection transistor is electrically connected to a drain of the first transistor and a drain of the selection transistor is electrically connected to a drain of the second transistor;
   a bit line electrically connected to a drain of the selection transistor and the drain of the second transistor;
   a selection line electrically connected to a gate of the selection transistor;
   a writing word line electrically connected to a gate of the second transistor;
   a reading word line electrically connected to the other electrode of the capacitor; and
   a source line electrically connected to a source of the first transistor,
   the driving method comprising the steps of:
      supplying a potential to the bit line;
      supplying a potential to the writing word line to turn on the second transistor, whereby a potential is supplied to the one electrode of the capacitor from the bit line;
      supplying a potential to the selection line to turn off the selection transistor; and
      supplying a potential to the source line to turn on the first transistor, whereby a charge corresponding to the potential to the bit line is accumulated in the gate of the first transistor and the one electrode of the capacitor,
   wherein the potential to the source line is lower than a threshold value of the first transistor to turn on the first transistor.

2. The driving method of a semiconductor device according to claim 1, wherein the potential of the source of the first transistor is set to a fixed potential.

3. The driving method of a semiconductor device according to claim 1, further comprising steps of:
   supplying a potential to the writing word line to turn off the second transistor; and
   supplying a potential to the source line to turn off the first transistor, whereby the charge corresponding to the potential to the bit line is held in the gate of the first transistor and the one electrode of the capacitor.

4. The driving method of a semiconductor device according to claim 1, wherein the second transistor is formed using an oxide semiconductor material comprising In, Ga, and Zn.

5. The driving method of a semiconductor device according to claim 1, wherein the first transistor includes single crystal silicon.

6. A driving method of a semiconductor device, the semiconductor device comprising:
   a memory cell comprising a first transistor, a capacitor and a second transistor, wherein a gate of the first transistor is electrically connected to one electrode of the capacitor and a source of the second transistor;
   a selection transistor, wherein a source of the selection transistor is electrically connected to a drain of the first transistor and a drain of the selection transistor is electrically connected to a drain of the second transistor;
   a bit line electrically connected to a drain of the selection transistor and the drain of the second transistor;
   a selection line electrically connected to a gate of the selection transistor;
   a writing word line electrically connected to a gate of the second transistor;
   a reading word line electrically connected to the other electrode of the capacitor; and
   a source line electrically connected to a source of the first transistor,
   the driving method comprising the steps of:
      supplying a potential to the selection line to turn off the selection transistor;
      supplying a potential to the source line to turn on the first transistor;
      supplying a potential to the bit line; and
      supplying a potential to the writing word line to turn on the second transistor, whereby a potential is supplied to the one electrode of the capacitor from the bit line and a charge corresponding to the potential to the bit line is accumulated in the gate of the first transistor and the one electrode of the capacitor,
   wherein the potential to the source line is lower than a threshold value of the first transistor to turn on the first transistor.

7. The driving method of a semiconductor device according to claim 6, wherein the potential of the source of the first transistor is set to a fixed potential.

8. The driving method of a semiconductor device according to claim 6, further comprising steps of:
   supplying a potential to the writing word line to turn off the second transistor; and
   supplying a potential to the source line to turn off the first transistor, whereby the charge corresponding to the potential to the bit line is held in the gate of the first transistor and the one electrode of the capacitor.

9. The driving method of a semiconductor device according to claim 6, wherein the second transistor is formed using an oxide semiconductor material comprising In, Ga, and Zn.

10. The driving method of a semiconductor device according to claim 6, wherein the first transistor includes single crystal silicon.

11. A driving method of a semiconductor device, the semiconductor device comprising:
   first to m-th memory cells,
   wherein each of the first to m-th memory cells comprises a first transistor, a capacitor, and a second transistor,
   wherein a gate of the first transistor is electrically connected to one electrode of the capacitor and a source of the second transistor,
   wherein a drain of the first transistor of a k-th memory cell (k is a natural number greater than or equal to 2 and less than or equal to (m−1)) is electrically connected to a source of the first transistor of a (k−1)-th memory cell, and
   wherein a source of the first transistor of the k-th memory cell is electrically connected to a drain of the first transistor of a (k+1)-th memory cell;
   a selection transistor, wherein a source of the selection transistor is electrically connected to a drain of the first transistor of the first memory cell and a drain of the selection transistor is electrically connected to a drain of the second transistor of the first memory cell;

a bit line electrically connected to a drain of the selection transistor and the drain of the second transistor of the first memory cell;

a selection line electrically connected to a gate of the selection transistor;

first to m-th writing word lines, wherein a j-th writing word line (j is a natural number greater than or equal to 1 and less than or equal to m) is electrically connected to a gate of the second transistor of a j-th memory cell;

first to m-th reading word lines, wherein a j-th reading word line is electrically connected to the other electrode of the capacitor of the j-th memory cell; and a source line electrically connected to a source of the first transistor of the m-th memory cell, the driving method comprising the steps of:
supplying a potential to the bit line;
supplying a potential to the writing word line to turn on the second transistor, whereby a potential is supplied to the one electrode of the capacitor from the bit line;
supplying a potential to the selection line to turn off the selection transistor;
supplying a potential to the source line to turn on the first transistor, whereby a charge corresponding to the potential to the bit line is accumulated in the gate of the first transistor and the one electrode of the capacitor;
supplying a potential to the writing word line to turn off the second transistor; and
supplying a potential to the source line to turn off the first transistor, whereby the charge corresponding to the potential to the bit line is held in the gate of the first transistor and the one electrode of the capacitor,
wherein the potential to the source line is lower than a threshold value of the first transistor to turn on the first transistor.

12. The driving method of a semiconductor device according to claim 11, wherein the potential of the source of the first transistor is set to a fixed potential.

13. The driving method of a semiconductor device according to claim 11, wherein the second transistor is formed using an oxide semiconductor material comprising In, Ga, and Zn.

14. A driving method of a semiconductor device, the semiconductor device comprising:
first to m-th memory cells,
wherein each of the first to m-th memory cells comprises a first transistor, a capacitor, and a second transistor,
wherein a gate of the first transistor is electrically connected to one electrode of the capacitor and a source of the second transistor,
wherein a drain of the first transistor of a k-th memory cell (k is a natural number greater than or equal to 2 and less than or equal to (m−1)) is electrically connected to a source of the first transistor of a (k−1)-th memory cell, and wherein a source of the first transistor of the k-th memory cell is electrically connected to a drain of the first transistor of a (k+1)-th memory cell;

a selection transistor, wherein a source of the selection transistor is electrically connected to a drain of the first transistor of the first memory cell and a drain of the selection transistor is electrically connected to a drain of the second transistor of the first memory cell;

a bit line electrically connected to a drain of the selection transistor and the drain of the second transistor of the first memory cell;

a selection line electrically connected to a gate of the selection transistor;

first to m-th writing word lines, wherein a j-th writing word line (j is a natural number greater than or equal to 1 and less than or equal to m) is electrically connected to a gate of the second transistor of a j-th memory cell;

first to m-th reading word lines, wherein a j-th reading word line is electrically connected to the other electrode of the capacitor of the j-th memory cell; and a source line electrically connected to a source of the first transistor of the m-th memory cell, the driving method comprising the steps of:
supplying a potential to the selection line to turn off the selection transistor;
supplying a potential to the source line to turn on the first transistor;
supplying a potential to the bit line;
supplying a potential to the writing word line to turn on the second transistor, whereby a potential is supplied to the one electrode of the capacitor from the bit line and a charge corresponding to the potential to the bit line is accumulated in the gate of the first transistor and the one electrode of the capacitor;
supplying a potential to the writing word line to turn off the second transistor; and
supplying a potential to the source line to turn off the first transistor, whereby the charge corresponding to the potential to the bit line is held in the gate of the first transistor and the one electrode of the capacitor,
wherein the potential to the source line is lower than a threshold value of the first transistor to turn on the first transistor.

15. The driving method of a semiconductor device according to claim 14, wherein the potential of the source of the first transistor is set to a fixed potential.

16. The driving method of a semiconductor device according to claim 14, wherein the second transistor is formed using an oxide semiconductor material comprising In, Ga, and Zn.

* * * * *

UNITED STATES PATENT AND TRADEMARK OFFICE
CERTIFICATE OF CORRECTION

PATENT NO. : 8,634,228 B2  
APPLICATION NO. : 13/220066  
DATED : January 21, 2014  
INVENTOR(S) : Takanori Matsuzaki and Kiyoshi Kato Page 1 of 1

It is certified that error appears in the above-identified patent and that said Letters Patent is hereby corrected as shown below:

In the Specification

Column 9, line 2, after "determined" insert --.--;

Column 9, line 21, replace "$V_{tHL}$" with --$V_{thL}$--;

Column 16, line 62, replace "(k-1)-throws" with --(k-1)-th rows--;

Column 18, line 23, after "which" replace "in" with --*m*--;

Column 18, line 38, after "includes" replace "in" with --*m*--;

Column 26, line 31, after "6G" insert --,--;

Column 28, line 28, replace "fanned" with --formed--;

Column 29, line 40, replace "In:Zn:O = Y:Z" with --In:Zn:O = X:Y:Z--;

Column 43, line 47, after "5" replace "mu" with --nm--;

Column 45, line 19, after "films" insert --.--;

Column 52, line 2, replace "conned" with --formed--.

Signed and Sealed this  
Third Day of June, 2014

Michelle K. Lee  
*Deputy Director of the United States Patent and Trademark Office*